United States Patent
Tanizaki et al.

(10) Patent No.: US 7,436,699 B2
(45) Date of Patent: Oct. 14, 2008

(54) NONVOLATILE SEMICONDUCTOR MEMORY DEVICE

(75) Inventors: Hiroaki Tanizaki, Itami (JP); Takaharu Tsuji, Tokyo (JP); Yasumitsu Murai, Itami (JP); Hideto Hidaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/645,610

(22) Filed: Dec. 27, 2006

(65) Prior Publication Data

US 2007/0159870 A1 Jul. 12, 2007

(30) Foreign Application Priority Data

Jan. 10, 2006 (JP) ............................. 2006-002732

(51) Int. Cl.
*G11C 11/00* (2006.01)
(52) U.S. Cl. ...................................... 365/158; 365/173
(58) Field of Classification Search .................. 365/158, 365/173
See application file for complete search history.

(56) References Cited

U.S. PATENT DOCUMENTS

2006/0126379 A1*  6/2006  Hidaka ........................ 365/158
2007/0133265 A1*  6/2007  Tsuji ........................... 365/158

FOREIGN PATENT DOCUMENTS

| JP | 2004-185754 A | 7/2004 |
|----|---------------|--------|
| JP | 2004-185755 A | 7/2004 |
| JP | 2004-355670 A | 12/2004 |
| JP | 2005-92912 A  | 4/2005 |
| JP | 2005-216387 A | 8/2005 |

* cited by examiner

*Primary Examiner*—Michael T Tran
(74) *Attorney, Agent, or Firm*—McDermott Will & Emery LLP

(57) ABSTRACT

Source lines for a spin injection magnetic memory cell are arranged parallel to word lines for executing writing/reading of data multiple bits at a time. In a write operation, a source line potential changes in a predetermined sequence such that the source line commonly connected to a plurality of selected memory cells is set to pass a current only in one direction in each stage of the operation sequence. For the data write sequence, a current is caused to flow through memory cells according to write data sequentially, or the memory cell has a resistance state set to an initial resistance state before writing, and then changed to a state according to the write data Fast writing can be achieved in the magnetic memory without increasing a memory cell layout area.

17 Claims, 27 Drawing Sheets

: I0=I1, I0+I1=Imax+Imin

NONVOLATILE SEMICONDUCTOR MEMORY DEVICE

BACKGROUND OF THE INVENTION

1. Field of the Invention

The present invention relates to a nonvolatile semiconductor memory device, and particularly to a Magnetic Random Access Memory (MRAM) that nonvolatilely stores data, utilizing a magneto-resistance effect. More particularly, the present invention relates to a spin injection type MRAM which is configured to set magnetization directions, or the resistance state of a magnetic storage element by spin injection.

2. Description of the Background Art

The nonvolatile semiconductor memory device can hold storage data even when the power is shut down, and therefore it is not necessary to supply the power during a standby state. Therefore, the nonvolatile semiconductor memory devices have been widely used in portable equipments and others to which low power consumption is required.

An MRAM utilizing a magneto-resistance effect is one of such nonvolatile semiconductor memory devices. In the MRAM, a storage element includes a fixed layer having its magnetization direction set fixedly, and a free layer having its magnetization direction set according to storage data. When the magnetization directions of the free and fixed layers are equal (parallel) to each other, the path passing through the free and fixed layers has a small electric resistance value. When the magnetization directions of the free and fixed layers are opposite (anti-parallel) to each other, the resistance value the path increases. An amount of a flowing current varies depending on this resistance value of the storage element. Data is read by detecting the amount of the current flowing through the storage element.

As a magnetic memory, there has been a resistance RAM (RRAM) utilizing the fact that a chalcogenide material has a resistance value varying depending on a polarity of an applied voltage pulse.

Reference 1 (Japanese Patent Laying-Open No. 2005-216387) discloses a construction aiming at writing of information in a short time. In Reference 1, a memory cell includes a resistance element and an access transistor, which are connected in series between a source line and a bit line. With an operation of changing the storage element from a high-resistance state to a low-resistance state being referred to as "writing", the memory cell is configured to have such characteristics that a combined resistance value of the storage element and access transistor in the memory cell takes a constant value after the writing. The access transistor is formed of an MIS transistor (insulated gate type field effect transistor). When current-voltage characteristics of the MIS transistor coincide with current-voltage characteristics of the resistance element, the write operation stops. A voltage produced by resistance-division of the storage element (resistance element) and a channel resistances of and the MIS transistor is applied to the resistance element, and the writing stops when the voltage-current characteristics of the both match with each other. Thereby, the combined resistance of the access transistor and the storage element substantially takes a constant value, to suppress variations in resistances value after the writing.

Reference 2 (Japanese Patent Laying-Open No. 2004-185754) discloses a construction aiming at fast erasing/writing in an RRAM, similarly to Reference 1. In Reference 2, an erasure operation mode specifically includes two modes; a collective erasing mode for collectively erasing memory cells in an entire memory array region and an individual erasing mode for individually erasing the memory cells in the memory array region. The collective erasing mode is used for rapidly erasing data of an entire erasing target such as program data, and the individual erasing mode is used for individually erasing an individual item of data items such as code data so that an efficient erasing operation may be achieved.

In Reference 2, writing is effected on all the memory cells to be erased before the collective erasing is performed, and thus a so-called pre-erasure writing (writing before erasure) is performed so that resistance values of these memory cells are adjusted. Thereafter, all the memory cells are set to a high-resistance state, i.e., the erased state so that current consumption for applying an erasing voltage may be reduced.

According to Reference 3 (Japanese Patent Laying-Open No. 2005-092912), all memory cells in a write target region are set to a high-resistance state before a reset operation (transition to a low-resistance state) in a spin injection MRAM, for suppressing variations in resistance state after the reset operation. In a memory cell construction, a variable resistance element is connected to a source line, and is connected to a bit line via an access transistor. Thereby, it is intended to avoid occurrence of disturbance, i.e., adverse influence on storage data of unselected cell due to noises on bit line potential during writing/reading.

In the configuration of the memory cell array disclosed in Reference 3, the source lines are arranged parallel to word lines, and the bit lines are arranged being perpendicular to the source and word lines. Reference 3 discloses an approach for overcoming a problem similar to the above-described problem also in the RRAM.

In Reference 4 (Japanese Patent Laying-Open No. 2004-355670), memory cells in adjacent columns share a source line, and variable resistance elements are connected to the source line via access transistors. The bit line arranged for each column is held at a ground voltage level when it is not selected, and the bit line and source line of the memory cells in the unselected column are held at the same voltage level, to suppress application of a voltage stress to the unselected memory cells.

In this Reference 4, the reset operation is performed to set all the memory cells in an access target region to a reset state of a low resistance value, and then, the memory cells are driven to a high-resistance state in accordance with write data.

In Reference 5 (Japanese Patent Laying-Open No. 2004-185755), each source line is arranged to be shared between adjacent columns and is directly connected to a variable resistance element, which in turn is connected to a bit line via an access transistor.

This Reference 5 prevents application of a voltage, applied onto a bit line in reading/writing, on a variable resistance element, to eliminate the voltage stress on the resistance element. In addition, the current flowing path is shut off by the access transistor in an unselected memory cell to avoid the disturbance in the writing and reading. Further, by arranging the source line for each column, an erasing voltage is not applied to an unselected source line when the erasing is performed on a source line basis, to suppress the voltage stress applied to the variable resistance element in the erasing operation. Select transistors are connected in series to the opposite ends of the variable resistance element, respectively, to prevent occurrence of the disturbance in the unselected memory cell even when a voltage is applied to the source line in the erasing operation (reset operation).

In the data write operation of the MRAM, the current supplied to the memory cell flows in different directions depending on the logical value of the write data, and the current flows bidirectionally through the memory cells in the data write operation. Likewise, in the RRAM, the voltage is applied to the memory cell in different polarities depending on a logical value of the write data, and the voltage is bidirectionally applied to the memory cell. Accordingly, in either of the RRAM and MRAM, the bit line and source line must be driven bidirectionally.

According to the construction disclosed in Reference 1, the memory cell is configured to have such characteristics that the combined resistance value of the variable resistance element and the access transistor takes a constant value after the writing. It is intended to suppress variations in resistance value after the writing and to reduce variations in resistance value of the elements when these are reset. However, the construction disclosed in Reference 1 is aimed at matching the element characteristics only when the resistance state changes in one direction from the low-resistance state to the high-resistance state, and no consideration is given to the case where the data writing of selected memory cells into the low-resistance state and the high-resistance state. Particularly, Reference 1 does not consider an operation control for parallel writing of multi-bit data.

According to the construction disclosed in Reference 2, the pre-erasing writing is first performed to set the memory cells to the high-resistance state before the erasing, and then collective erasure is performed. Since the collective erasing is performed after setting the memory cells into the high-resistance state, the pre-erasing writing and the erasing are performed collectively on the memory cells regardless of the write data to the memory cells. Reference 2 does not disclose a construction for writing data to set the resistance state of the memory cells pursuant to the write data. Also, this Reference 2 does not disclose any construction for parallel writing of multi-bit data.

According to Reference 3, the access transistor is arranged between the variable resistance element and the bit line, whereby it is intended to suppress application of the bit line voltage to the variable resistance element in the write/read operations, and to suppress application of the voltage stress to an unselected cell. In Reference 3, consideration is given to overcoming the problem of the disturbance during the write/read operations, but any consideration is not given to the problem of the disturbance during the parallel writing of multi-bit data as well as the efficient writing such multi-bit data.

In the construction disclosed in Reference 4, the variable resistance element is coupled to the bit line, whereby it is intended to hold the unselected bit line at a low level and to avoid increase in both current consumption and access time. In the data write operation, an applied voltage pulse is toggled to apply the voltage pulse of a waveform of the sequence of a low voltage level, a high voltage level and a low voltage level, or of a high voltage level, a low voltage level and a high voltage level, so that the voltage pulse may be applied to the selected bit line regardless of the write operation and the reset operation. The writing operation and the reset operation are distinguished from each other according to the level of the voltage applied to the source line. In Reference 4, however, the write operation and the reset operation are executed in the different, individual operation cycles, respectively, and no consideration is given to the operation of performing the pre-erasing writing before the collective erasing, as is disclosed in References 1 and 2. Further, no consideration is given to the parallel write operation for the multi-bit data.

In the construction disclosed in Reference 5, the source line is shared by the memory cells on adjacent columns, and the variable resistance elements are connected to the source line. Thereby, it is intended to avoid the voltage stress that may be applied on the variable resistance element due to the bit line voltage. However, Reference 5 likewise gives no consideration to the construction for parallel writing of multi-bit data without increasing the layout area.

SUMMARY OF THE INVENTION

An object of the invention is to provide a nonvolatile semiconductor memory device that can write multi-bit data in parallel at high speed.

Another object of the invention is provide a spin injection MRAM that can write multi-bit data at high speed with low power consumption.

A nonvolatile semiconductor memory device according to a first aspect of the invention includes a plurality of memory cells, arranged in rows and columns, each having a storing portion having a resistance value set according to storage data; a plurality of bit lines, arranged corresponding to the respective memory cell columns, each connected to the memory cells in a corresponding column; a plurality of source lines, arranged corresponding to the respective memory cell rows, each connected to the memory cells in a corresponding row; a write circuit for transmitting a voltage corresponding to write data to the bit line in a selected column in a data write operation; and a source line drive circuit for driving the source line in a selected row to first and second voltage levels in a predetermined sequence in the data write operation. The resistance value of the storing portion is set according to a current flowing between the bit line in the selected column and the source line in the selected row via a corresponding memory cell.

A nonvolatile semiconductor memory device according to a second aspect of the invention includes a plurality of memory cells, arranged in rows and columns, each having a storing portion having a resistance value set according to storage data; a plurality of bit lines, arranged corresponding to the respective memory cell columns, each connected to the memory cells in a corresponding column; a plurality of source lines, arranged corresponding to the respective memory cell rows, each connected to the memory cells in a corresponding row; a column select circuit for selecting in parallel the columns equal in number to a bit width of multi-bit write data in a data write operation; a write circuit for transmitting a first voltage to each of the bit lines in the selected columns regardless of a value of the write data bit in the data write operation, and then transmitting in parallel the voltage corresponding to the write data bits to the selected columns; and a source line drive circuit for driving the source line in a selected row to a second voltage level and the first voltage level in a predetermined sequence in the data write operation. The resistance value of the storing portion is set according to a current flowing between the bit line in the selected column and the source line in the selected row via a corresponding memory cell, the source line drive circuit transmits the second voltage in parallel with the transmission of the first voltage by the write circuit, and thereby the storing portion of the selected memory cell is set to the resistance state corresponding to a predetermined logical level.

A nonvolatile semiconductor memory device according to a third aspect of the invention includes a plurality of memory cells, arranged in rows and columns, each having a storing portion having a resistance value set according to storage data; a plurality of bit lines, arranged corresponding to the respective memory cell columns, each connected to the memory cells in a corresponding column; a plurality of source lines each arranged to be shared by the memory cells on a plurality of columns; a source line drive circuit for changing the voltage level of the source line in a selected column in a predetermined sequence in a data write operation; and a data write circuit having at least a time period for driving the bit line in the selected column according to the write data while the source line drive circuit drives the selected source line in the data write operation.

According to the first aspect of the invention, the source and word lines are arranged parallel to each other, and the bit line contact and the source line contact in a memory cell can be aligned in the column direction so that the layout area of the memory cells can be reduced.

The bit line potential is set according to the write data, and the source voltage is changed while keeping bit line potential state. Thereby, a current source for supplying bidirectionally the current to the bit line is not required, and the layout area is reduced so that the power supply circuit construction and the power supply switching construction can be simple.

The writing of the data is determined according to the relationship between the source line potential and the bit line potential. There is no need for setting individually and independently a reset cycle for setting a variable resistance element to a low-resistance state and a write cycle for setting the resistance state of the variable resistance element to a high-resistance state according to the storage data. Thus, the time required for the data writing can be reduced.

According to the second aspect of the invention, a plurality of memory cells are selected from the memory cells coupled to a common source line, and the current is passed through the memory cell according to the relationship between the potentials of the source line and the bit lines, to set the resistance states of the storing portions of the selected memory cells. Therefore, even in the case where the source line is shared by the plurality of memory cells, the multi-bit data can be accurately written in the memory cells.

According to the third aspect of the invention, the columns of the same bit width as the multi-bit data are coupled to the common source line. Therefore, the source lines can be reduced in number, and the array layout area can be reduced. The memory cells in the plurality of columns sharing the source line are driven to the selected state in parallel according to the selected row, and the voltage level is changed in the predetermined sequence with respect to the source line. Also, the data writing can be performed on the bit line. The advantageous effects similar to those of the first and second aspects can also be achieved.

The foregoing and other objects, features, aspects and advantages of the present invention will become more apparent from the following detailed description of the present invention when taken in conjunction with the accompanying drawings.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
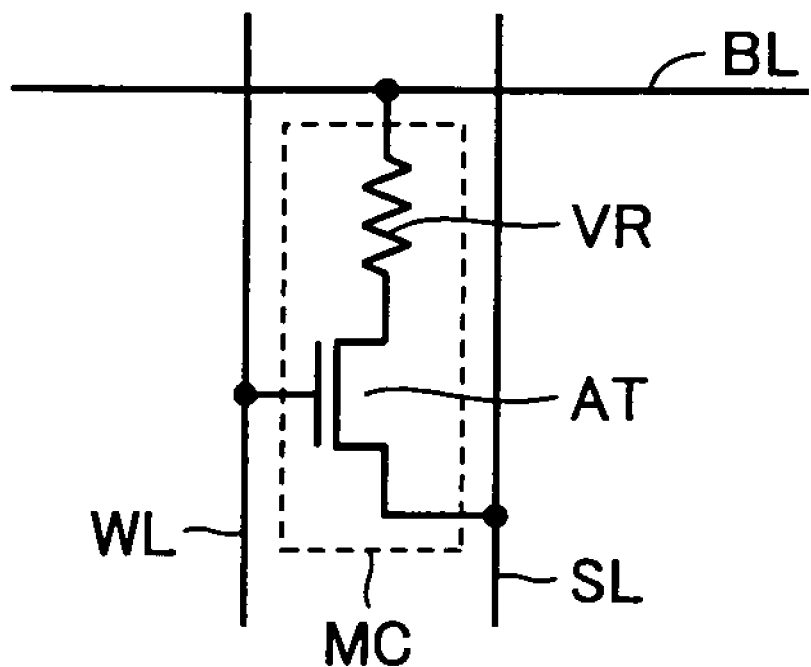
FIG. 1 shows an electrically equivalent circuit of a memory cell in a nonvolatile semiconductor memory device according to the invention.

FIG. 1 shows an electrically equivalent circuit of a memory cell of a nonvolatile semiconductor memory device according to a first embodiment of the present invention. In FIG. 1, a memory cell MC includes a variable resistance element VR having an end coupled to a bit line BL and having a resistance value according to storage data, and an access transistor AT that is selectively made conductive to couple the variable resistance element VR to a source line SL in response to a signal potential on a word line WL. Word line WL and source line SL are arranged to cross bit line BL. Variable resistance element VR is formed of a spin injection element, and injection of a polarized spin current sets a magnetization direction of a free layer according to the storage data.

Figure 2A:
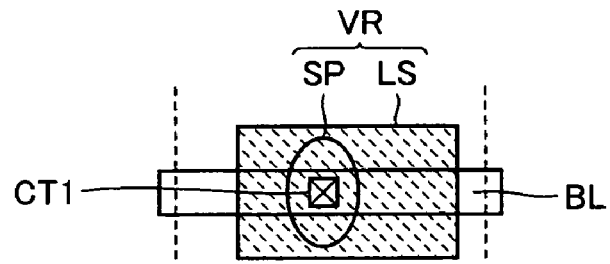
FIGS. 2A and 2B show planar layouts of the memory cell in respective interconnection layers shown in FIG. 1, and FIG. 2C schematically shows a sectional structure of the memory cell shown in FIG. 1.
Figure 2B:
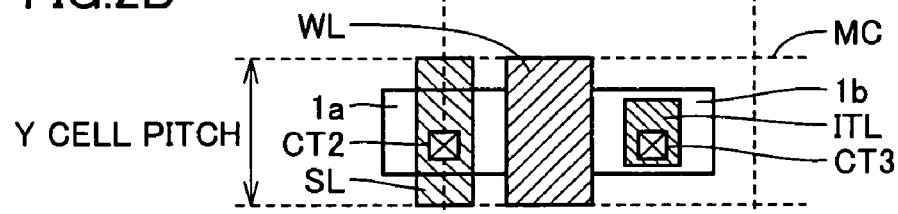
Figure 2C:
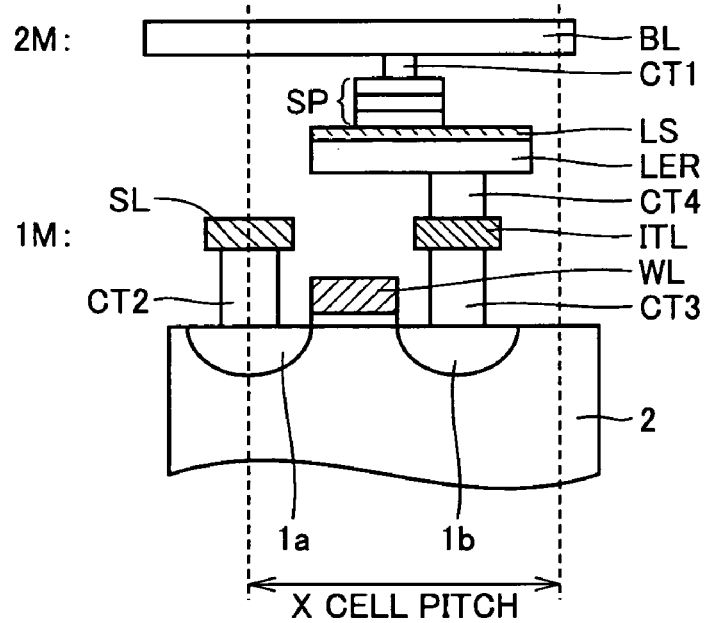

FIGS. 2A and 2B show planar layouts of metal interconnection layers of memory cell MC shown in FIG. 1, and FIG. 2C shows a sectional structure of memory cell MC shown in FIG. 1.

FIG. 2A shows a planar layout of variable resistance element VR and bit line BL.

As shown in FIG. 2A, a spin injection element SP is arranged between bit line BL and a strapping layer (buffer layer) LS, and is electrically coupled to bit line BL via a contact CT1. Spin injection element SP, strapping layer LS and an electrode layer (not shown) form variable resistance element VR.

Strapping layer LS has a rectangular form elongated in a column direction, and produces spin polarized electrons to spin injection element SP. More specifically, in strapping layer LS, electrons spin-polarized in a direction parallel to and in a direction anti-parallel to the magnetization direction of the fixed player (to be described later) of the spin injection element are present substantially at the same rate, and strapping layer LS is magnetically neutral. The strapping layer LS serves to align the spin polarized directions of the injection spin current to spin injection element SP in the parallel and the anti-parallel directions, to improve the spin injection efficiency.

FIG. 2B shows a planar layout of a first metal interconnection layer and underlying elements in the memory cell shown in FIG. 1. In FIG. 2B, word line WL is arranged between impurity regions 1a and 1b. Impurity region 1a is connected to source line SL formed of the first metal interconnection line via a contact CT2, and impurity region 1b is coupled to an intermediate layer ITL via a contact CT3. Intermediate layer ITL is formed of the first metal interconnection line located in the same layer as the source line, and is employed for reducing an aspect ratio of the contact portion coupling strapping layer LS to impurity region 1b. As shown in FIG. 2B, the source and word lines are arranged parallel to each other, and contact CT2 for source line SL as well as contact CT3 for spin injection element SP can be arranged to be substantially aligned in the Y direction within the memory cell region.

In FIG. 2B, a rectangular region defined by broken line represents the memory cell region, and a bidirectional arrow indicates a cell pitch in the Y direction of memory cell MC.

FIG. 2C shows a sectional structure of memory cell MC shown in FIG. 1. Impurity regions 1a and 1b are formed at a surface of a semiconductor substrate region 2 with a space in between. Impurity regions 1a and 1b are coupled to source line SL and intermediate layer ITL via contacts CT2 and CT3, respectively. Word line WL is arranged at the surface of substrate region 2 between impurity regions 1a and 1b. Intermediate layer ITL is further coupled to a lower electrode layer LER of the variable resistance element via a contact CT4, and strapping layer LS is formed above lower electrode layer LER.

Spin injection element SP is formed of upper and lower ferromagnetic layers with a non-magnetic layer interposed between the ferromagnetic layers. In this spin injection element SP, one of the upper and lower ferromagnetic layers is used as a fixed layer having a fixed magnetization direction, and the other is used as a free layer having a magnetization direction set according to the storage data.

In spin injection element SP, when a current flows from the free layer to the fixed layer, electrons are injected from the fixed layer into the free layer, and a polarization direction of injected spin electrons becomes equal to the magnetization direction of the fixed layer. In this case, therefore, the magnetization direction of the free layer becomes equal to the magnetization direction of the fixed layer. Conversely, in the case where a current is injected into the free layer via the fixed layer, the electrons flow from the free layer to the fixed layer. Electrons spin-polarized in the opposite direction of the magnetization direction of the fixed layer are reflected, and electrons spin-polarized in the same direction as the magnetization direction of the fixed layer pass through the fixed layer. Accordingly, the electrons spin-polarized in the direction opposite to the magnetization direction of the fixed layer increase in number among the polarized spin electrons of the free layer. Thus, the free layer comes to have the magnetization direction opposite to the magnetization direction of the fixed layer.

The state where the magnetization directions of the fixed and free layers are parallel to each other (i.e., in the same state) results in the low-resistance state. When these magnetization directions are anti-parallel (opposite) to each other, the high-resistance state is established.

In the case where the magnetization direction of the spin injection element is set by the spin injection, it is not necessary to apply externally the magnetic field to the variable magneto-resistance element, and a signal line (write word line) for generating the magnetic field is not required. Since the magnetization direction is set through the spin electron injection, the current consumption can be reduced as compared with the structure in which the magnetic direction is set according to a current-induced magnetic field.

Figure 3A:
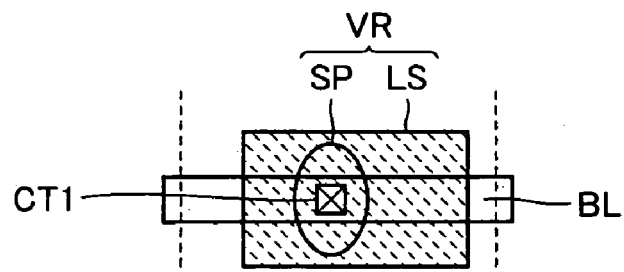
FIGS. 3A and 3B show planar layouts including the memory cell and a source line arranged in the column direction, and FIG. 3C schematically shows a sectional structure including the memory cell and the source line arranged in the column direction.
Figure 3B:
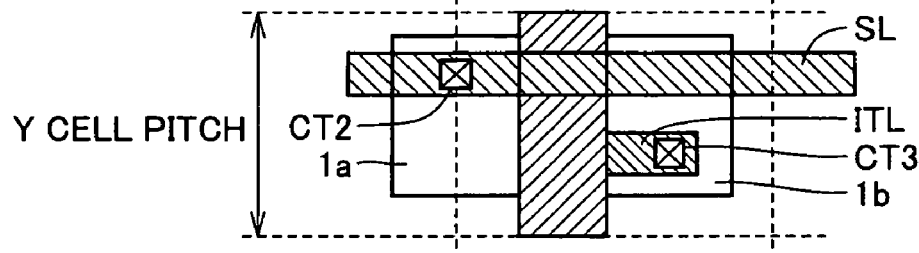
Figure 3C:
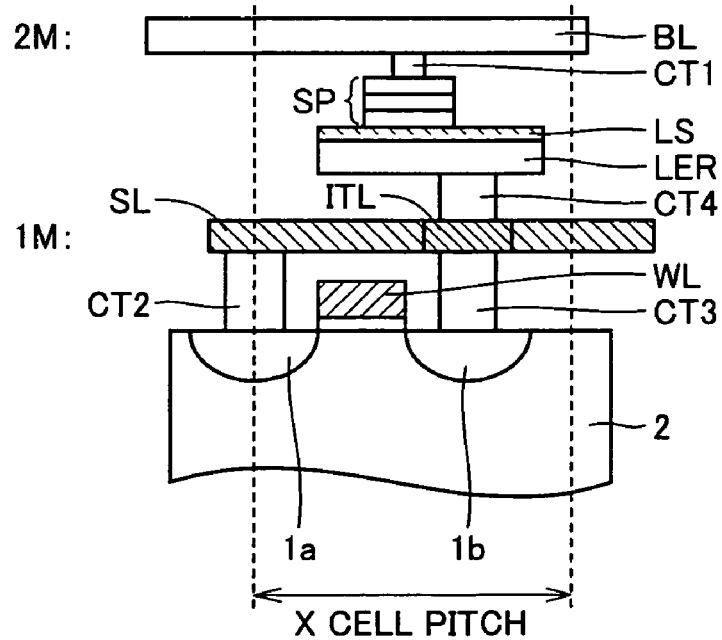

FIGS. 3A-3C schematically show planar layouts and a cross sectional structure of a memory cell which may be possible to implement in the arrangement in which source line SL is parallel to bit line BL, for the purpose of comparison. FIG. 3A corresponds to the layout shown in FIG. 2A, and shows the planar layout of the bit line and the strapping layer. FIG. 3B corresponds to the layout shown in FIG. 2B, and shows the planar layout of the source line, impurity regions and portions in between. FIG. 3C corresponds to FIG. 2C, and shows the sectional structure of the memory cell. In FIGS. 3A-3C, the components corresponding to those in FIG. 2A-2C are allotted with the same reference characters.

As shown in FIG. 3C, source line SL is formed using an interconnection line in the same interconnection layer (first metal (1M) interconnection layer) as intermediate layer ITL. In this case, intermediate layer ITL and source line SL are arranged in positions different in the Y direction from each other. As shown in FIG. 3B, therefore, contact CT2 between source line SL and impurity region 1a is arranged in a position different in the Y direction from a position of contact CT3 between impurity region 1b and intermediate layer ITL. The cell pitch in the Y direction is wider than the Y cell-pitch in FIG. 2B. The cell pitch in the X direction of the memory cell arrangement shown in FIGS. 2A-2C is the same as that of the memory cell arrangement shown in FIGS. 3A-3C. Consequently, in the case where the source line and the word line are arranged perpendicularly to each other, the layout area of the memory cell increases, which impedes high-density arrangement. By arranging word line WL and source line SL parallel to each other, as shown in FIG. 2B, the layout area of the memory cell can be reduced so that the high-density arrangement of the memory cells can be achieved.

Figure 4:
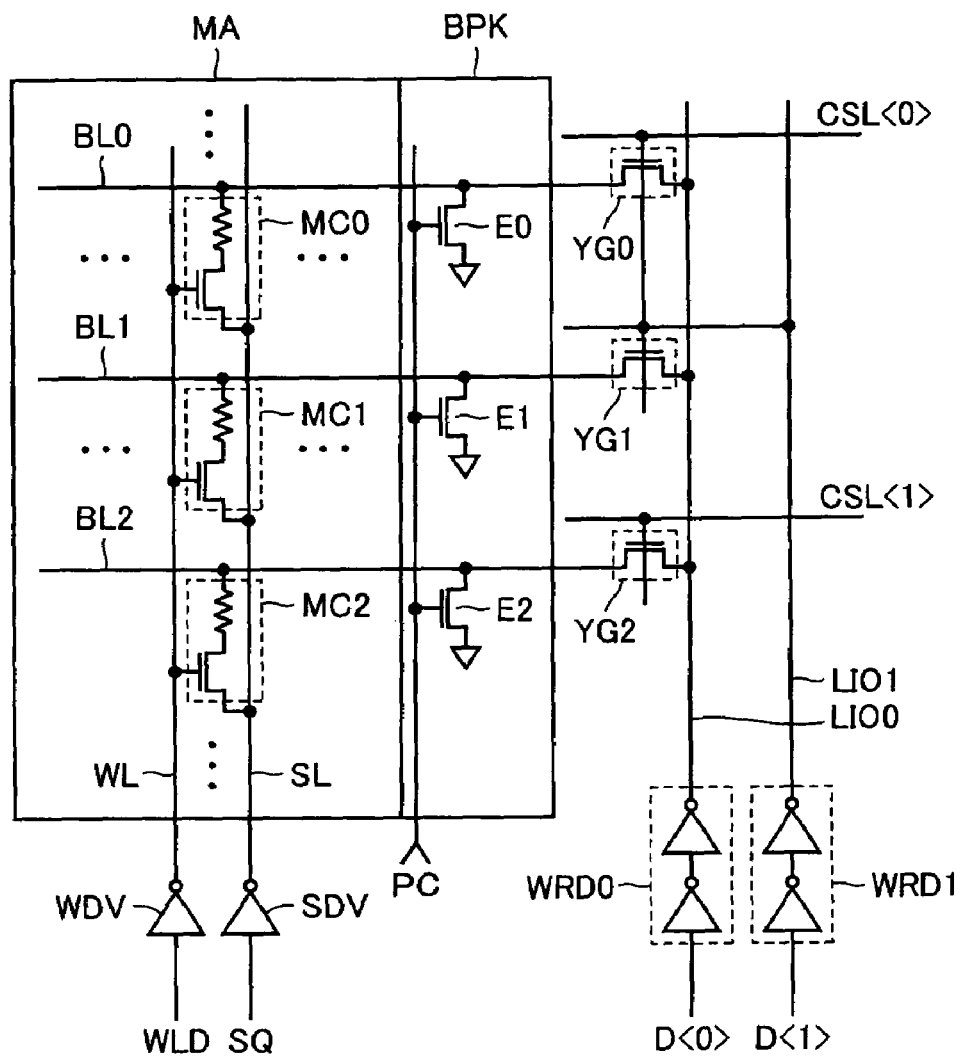
FIG. 4 schematically shows a construction of a major portion of the nonvolatile semiconductor memory device according to the first embodiment of the invention.

FIG. 4 schematically shows a construction of a main portion of the nonvolatile semiconductor memory device according to the first embodiment of the invention. FIG. 4 representatively shows memory cells MC0-MC2 arranged in one row by three columns. Although FIG. 4 shows an array configuration in which data of 2 bits can be written and read at a time, the configuration can be readily expanded for writing and reading other multi-bit data such as 4- or 8-bit data at a time.

In a memory array MA, bit lines BL0, BL1 and BL2 are arranged corresponding to memory cells MC0-MC2, respectively. Word line WL and source line SL are arranged extending in the row direction to be shared by these memory cells MC0-MC2. Each of memory cells MC0-MC2 is comprised of a serial connection body of the variable resistance element and the access transistor as already described.

For bit lines BL0-BL2, there are arranged precharge transistors E0-E2 that are selectively turned on according to a precharge instructing signal PC, to transmit a ground voltage to corresponding bits lines to precharge bit lines BL0-BL2 to the ground voltage level, respectively.

A word line driver WDV receives a word line decode signal WLD to drive word line WL, and a source line driver SDV receives a source line drive timing signal SQ to drive source line SL. Word line decode signal WLD is produced by decoding a row address signal (word line address signal), and source line drive timing signal SQ is produced based on a write enable signal instructing the write operation as well as a word line address signal and a switching timing signal.

These bit lines BL0-BL2 are coupled to common data lines via column select gates YG0-YG2. As the common data lines, there are arranged data lines LIO0 and LIO1 for reading/writing 2-bit data. Bit lines BL0 and BL2 are coupled to common data line LIO0 via column select gates YG0 and YG2, respectively, and bit line BL1 is coupled to common data line LIO1 via column select gate YG1.

For performing the parallel writing/reading of the 2-bit data, column select gates YG0 and YG1 receive a column select signal CSL<0>, and column select gates YG2 and YG3 (not shown) commonly receive a column select signal CSL<1>.

These common data lines LIO0 and LIO1 transmit both the read data and the write data, but FIG. 4 shows write drivers WRD0 and WRD1 for emphasizing the write operation. These write drivers WRD0 and WRD1 are each formed of serial connections of inverters, and drive common data lines LIO0 and LIO1 according to internal write data D<0> and D<1>, respectively.

Word line driver WDV and source line driver SDV are each formed of, by way of example, an inverter buffer generating an output signal, of which H level (logical high level) is set to a voltage level higher than the power supply voltage (H level of the write data). When column select signals CSL<0> and CSL<1> are selected, these signals are set to a voltage level higher than the power supply voltage.

Figure 5:
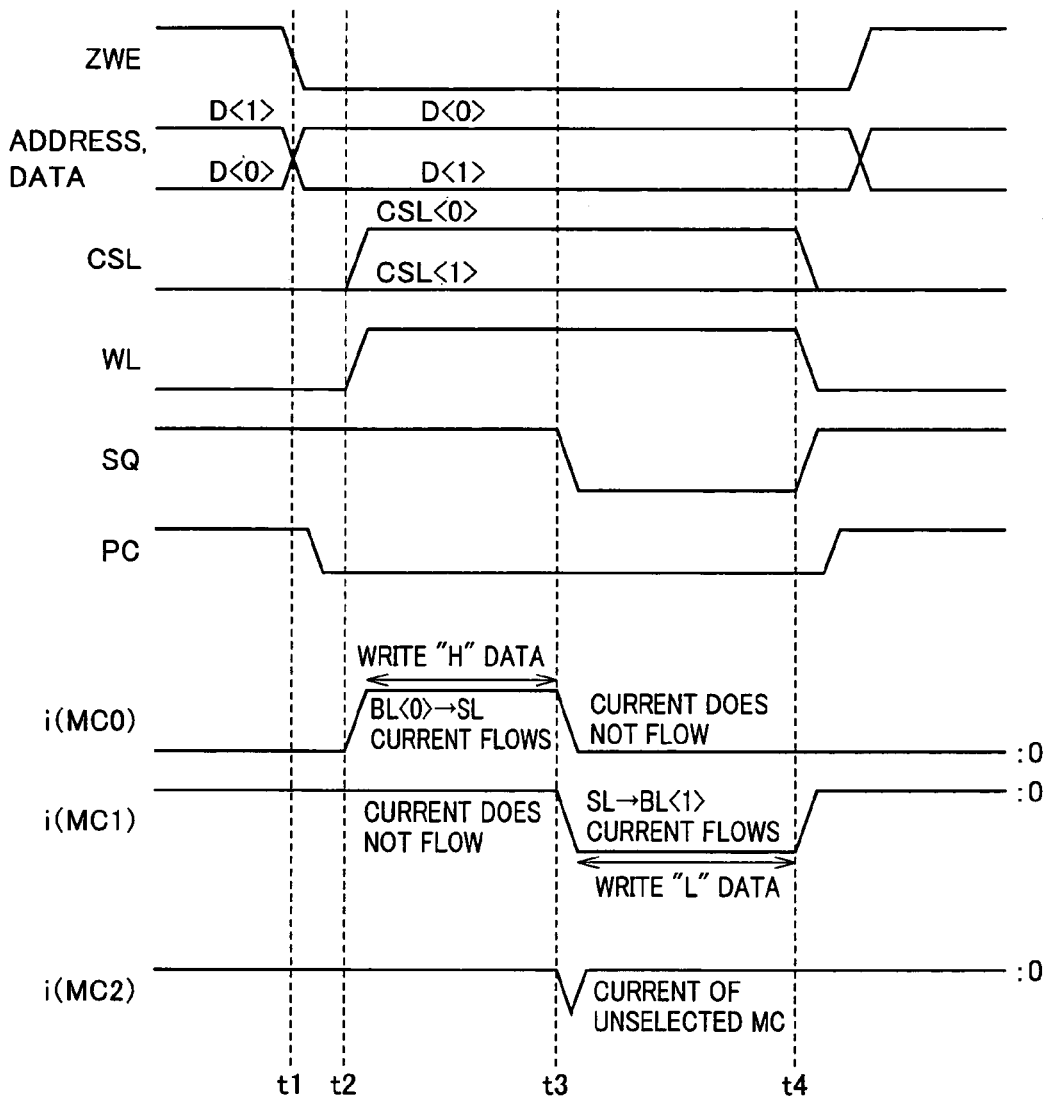
FIG. 5 is a signal waveform diagram representing an operation of the nonvolatile semiconductor memory device shown in FIG. 4.

FIG. 5 is a signal waveform diagram representing operations in data writing of the nonvolatile semiconductor memory device shown in FIG. 4. Referring to FIG. 5, description will now be given on the operations for data writing of the memory device shown in FIG. 4.

During a standby state before a time t1, word line WL is in an unselected state at L level (logical low level), and source line SL is also in the unselected state at the L level. Precharge instructing signal PC is at the H level, and precharge transistors E0-E2 are conductive and maintain bit lines BL0-BL2 at the ground voltage level, respectively. Column select signals CSL<0> and CSL<1> are at the L level, and column select gates YG0-YG2 are non-conductive.

At time t1, the data writing is instructed, and a write enable signal ZWE attains the active state at L level. According to the activation of write enable signal ZWE, internal write data D<0> and D<1> attain the definite state, write drivers WRD0 and WRD1 are activated and common data lines LIO0 and LIO1 are driven to the voltage levels corresponding to internal write data D<0> and D<1>, respectively. FIG. 5 shows, by way of example, a case where internal write data D<0> and D<1> are set to H and L levels, respectively.

Subsequently, precharge instructing signal PC attains the L level, precharge transistors E0-E2 are turned off, and bit lines BL0-BL2 attains a floating state at the ground voltage level.

At a time t2, the operation of selecting the row and column is performed according to the received address signal, so that word line WL is driven to the selected state, and column select signal CSL<0> is driven to the selected state. Column select signal CSL<1> is in the unselected state.

Source line drive timing signal SQ is at the H level, and source line SL is at the L level. In this state, column select gates YG0 and YG1 are made conductive to couple bit lines BL0 and BL1 to common data lines LIO0 and LIO1, and the potentials of bit lines BL0 and BL1 are set to the voltage levels corresponding to write data D<0> and D<1>, respectively. For example, bit line BL0 is at the H level, and bit line BL1 is at the L level of the ground voltage level in FIG. 5.

Word line WL is in the selected state, and the access transistors in memory cells MC0 and MC1 are made conductive, so that a current i(MC0) flows from bit line BL0 at the H level to source line SL, and the resistance state of the variable resistance element of memory cell MC0 is set to the state corresponding to "H" level. It is now assumed that the spin injection is effected on the spin injection element by passing a current from bit line BL to source line SL, and the memory cell enters a low-resistance state. Meanwhile, bit line BL1 is at the L level, i.e., the same level as source line SL, and current i(MC1) does not flow via memory cell MC1.

For memory cell MC2, word line WL is in the selected state so that the access transistor is on. However, bit line BL2 is at the ground voltage level, i.e., the same voltage level as source line SL, and current i(MC2) does not flow.

When the writing of H level data is completed, source line drive timing signal SQ is lowered from the H level to the L level at a time t3 while maintaining word line WL and column select signal CSL<0> at the selected state. Thereby, source line driver SDV drives the potential of source line SL to the H level. Source line SL is equal in voltage level to bit line BL0, and current i(MC0) does not flow via memory cell MC0, so that the data writing is not performed.

In memory cell MC1, bit line BL1 is at the ground voltage level, and current i(MC1) flows from source line SL to bit line BL<1> so that L level data is written. In this operation, it is assumed that the variable resistance element is set to the high-resistance state when the current flows from source line SL to bit line BL.

In memory cell MC2, a current flows to bit line BL2 from source line SL (particularly when the variable resistance element is in the low-resistance state). However, bit line BL2 is in the floating state, and the charging of its parasitic capacitance is immediately completed, so that the data is not written into this unselected memory cell MC2, and the disturbance does not occur during the write operation.

When the L level data writing is completed, word line WL and column select signal CSL<0> are driven to the unselected state at a time t4, and source line drive timing signal SQ is driven to the H level. Accordingly, the access transistors of memory cells MC0-MC2 are turned off, and column select gates YG0 and YG1 are also made non-conductive. Subsequently, precharge instructing signal PC attains the H level, and precharge transistors E0-E2 precharge bit lines BL0-BL2 to the ground voltage level, respectively. Thereafter, write enable signal ZWE attains the H level to complete the write cycle.

In one write cycle of performing the data writing, as described above, the word and bit lines are kept at the selected state, and the potential of the source line is switched according to the source line drive timing signal, whereby binary data can be written. Therefore, even in the construction having word and source lines WL and SL arranged parallel to each other, the multiple bits of data can be written in parallel. Thereby, the fast writing can be achieved while utilizing high-density cell structure.

In the construction shown in FIG. 4, the writing of 2-bit data is performed. However, 4-bit or 8-bit data can be written in parallel. The writing of 4-bit or 8-bit data can be achieved by using a construction in which common data line LIO is expanded to a 4-bit or 8-bit width, and column select signal CSL selects in parallel the memory cells in four or eight columns.

In the standby state, source line SL is held at the ground voltage level, and thereby occurrence of a leakage current of the source line can be prevented during the standby state, so that the current consumption can be reduced.

Figure 6:
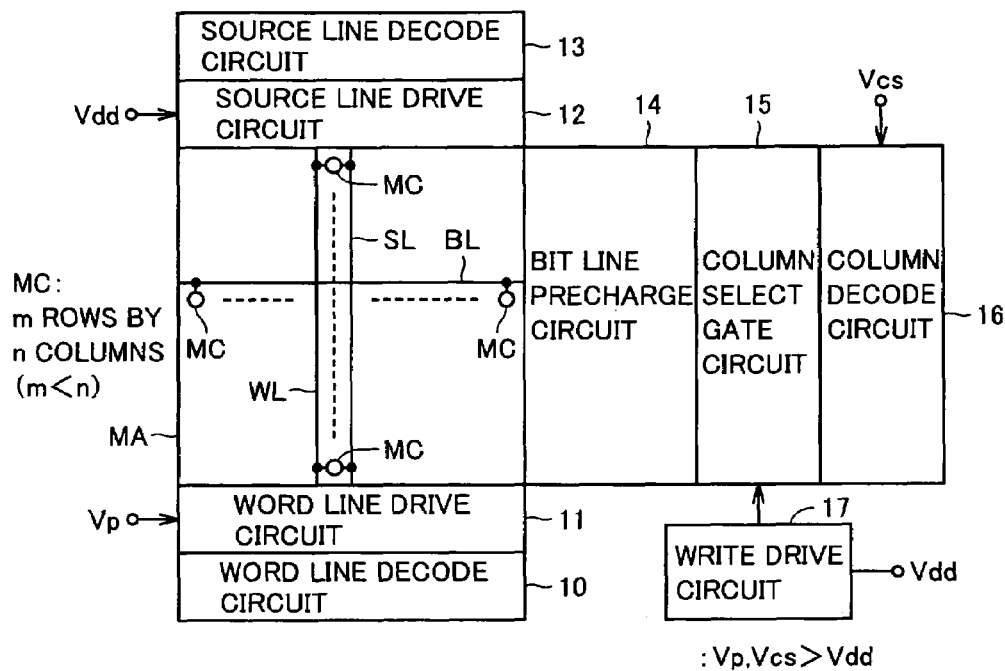
FIG. 6 schematically shows a whole construction of the nonvolatile semiconductor memory device according to the first embodiment of the invention.

FIG. 6 schematically shows a whole construction of the nonvolatile semiconductor memory device according to the first embodiment of the invention. In memory cell array MA, word line WL and source line SL are arranged extending in the row direction, and bit line BL is arranged crossing word and source lines WL and SL. In memory cell array MA, memory cells MC are arranged in m rows and n columns. Thus, m memory cells MC (spin injection elements) are arranged on one bit line BL, and n memory cells MC are connected to word and source lines WL and SL, where m is smaller than n (m<n). The number of memory cells (variable resistance elements) connected to bit line BL is smaller than the number of memory cells (access transistors) connected to the word and source lines, so that the parasitic capacitance of bit line BL can be reduced.

A word line drive circuit 11 and a source line drive circuit 12 are arranged on the opposite sides in the row direction of memory cell array MA, respectively. Word and source line drive circuits 11 and 12 include word and source line drivers WDV and SDV shown in FIG. 4, respectively. Since word and source line drive circuits 11 and 12 are arranged on the opposite sides of the memory cell array, respectively, the restriction on layout pitches of the word line drivers and source line drivers can be mitigated, and the word and source line drivers can be arranged with adequate margin. Word line drive circuit 11 receives the word line decode signal (WLD) from a row decode circuit 10, and source line drive circuit 12 receives the source line drive timing signal from a source line decode circuit 13.

For bit line BL, a bit line precharge circuit 14 and a column select gate circuit 15 are arranged. Column select gate circuit 15 includes column select gates YG shown in FIG. 4, and is selectively made conductive according to column select signal CSL received from a column decode circuit 16. A write drive circuit 17 (write driver WRD) transmits the write data to column select gate circuit 15 via a common data line (not shown).

Source line drive circuit 12 and write drive circuit 17 are supplied with a power supply voltage Vdd as the operation power supply voltage, word line drive circuit 11 is supplied with a word line boosted voltage Vp and column decode circuit 16 is supplied with a voltage Vcs as the operation power supply voltage. Voltages Vp and Vcs are higher in level than power supply voltage Vdd. Therefore, selected word line WL is driven to the voltage level higher than the H level of bit line BL and source line SL, and column select signal CSL applied from column decode circuit 15 is set to the voltage level higher than the H level of the potentials of bit line BL and source line SL. Thus, power supply voltage Vdd is reliably applied to the selected memory cell, and the data writing can be reliably performed even under a low power supply voltage condition.

Figure 7:
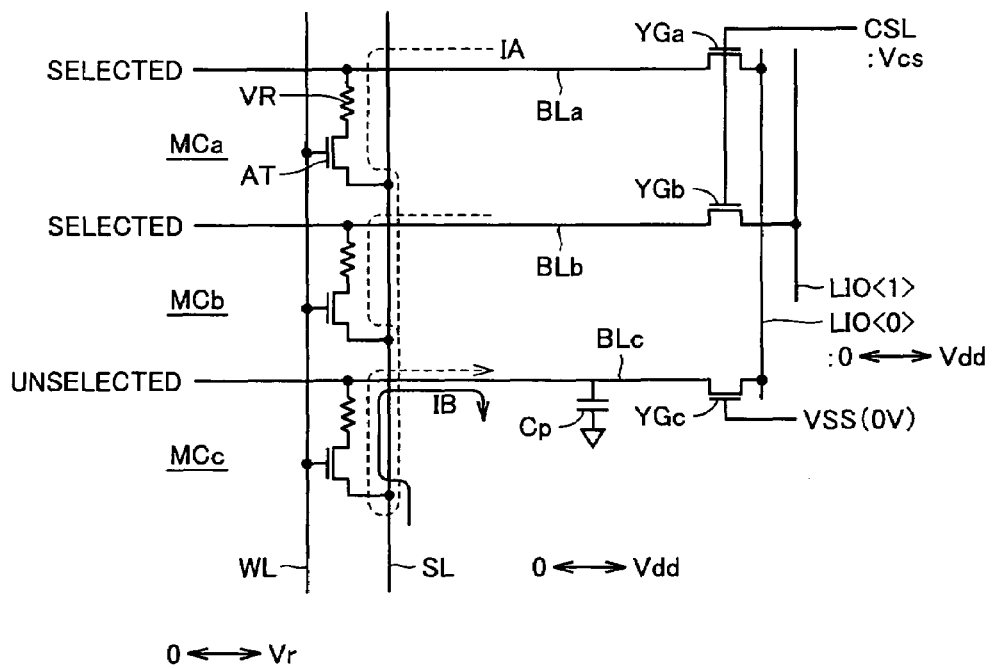
FIG. 7 schematically shows paths of a leak current in a data write operation of the nonvolatile semiconductor memory device of the first embodiment of the invention.

FIG. 7 schematically shows voltages applied to various portions of the construction shown in FIG. 6 during data writing. FIG. 7 representatively shows memory cells MCa-MCc connected to bit lines BLa-BLc, respectively. Bit lines BLa and BLb are coupled to common data lines LIO<0> and LIO<1> via column select gates YGa and YGb. Word line WL and source line SL are arranged to be shared by these memory cells MCa-MCc. Bit line BLc is unselected, and a corresponding column select gate YGc receives ground voltage VSS (0V) on its gate and therefore is non-conductive, so that bit line BLc is in the electrically floating state. Bit line BLc is accompanied with a parasitic capacitance Cp.

In the data write operation, bit lines BLa and BLb are set to the voltage levels corresponding to the write data, and source line SL is set to the ground voltage level (0V). When the voltage levels of both bit lines BLa and BLb are set to the H level, a current IA flows to source line SL via variable resistance element VR and access transistor AT of memory cell MCa. In memory cell MCb, a current likewise flows from bit line BLb to source line SL. It may be possibly considered that current IA flowing through source line SL is shunted to bit line BLc via the access transistor and variable resistance element of memory cell MCc before it is discharged to the ground node of source line SL. However, the memory cells (spin injection elements) connected to bit line BLc are small in number, and parasitic capacitance Cp of bit line BLc is small. Thus, parasitic capacitance Cp is rapidly charged, and bit line BLc attains the voltage level substantially equal to a rising-up potential of source line SL. Accordingly, the change in state of the variable resistance element of memory cell MCc is prevented.

When source line SL is set to the H level (of voltage Vdd), a current IB flows from source line SL via unselected memory cell MCc to bit line BLc. In this case, parasitic capacitance Cp is sufficiently small (because the memory cells connected thereto are small in number), and current IB immediately stops. As shown in FIG. 5, therefore, current i(MC2) flowing through the unselected memory cell can be made sufficiently small, and occurrence of the write disturbance can be suppressed.

The voltage level of selected word line WL is at the level of voltage Vp higher than power supply voltage Vpp, and column select signal CSL in the selected state is at the level of voltage Vcs. When source line SL is set to the ground voltage level, the voltage at the level of power supply voltage Vdd can be transmitted according to the write data to bit line(s) BLa and/or BLb without being affected by the threshold voltages of column select gates YGa and YGb. Also, the channel resistance can be sufficiently reduced (to enter a deep on state), and the current can be sufficiently supplied. Further, power supply voltage Vdd can be applied to variable resistance element VR of the selected memory cell, and the current corresponding to the resistance value thereof can be passed through variable resistance element VR. Access transistor AT is in the deep on state, and the channel resistance (on resistance) thereof can be substantially neglected, so that the current can flow fast, and the fast writing is achieved. Even when the memory cell is in the high-resistance state, a sufficiently large voltage can be applied to pass the current, and accurate writing can be performed under a low power supply voltage condition.

When source line SL is set to the H level, power supply voltage Vdd can be applied to variable resistance element VR via access transistor AT of the selected cell (when bit line(s) BLa and/or BLb are at the ground voltage level). Therefore, even when variable resistance element VR is in the low-resistance state, a sufficiently large current can flow, and variable resistance element VR can be rapidly changed to the high-resistance state.

Figure 8:
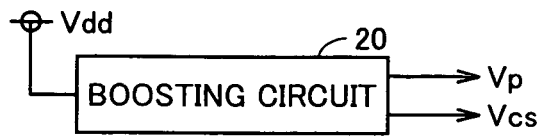
FIG. 8 shows an example of a construction of a portion for generating voltages Vp and Vcs shown in FIG. 6.

FIG. 8 shows an example of a construction of a portion for generating voltages Vp and Vcs. In FIG. 8, a boosting circuit 20 is used for producing word line driving voltage Vp (i.e., voltage for driving the word line) and column select voltage Vcs (i.e., voltage for selecting the column) from power supply voltage Vdd in the nonvolatile semiconductor memory device. Boosting circuit 20 is formed using a charge pump circuit utilizing a charge pump operation of a capacitance element, to perform the boosting operation to produce the higher voltages Vp and Vcs from power supply voltage Vdd. Boosting circuit 20 may include charge pump circuits for the respective voltages Vp and Vcs. These voltages Vp and Vcs may be at the same voltage level.

Figure 9:
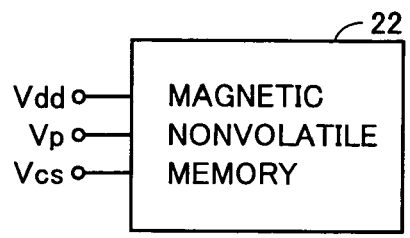
FIG. 9 schematically shows another construction for generating voltages Vp and Vcs shown in FIG. 7.

FIG. 9 shows another construction for generating the voltages Vp and Vcs. In FIG. 9, a magnetic nonvolatile memory (nonvolatile semiconductor memory device) 22 is externally supplied with voltages Vdd, Vp and Vcs. When magnetic nonvolatile memory 22 may be integrated with another processor and a logic circuit on the same chip, as in an SOC (System On Chip), these voltages Vdd, Vp and Vcs are supplied from the processor or an off-chip portion. In this construction also, voltages Vp and Vcs may be at the same voltage level, and may be supplied via a common power supply terminal from a portion outside the memory.

Figure 10:
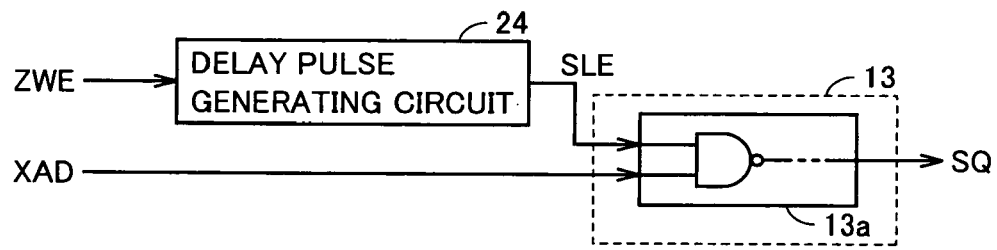
FIG. 10 shows an example of a construction of a portion for generating a source line drive timing signal shown in FIG. 4.

FIG. 10 shows an example of a construction of source line decode circuit 13 shown in FIG. 6. In FIG. 10, source line decode circuit 13 receives, as a voltage switching timing signal, a source line activating signal SLE from a delay pulse generating circuit 24. As an example, delay pulse generating circuit 24 produces a pulse signal having a predetermined pulse width a predetermined time after the activation (transition to the L level) of write enable signal ZWE.

When source line activating signal SLE is active, source line decode circuit 13 decodes a row address signal XAD to produce a source line drive timing signal SQ as a source line decode signal. FIG. 10 representatively shows a source line decoder 13a provided for one source line. Source line decoder 13a is an NAND type decoder, and produces source line drive timing signal SQ as the source line decoded signal according to row address signal XAD when source line activating signal SLE is at the H level.

Figure 11:
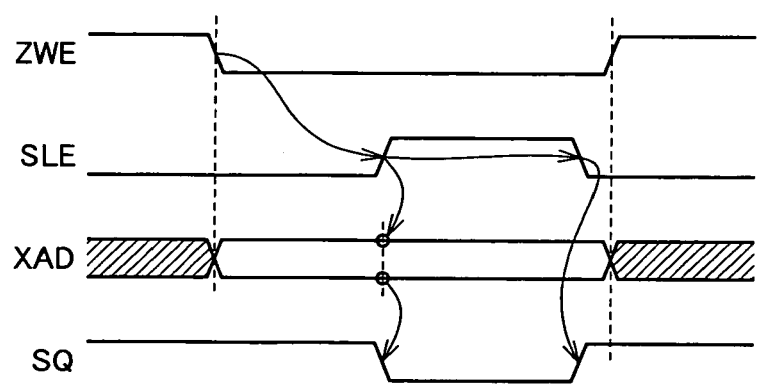
FIG. 11 is a signal waveform diagram representing an operation of the source line drive timing signal generating portion shown in FIG. 10.

FIG. 11 is a signal waveform diagram representing an operation of source line decode circuit 13 shown in FIG. 10. Referring to FIG. 11, an operation of source line decode circuit 13 shown in FIG. 10 will now be described.

In the data write cycle, when write enable signal ZWE changes to the L level, delay pulse generating circuit 24 produces source line activating signal SLE that will rise to the H level after elapsing of the predetermined time. When write enable signal ZWE is applied, row address signal XAD changes and attains the definite state. In source line decode circuit 13, however, when source line activating signal SLE is at the low level, or an inactive state, the decode operation is being disabled, and source line drive timing signal SQ is held the unselected state at a high level (H level).

When source line activating signal SLE rises to the H level, source line decode circuit 13 is enabled, and source line select signal (source line drive timing signal SQ) for the selected row attains the L level according to row address signal XAD.

This source line activating signal SLE has a predetermined pulse width, and lowers to the L level when a predetermined time elapses. Responsively, source line drive timing signal SQ attains the high and inactive state. Thereafter, write enable signal ZWE attains the inactive state of H level.

In the data read operation, write enable signal WE is held at the H level, and source line activating signal SLE is held at the L level. Therefore, source line drive timing signal SQ applied from source line decode circuit 13 is always in the unselected state of H level, and the source line driver included in source line drive circuit 12 maintains each source line at the ground voltage level.

Through the use of delay pulse generating circuit 24 shown in FIG. 10, the source line potential can change from the L level to the H level, and then can change to the L level in one write cycle. According to the bit line potential, a current flows between the bit and source lines in each time period, and the directions of the current flowing through the memory cell changes in the respective time periods, so that the construction of equivalently bidirectionally passing the current can be achieved. Even in the case where a plurality of memory cells share the source line, the multi-bit data can be written in one write cycle.

In the case where the nonvolatile semiconductor memory device is a clock synchronous memory operating in synchronization with a clock signal, the souse line activating signal SLE may be configured to change in accordance with the clock signal. The construction of the clock synchronous memory will be described later.

Figure 12:
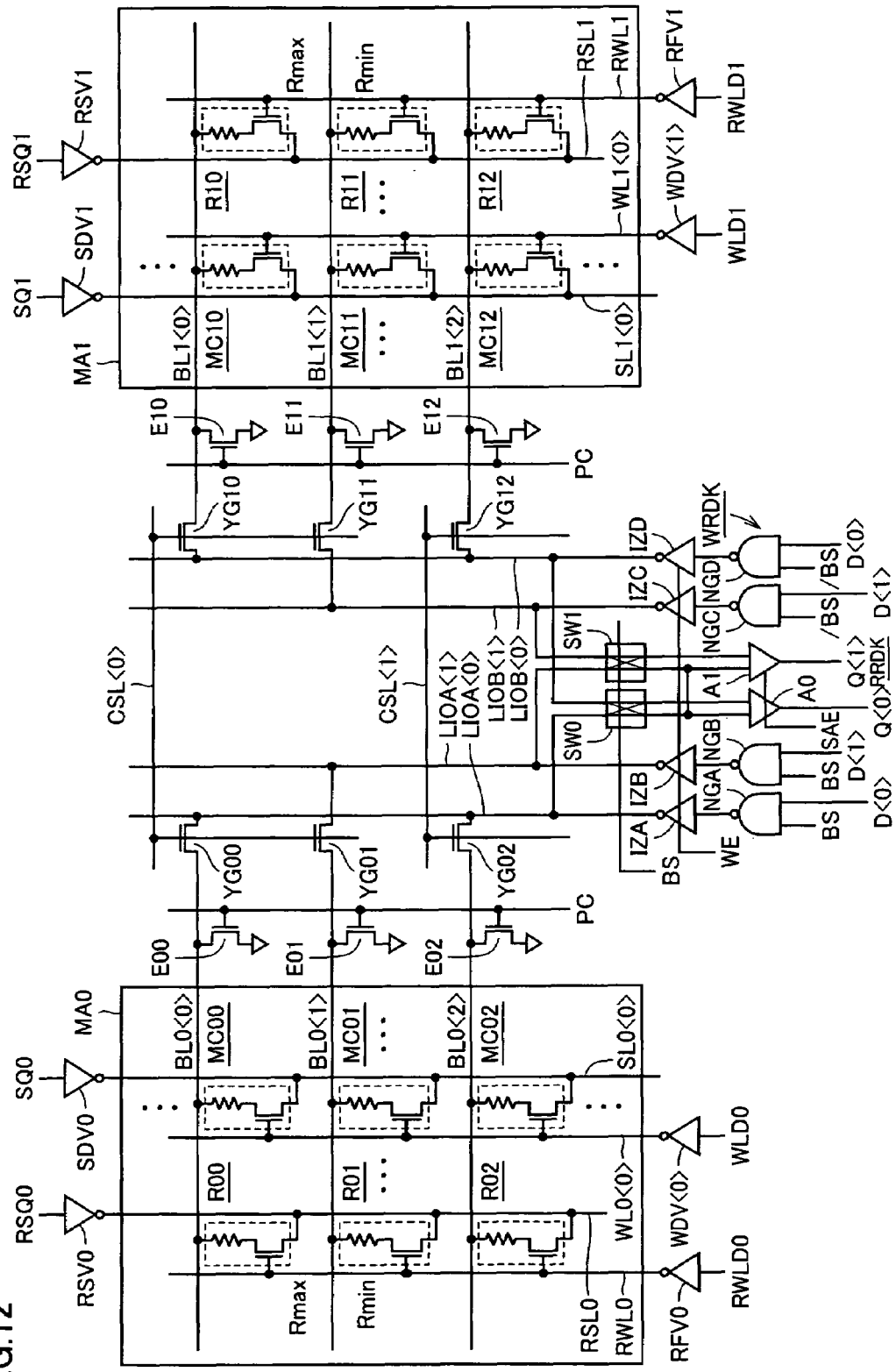
FIG. 12 shows more specifically a construction of an array of the nonvolatile semiconductor memory device according to the first embodiment of the invention.

FIG. 12 schematically shows a construction of a portion including a data read portion of the nonvolatile semiconductor memory device according to the first embodiment of the invention. Referring to FIG. 12, memory arrays MA0 and MA1 are arranged. In memory array MA0, memory cells MC are arranged in rows and columns, and FIG. 12 representatively shows memory cells MC00, MC01 and MC02 arranged in one row by three columns. Reference cells are arranged corresponding to the respective columns of memory cells MC and aligned in one row. FIG. 12 representatively shows three reference cells R00, R01 and R02 in memory array MA0. The reference cell and memory cells MC aligned in the column direction are connected to the same bit line. Memory cell MC00 and reference cell R00 are connected to bit line BL<0>. Memory cell MC01 and reference cell R01 are connected to bit line BL<1>, and memory cell MC02 and reference cell R02 are connected to bit line BL0<2>.

In the construction shown in FIG. 12, since 2-bit data is written and read, one of the reference cells (R00 and R01) that are selected in parallel in data reading is set to the high-resistance state (resistance value Rmax), and the other is set to the low-resistance state (resistance value Rmin).

Word line WL0<0> and source line SL0<0> are arranged for memory cell MC10, and a reference word line RWL0 and a reference source line RSL0 are arranged for reference cells R00-R02. A word line driver WDV0 drives word line WL0<0>, and a reference word line driver RFV0 drives reference word line RWL0. A source line driver SDV0 and a reference source line driver RSV0 drive source line SL0<0> and reference source line RSL0, respectively.

Precharge transistors E00, E01 and E02 are arranged for bit lines BL0<0>-BL0<2>, respectively, to drive the corresponding bit lines to the ground voltage level according to precharge instructing signal PC. Bit lines BL0<0>, BL0<2> and BL0<1> are coupled to common data lines LIOA<0> and LIOA<1> via column select gates YG00, YG02 and YG01, respectively.

In memory array MA1, memory cells MC10-MC12 and reference cells R10-R12 are arranged in rows and columns, similarly to memory array MA0. Bit lines BL1<0>, BL1<1> and BL1<2> are arranged corresponding to the respective columns of the memory and reference cells. A source line SL1<0> and a word line WL1<0> are arranged corresponding to the row of memory cells MC10-MC12. A reference word line RWL1 and reference source line RSL1 are arranged for reference cells R10 and R11. A word line driver WDV1 drives word line WL1<0>, and a reference word line driver RFV1 drives reference word line RWL1.

A source line driver SDV1 and a reference source line driver RSV1 drives source line SL1<0> and reference source line RSL1 from portions opposite to the word line drive portion. This can mitigates restrictions on the arrangement pitch of the drivers, and allows arrangement of the memory cell at high density For bit lines BL1<0>-BL1<2>, there are arranged precharge transistors E10-E12 each driving the corresponding bit line to the precharge voltage level (ground voltage level) according to precharge instructing signal PC. Bit lines BL1<0> and BL1<2> are coupled to a common data line LIOB<1> via column select gates YG10 and YG12, respectively. Bit line BL1<1> is coupled to a common data line LIOB<0> via column select gate YG1.

Column select signal CSL<0> is commonly applied to column select gates YG00, YG01, YG10 and YG11, and column select signal CSL<1> is commonly applied to column select gates YG02 and YG12.

Memory arrays MA0 and MA1 are provided separately and individually with sets of common data lines LIOA and LIOB. In the operation of reading data from one of the memory arrays, the reference cell is selected in the other memory array to produce the reference current.

The data write/read portion includes a write drive circuit WRDK and a read drive circuit RRDK.

Write drive circuit WRDK includes an NAND gate NGA receiving a block select signal (array designating signal) BS and a write data bit D<0>, a tristate inverter buffer IZA that is activated when a write enable signal WE is active, to drive common data line LIOA<0> according to the output signal of NAND gate NGA, an NAND gate NGB receiving block select signal BS and a write data bit D<1>, a tristate inverter buffer IZB that is activated when write enable signal WE is active, to drive common data line LIOA<1> according to the output signal of NAND gate NGB, an NAND gate NGC receiving a complementary block select signal /BS and write bit D<0>, a tristate inverter buffer IZC that is activated according to the activation of write enable signal WE, to drive common data line LIOB<0> according to the output signal of NAND gate NGC, an NAND gate NGD receiving complementary block select signal /BS and write bit D<1>, and a tristate inverter buffer IZD that is activated according to write enable signal WE, to drive common data line LIOB<1> according to the output signal of NAND gate NGD.

Block select signal BS designates memory array MA0 when it is at the H level, and designates memory array MA1 when it is at the L level. Write enable signal WE is complementary to write enable signal ZWE, and designates the data writing to enable inverter buffers IZA-IZD when it is at the H level.

Read drive circuit RRDK includes a path selecting switch SW0 for selecting the connection path to common data lines LIOA<0> and LIOB<0> according to block select signal BS, a path selecting switch SW1 for selecting the connection path to common data lines LIOA<1> and LIOB<1> according to block select signal BS, a sense amplifier A0 activated in response to a sense amplifier activating signal SAE to differentially amplify the currents of the output nodes of path selecting switch SW0, and a sense amplifier A1 for differentially amplifying the currents of the output nodes of path selecting switch SW1 when sense amplifier activating signal SAE is active.

First outputs of path selecting switches SW0 and SW1 are connected together. In the data read operation, the reference cell in the high-resistance state and the reference cell in the low-resistance cell are connected in parallel to produce an average current of the currents flowing through these reference cells, for producing a reference current corresponding to the current flowing through the cell in an intermediate-resistance state.

Figure 13:
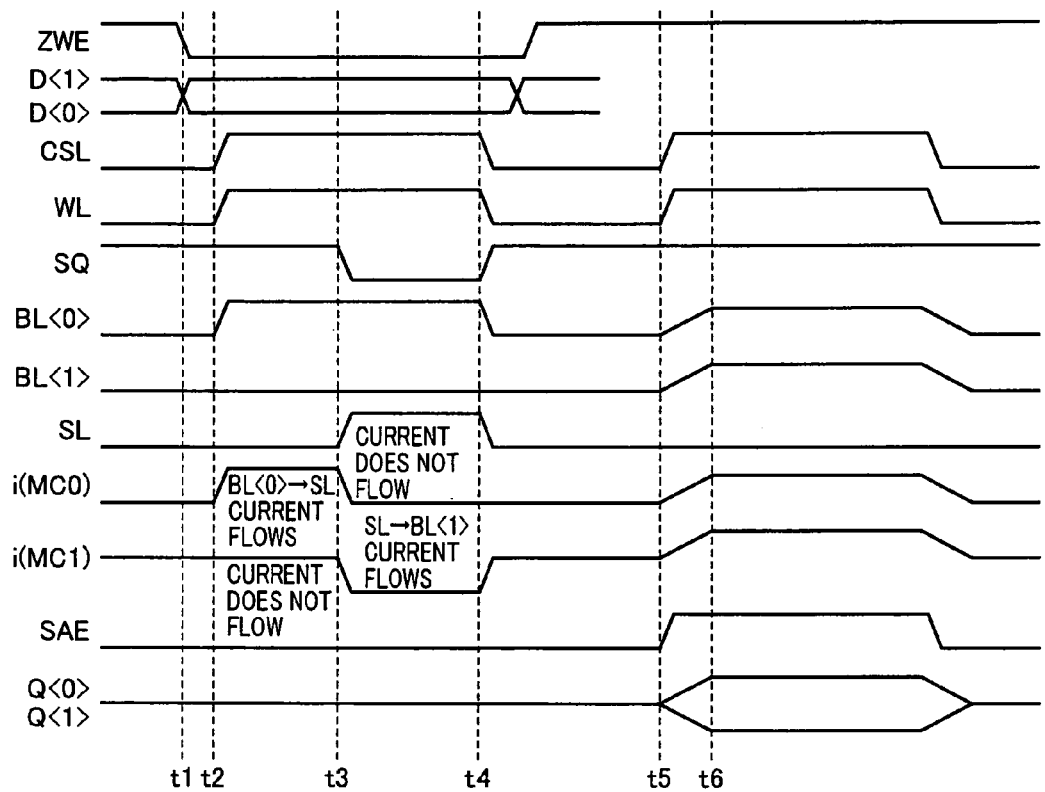
FIG. 13 is a timing diagram representing the operation of the nonvolatile semiconductor memory device shown in FIG. 12.

FIG. 13 is a signal waveform diagram representing operations for data writing and reading of the nonvolatile semiconductor memory device shown in FIG. 12. In the signal waveform diagram shown in FIG. 13, the operation for data writing is the same as the data write operation already described with reference to the signal waveform diagram of FIG. 5. Specifically, one of memory arrays MA0 and MA1 is designated according to block select signal BS. When block select signal BS is, e.g., at the H level and designates memory array MA0, NAND gates NGA and NGB are enabled in write drive circuit WRDK. NAND gates NGC and NGD are in the disabled state, and the output signals thereof are at the H level, and common data line LIOB<0> and LIOB<1> for memory array MA1 are kept at the L level when write enable signal WE is active (at the H level). When the column select gates (e.g., YG10 and YG11) in memory array MA1 are made conductive according to the column select signal, the operation of selecting the word and source lines is not performed in memory array MA1. Even when precharge transistors E10-E12 of bit lines BL1<0>-BL1<2> are turned off, common data lines LIOB<0> and LIOB<1> hold bit lines BL1<0>-BL1<2> at the L level.

In memory array MA0, the potentials on bit lines BL0<0> and BL0<1> in the selected columns are set to the potential levels corresponding to data D<0> and D<1> on common data lines LIOA<0> and LIOA<1>, respectively. Then, the potential on source line SL is changed so that the data is written into the memory cells.

In the data writing operation, precharge instructing signal PC for the unselected memory array may be kept in the active state. A result of combination (AND processing) of write enable signal WE, block select signal BS and precharge instructing signal PS is applied as the precharge instructing signal for memory array MA0, and a result of AND of complementary block select signal /BS, write enable signal WE and precharge instructing signal PS is applied as the bit line precharge instructing signal to memory array MA1.

This series of write operations is performed from time t1 to time t4 in FIG. 5.

In the data reading, at a time t5, column select signal CSL and word line WL are driven to the selected state according to the applied address signal. For the sake of simplicity, it is now assumed that column select signal CSL<0> is selected in memory array MA0. In the data read operation, write enable signal WE is inactive, and tristate inverter buffers IZA-IZD are all in the output high-impedance state. In memory array MA0, word line WL0<0> is driven to the selected state, and column select gates YG00 and YG01 are turned on. Bit lines BL0<0> and BL0<1> are coupled to common data lines LIOA<0> and LIOA<1>, respectively. Source line SL0<0> keeps the ground voltage level in the data read operation. Source line SL0<0> is held at the ground voltage level in the data read operation. Reference word line RWL0 is in the unselected state.

In memory array MA1, column select gates YG10 and YG11 are turned on. Precharge instructing signal PC is inactive, and the bit line is in the floating state at the L level. In memory array MA1, reference word line driver RFV1 is activated to drive reference word line RWL1 to the selected state according to a reference word line drive signal RWLD1. In the data read operation, reference source line RSL1 is held at the L level.

Connection path selecting switches SW0 and SW1 couple common data lines LIOA<0> and LIOB<0> to sense amplifier A0, and couple common data line LIOA<1> and LIOB<1> to sense amplifier A1.

The constant current sources included in sense amplifiers A0 and A1 supply currents according to sense amplifier activating signal SAE, so that the current flows through bit lines BL0<0>, BL0<1>, BL1<0> and BL1<1>. Common data lines LIOB<0> and LIOB<1> are short-circuited via connection path selecting switches SW0 and SW1, and sense amplifiers A0 and A1 supply currents to reference cells R10 and R11 in the high- and low-resistance states. Since the constant current sources in two sense amplifiers A0 and A1 supply the current commonly to the reference cell R11 in the high-resistance state and reference cell R10 in the low-resistance state, the reference currents of these sense amplifiers A0 and A1 take the average value of the currents flowing in the high-resistance state cell (resistance value Rmax) and the low-resistance state cell (resistance value Rmin).

The currents corresponding to the resistance states of memory cells MC00 and MC01 flow through common read data lines LIOA<0> and LIOA<1>, respectively. Sense amplifiers A0 and A1 each compare the currents flowing through common data lines LIOA<0> and LIOA<1> with the reference currents flowing through common data lines LIOB<0> and LIOB<1>, and read out internal data Q<0> an Q<1>, respectively.

Specifically, at a time t6, the currents change according to the resistance values of memory cells MC00 and MC01, and the potentials of bit lines BL0<0> and BL<1> rise. When the supplied currents and the bit line potentials attain the steady state, sense amplifiers A0 and A1 sense the currents flowing through the bit lines, and then convert the sensed currents into voltages to produce internal read data Q<0> and Q<1>.

Figure 14:
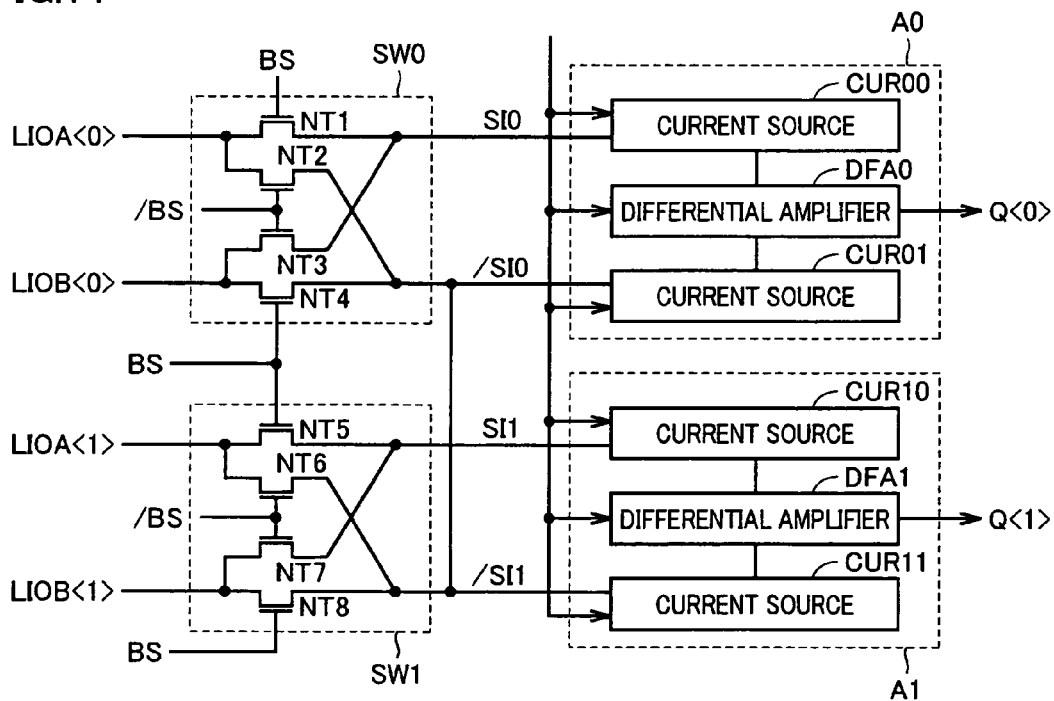
FIG. 14 shows constructions of a connection path selector switch and a sense amplifier shown in FIG. 12.

FIG. 14 schematically shows constructions of connection path selecting switches SW0 and SW1 as well as sense amplifiers A0 and A1 shown in FIG. 12. In FIG. 14, connection path selecting switch SW0 includes a transfer gate NT1 for coupling common data line LIOA<0> to a sense node SI0 according to block select signal BS, a transfer gate NT2 for coupling common data line LIOA<0> to a complementary sense node /SI0 according to complementary block select signal /BS, a transfer gate NT3 for coupling common data line LIOB<0> to sense node SI0 according to complementary block select signal /BS and a transfer gate for NT4 coupling common data line LIOB<0> to complementary sense node /SI0 according to block select signal BS.

Connection path selecting switch SW1 includes a transfer gate NT5 for coupling common data line LIOA<1> to a sense node SI1 according to block select signal BS, a transfer gate NT6 for coupling common data line LIOA<1> to a complementary sense node /SI1 according to complementary block select signal /BS, a transfer gate NT7 for coupling common data line LIOB<1> to sense node SI1 according to complementary block select signal /BS and a transfer gate NT8 for coupling common data line LIOB<1> to complementary sense node /SI1 according to block select signal BS.

Transfer gates NT1-NT8 are each formed of, e.g., an N-channel MOS transistor (insulated gate field effect transistor). These transfer gates NT1-NT8 each may be formed of a CMOS (Complementary MOS) transmission gate.

Complementary sense nodes /SI0 and /SI1 are connected together.

Sense amplifier A0 includes a current source CUR00 for supplying a current to sense node SI0 when sense amplifier activating signal SAE is active, a current source CUR01 for supplying a current to complementary sense node /SI0 when sense amplifier activating signal SAE is active, and a differential amplifier DFA0 for differentially amplifying the currents flowing through current sources CUR00 and CUR01, and performing current-to-voltage conversion to produce internal read data Q<0>.

Sense amplifier A1 includes a current source CURIO for supplying a current to sense node SI1 when sense amplifier activating signal SAE is active, a current source CUR11 for supplying a current to complementary sense node /SI1 when sense amplifier activating signal SAE is active, and a differential amplifier DFA1 for differentially amplifying the currents flowing through current supplies CUR10 and CUR11, and performing current-to-voltage conversion to produce internal read data Q<1> when sense amplifier activating signal SAE is active.

When block select signal BS is at the H level, memory array MA0 shown in FIG. 12 is selected. In this state, common data lines LIOA<0> and LIOA<1> are coupled to sense nodes SI0 and SI1 via transfer gates NT1 and NT5, respectively. Also, common data lines LOIB<0> and LIOB<1> are coupled to complementary sense nodes /SI0 and /SI1 via transfer gates NT4 and NT8, respectively. When memory array MA0 is selected, the currents flowing through common data lines LIOA<0> and LIOA<1> are sensed based on the reference currents flowing through common data lines LIOB<0> and LIOB<1> provided for memory array MA1, and the data of the selected memory cells in memory array MA0 are read.

When memory array MA1 is selected, block select signal BS is at the L level, and complementary block select signal /BS is at the H level. Therefore, common data lines LIOB<0> and LIOB<1> are coupled to sense nodes SI0 and SI1, respectively, and common data lines LIOA<0> and LIOA<1> are coupled to complementary sense nodes /SI0 and /SI1, respectively. In this case, therefore, the data are read from the selected memory cells in memory array MA1 based on the reference currents supplied from common data lines LIOA<0> and LIOA<1> provided for memory array MA0.

Figure 15:
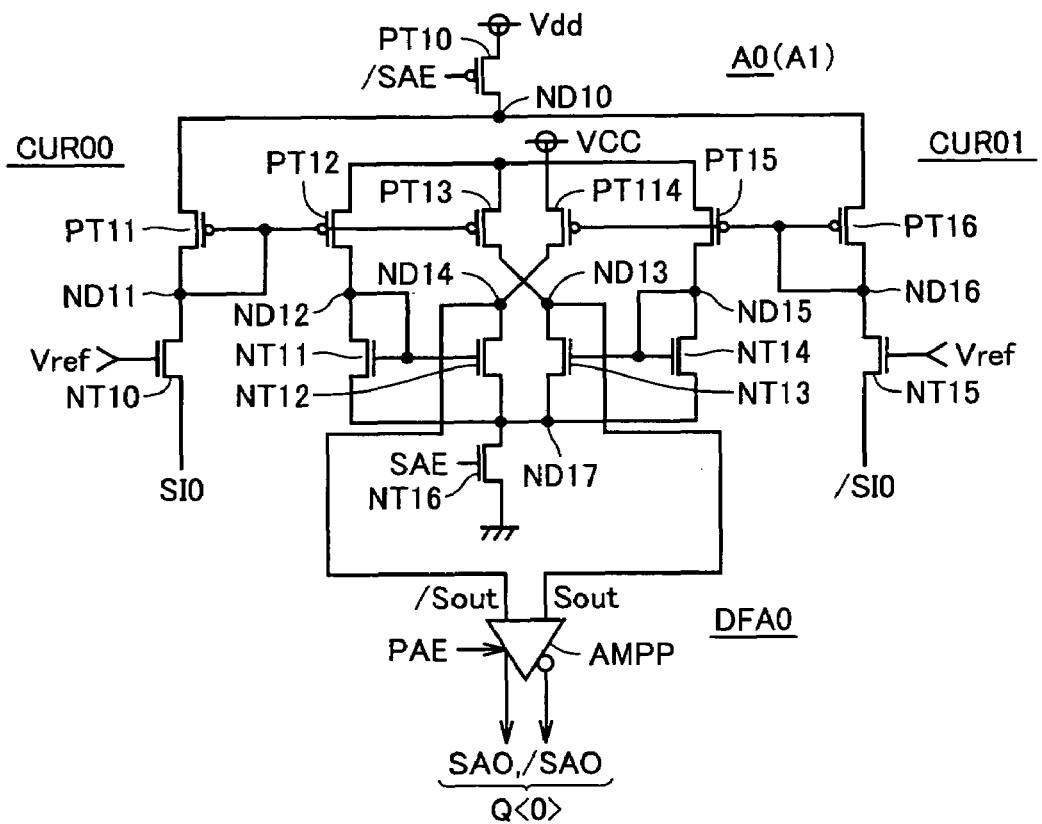
FIG. 15 shows more specifically a construction of the sense amplifier shown in FIG. 14.

FIG. 15 shows an example of constructions of sense amplifiers A0 and A1 shown in FIG. 14. Since sense amplifiers A0 and A1 have the same construction, FIG. 15 representatively shows the construction of sense amplifier A0.

In FIG. 15, sense amplifier A0 includes a P-channel MOS transistor PT10 that is connected between the power supply node and a node ND10 and receives complementary sense amplifier activating signal /SAE on its gate, a P-channel MOS transistor PT11 that is connected between nodes ND10 and ND11 and has a gate connected to node ND11, a P-channel MOS transistor PT12 that is connected between the power supply node and a node ND 10 and has a gate connected to node ND11, a P-channel MOS transistor PT13 that is connected between the power supply node and a node ND13 and has a gate connected to node ND11, a P-channel MOS transistor PT14 that is connected between the power supply node and a node ND14 and has a gate connected to a node ND16, a P-channel MOS transistor PT15 that is connected between the power supply node and a node ND15 and has a gate connected to node ND16, and a P-channel MOS transistor PT16 that is connected between nodes ND10 and ND16 and has a gate connected to node ND16.

When sense amplifier A0 is active, MOS transistors PT11 and PT12 form a current mirror circuit with MOS transistor PT11 being a master, and MOS transistors PT15 and PT16 form a current mirror circuit with MOS transistor PT16 being a master. Therefore, when sense amplifier A0 is active, currents corresponding in magnitude to the currents flowing through MOS transistors PT11 and PT16 flow through MOS transistors PT12 and PT15, respectively.

Sense amplifier A0 further includes an N-channel MOS transistor NT10 that is connected between node ND11 and sense node SI0 and receives a reference voltage Vref on its gate, and an N-channel MOS transistor NT15 that is connected between node ND16 and complementary sense node /SI0 and receives reference voltage Vref on its gate.

This reference voltage Vref defines the voltage levels of sense nodes SI0 and /SI0. The current corresponding to the resistance value of the memory cell connected to sense node SI0 flows through MOS transistors PT11 and NT10, and the current of the memory cell connected to complementary sense node /SI0, or the reference current flows through MOS transistors PT16 and NT15.

Sense amplifier A0 further includes an N-channel MOS transistor NT11 that is connected between nodes ND12 and ND17 and has a gate connected to node ND12, an N-channel MOS transistor NT12 that is connected between nodes ND14 and ND17 and has a gate connected to node ND12, an N-channel MOS transistor NT13 that is connected between nodes ND13 and ND17 and has a gate connected to node ND15, an N-channel MOS transistor NT14 that is connected between nodes ND15 and ND17 and has a gate connected to node ND15 and an N-channel MOS transistor NT16 that is connected between node ND17 and ground node ND and has a gate connected to node ND16.

When sense amplifier A0 is active, MOS transistors NT11 and NT12 form a current mirror circuit, and MOS transistors NT13 and NT14 form a current mirror circuit. When these MOS transistors NT11-NT14 have the same size, MOS transistors NT12 and NT13 pass the current of the same magnitude as the current flowing through MOS transistors NT11 and NT14.

Sense amplifier A0 further includes a differential amplifier circuit (preamplifier) AMPP that is activated in response to a preamplifier activating signal PAE, to differentially amplify sense signals Sout and /Sout on nodes ND13 and ND14 to produce internal read data SAO and /SAO.

These complementary signals SAO and /SAO correspond to internal read data Q<0>. MOS transistors PT12-PT15 and NT11-NT16 as well as preamplifier AMPP correspond to differential amplifier DFA0. MOS transistors PT11 and PT10 correspond to current source CUR00, and MOS transistors PT16 and NT15 correspond to current source CUR01. Sense amplifier A1 shown in FIG. 14 has substantially the same construction as the sense amplifier shown in FIG. 15.

When sense amplifier A0 is inactive, sense amplifier activating signal SAE is at the L level, and complementary sense amplifier activating signal /SAE is at the H level. Sense input nodes SI0 and /SI0 are already precharged by a precharge circuit (not shown) to the ground voltage level. Therefore, nodes ND13 and ND14 are precharged to the level of power supply voltage Vdd, so that initial stage sense outputs Sout and /Sout are at the level of power supply voltage Vdd during the standby state.

When sense amplifier A0 is made active, sense amplifier activating signal /SAE and SAE are driven to the L and H levels, respectively, and MOS transistors PT10 and NT16 are both turned on. Responsively, node ND10 attains the level of power supply voltage Vdd, and node ND17 is driven to the ground voltage level. In the memory cell array, the operation of selecting the memory cells is performed, and sense nodes SI0 and /SI0 are coupled to the bit lines on the selected columns via connection path selecting switch SW0 and the column select gates included in the column select circuit. In the sense operation, the read current is supplied to the bit line in the selected column from sense node SI0 via MOS transistors PT11 and NT10. The upper limit of the current supplied to sense node SI0 is determined by reference voltage Vref applied to the gate of MOS transistor NT10. Likewise, the current is supplied to complementary sense node (reference sense node)/SI0 via MOS transistors PT16 and NT15, and the reference current is driven. MOS transistor NT15 determines the upper limit of this reference current.

When the selected memory cell is in the low-resistance state, the current flowing through sense node SI0 is larger than the current flowing through complementary sense node (reference sense node)/SI0, and the current flowing through MOS transistor PT11 is larger than the current flowing through MOS transistor PT16. Accordingly, the current flowing through MOS transistor PT12 is made larger than the current flowing through MOS transistor PT15. For the sake of simplicity, it is assumed in the following description that P-channel MOS transistors PT11-PT16 have the same size, i.e., the same ratio (W/L) of a channel width W to a channel length L, and N-channel MOS transistors NT11-NT14 also have the same size.

The current flowing through MOS transistor PT12 is supplied to MOS transistor NT14 through node ND12. MOS transistor NT12 can drive the current of the same magnitude as the current driven by MOS transistor NT11. MOS transistor NT13 can likewise drive the current of the same magnitude as the current flowing through MOS transistor NT14. MOS transistors PT12 and PT13 have gates both coupled to node ND11. Therefore, MOS transistor PT13 drives the current of the same magnitude as MOS transistor PT11, and MOS transistor PT14 drives the current of the same magnitude as MOS transistors PT15 and PT16.

As described above, when the selected memory cell is in the low-resistance state, the current flowing through MOS transistor PT13 is larger than the current flowing through MOS transistor PT14. MOS transistor NT12 can drive the larger current than MOS transistor NT13 does, and therefore the potential level of node ND14 rapidly lowers. The potential of node ND13 causes almost no change because the current driven by MOS transistor PT13 is larger than the discharge current of MOS transistor NT13.

When a potential difference between complementary signals Sout and /Sout on nodes ND13 and ND14 is fully developed, preamplifier activating signal PAE is activated, and differential amplifier (preamplifier) AMPP performs the differential amplification to produce internal read data Q<0> (SAO, /SAO).

When the selected memory cell is in the high-resistance state, the current flowing through sense node SI0 becomes smaller than the current flowing through reference sense node /SI0. Conversely to the operation described above, therefore, the potential level of node ND14 becomes lower than that of node ND13, and internal read data Q<0> supplied from preamplifier AMPP takes the logical value opposite to that in the operation of reading the data of the memory cell in the low-resistance state.

Reference voltage Vref is applied to MOS transistors NT10 and NT15, and restricts the current driving powers of these MOS transistors. When the bit line potential of the memory cell in the high-resistance state rises, such a situation may occur that a read current flows into the memory cell, to cause the spin injection due the read current to change the state from the high-resistance state to the low-resistance state. By setting an upper limit in this read current, the rising of the corresponding bit line potential can be restricted even when the memory cell is in the high-resistance state so that it is possible to prevent the change in resistance state of the spin injection element of the memory cell. This avoids such a problem of read disturbance that the read current changes the resistance state of the memory cell to change the storage data.

For reading the multi-bit data in parallel, the read current flows to common source line SL. One of the selected memory cells may have the resistance value made small to drive a large current, e.g., variations in manufacturing parameters. Even in this case, MOS transistor NT10 of the current source of the sense amplifier restricts the upper limit of the drive current. Thus, the rising of the potential of selected source line is suppressed, and it is possible to prevent adverse influences such as reduction in read current of other selected memory cells, so that the problem of impairing the read margin can be avoided.

Figure 16:
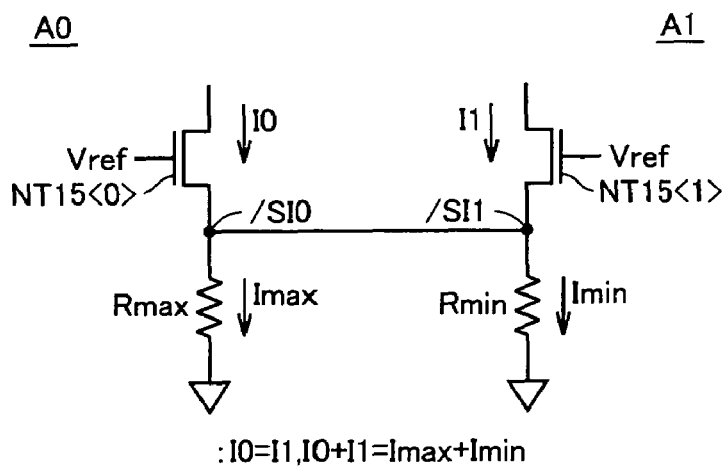
FIG. 16 schematically shows a construction of a reference current generating portion in the connection path selector switch and the sense amplifier shown in FIG. 14.

FIG. 16 schematically illustrates a manner of producing the reference current. In FIG. 16, MOS transistor NT15<0> in sense amplifier A0 supplies a current I0, and MOS transistor NT15<1> in sense amplifier A1 supplies a current I1. MOS transistors NT15<0> and NT15<1> of the current source have the same size and the same current driving characteristics, and sense nodes /SI0 and /SI1 are connected together, so that the operation conditions are the same, and currents I0 and I1 are equal in magnitude to each other. The currents supplied from MOS transistors NT15<0> and NT15<1> flow through the reference cells in the high- and low-resistance states. A current Imax flows to the reference cell having high resistance value Rmax, and a current Imin flows to the reference cell having low resistance value Rmin. Therefore, the following equation holds:

$$I0+I1=I\text{max}+I\text{min}$$

From (I0=I1), a reference current Iref can be expressed by the following equation:

$$Iref=I0=I1=(I\text{max}+I\text{min})/2$$

Therefore, a current of an intermediate value between the currents flowing the respective cells in the high- and low-resistance states can be produced as the reference current, and accurate data reading can be performed.

Figure 17:
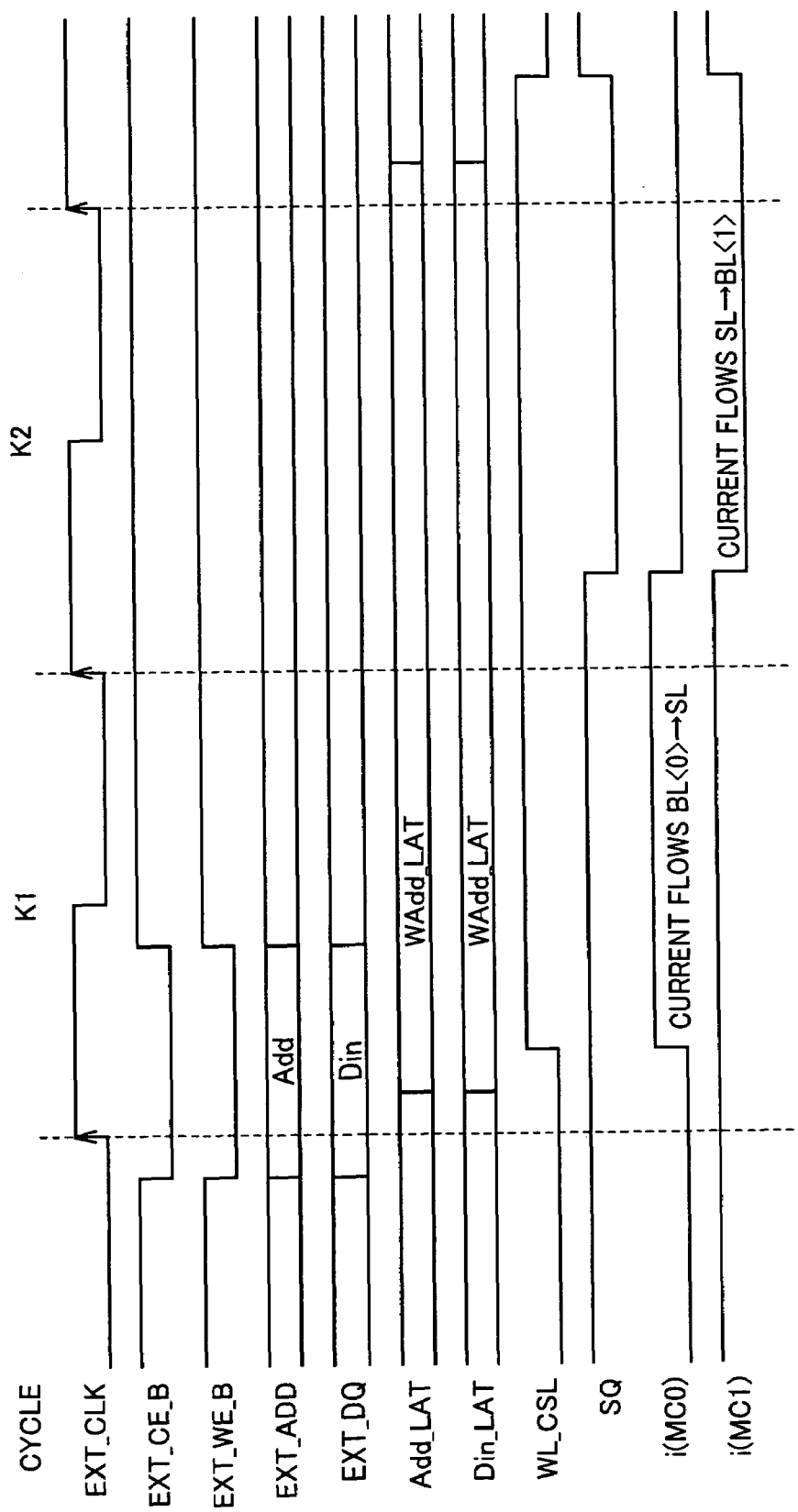
FIG. 17 is a timing diagram representing external and internal signals of the nonvolatile semiconductor memory device according to the first embodiment of the invention.

FIG. 17 is a timing diagram representing a relationship between external and internal signals in the data write operation. This nonvolatile semiconductor memory device is a synchronous memory operating in synchronization with an external clock signal EXT_CLK, and the operation mode is instructed by a combination of the states of an externally applied chip enable signal EXT_CEB and an external write enable signal EXT_WEB at a rising edge of external clock signal EXT_CLK. In synchronization with clock signal EXT_CLK, an external address signal EXT_ADD and external write data EXT_DQ are applied.

In the data write operation, external chip enable signal EXT_CEB and external write enable signal EXT_WEB are set to the L level at the rising edge of external clock signal EXT_CLK in a clock cycle K1. In this state, external address signal EXT_ADD and external data EXT_DQ are internally taken and latched as an address ADD and input data Din so that internal latched address signal WAdd_LAT and internal latched write data WDin_LAT are produced.

According to the latched address signal and latched write data, selection of the memory cell and writing of the data are executed. Thus, word line WL and column select signal CSL are driven to the selected state according to the address signal. In clock cycle K1, source line drive timing signal SQ is at the H level, the source line is held at the L level and, as already shown in FIG. 5, current i(MC0) flows from bit line BL<0> set at the H level to source line SL via memory cell MC0. In memory cell MC1, data of the L level is written so that a current does not flow.

When source line drive timing signal SQ attains the L level in a next clock cycle K2, bit line BL<0> is at the H level so that current i(MC0) does not flow through memory cell MC0. Since L level data is written in memory cell MC1, current i(MC1) flows from source line SL at the H level to bit line BL<1> at the L level.

When clock cycle K2 is completed, the data writing is completed. Therefore, by externally applying commands (EXT_CEB and EXT_WEB) in the one-shot pulse form, 2-bit data can be internally written in two clock cycles.

Figure 18:
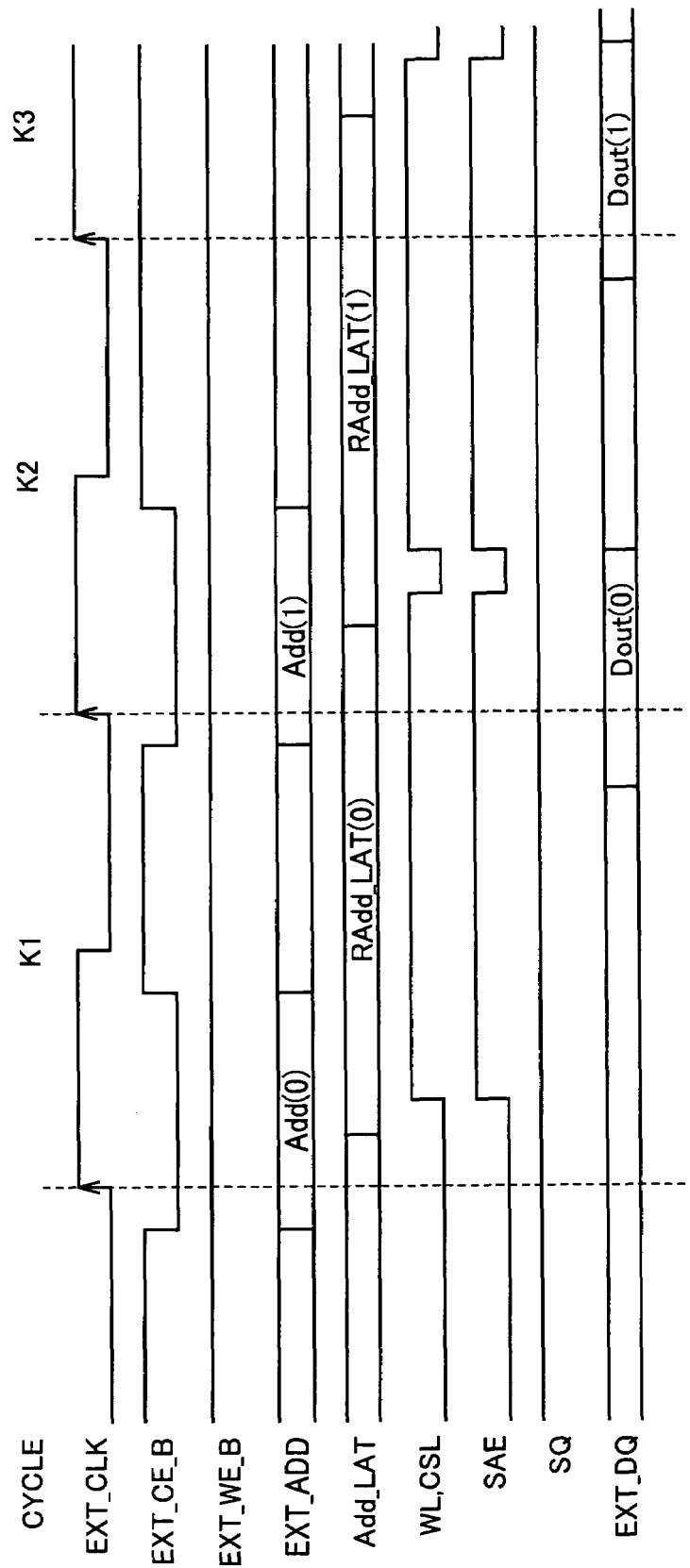
FIG. 18 is a signal waveform diagram representing external and internal signals in a data read operation of the nonvolatile semiconductor memory device in the first embodiment of the invention.

FIG. 18 represents timing relationship of the external signals and the internal signals in the data read operation. In the data read operation, as shown in FIG. 18, a read command instructing the data reading is applied at the rising edge of external clock signal EXT_CLK. This read command is applied by setting external chip enable signal EXT_CEB to the L level at the rising edge of external clock signal EXT_CLK, and setting external write enable signal EXT_WEB to the H level.

In response to this read command, an internal address signal Add(0) is produced from external address signal EXT_ADD in clock cycle K1, and then is latched so that a latched address signal RAdd_LAT(0) is produced. The operation of selecting the memory cell is performed according to latched address signal RAdd_LAT(0), and word line WL and column select line CSL on the addressed row and column are driven to the selected state. Also, sense amplifier activating signal SAE becomes active. Source line drive timing signal SQ keeps the H level.

The operation of reading the memory cell data is internally performed, and read data Dout(0) is output during a time period between a last period of clock cycle K1 and an earlier period of clock cycle K2.

When the read command is applied again in clock cycle K2, latched address signal RAdd_LAT(1) is produced according to address signal Add(1). This read command in clock cycle K2 resets the memory cell select operation, and word line WL and column select signal CSL are driven to the inactive state. Also, sense amplifier activating signal SAE is driven to the inactive state, and the internal of the memory device is once driven to the reset state. Thereafter, the memory cell select operation is resumed according to latched address signal RAdd$_{13}$ LAT(1), and sense amplifier activating signal SAE becomes active to perform the data reading. In response to the read command in clock cycle K2, data Dout (1) is output during a period between a last period of clock cycle K2 and an earlier period of a clock cycle K3.

An external device samples external data Dout(0) and Dout (1) at the rising edge of clock signal EXT_CLK, and accordingly the reading and transferring of the data can be executed in synchronization with clock signal EXT_CLK.

The data read operation can be performed in one clock cycle of external clock signal EXT_CLK. Thus, both the writing and reading can be performed fast.

When the write command is applied, the word line and the column select line are driven to the selected state for a time period of two clock cycles. When the read command is applied, the word line and the column select line are driven to the selected state for a time period of one clock cycle. This can be achieved by employing a construction, in which the row and column decoders are once driven to the reset state when each command is applied, or a construction in which activation/deactivation of the decoders are controlled using an address transition detecting signal (ATD) for the latched address signal.

Fro the construction of producing source line drive timing signal SQ, a following may be employed. In the case of using the clock signal, when the write command is applied, source line drive timing signal SQ is driven to the L level in response to the rising of external clock signal EXT_CLK while internal write enable signal ZWE is active. This source line drive timing signal SQ is then driven to the H level in response to deactivation of internal write enable signal ZWE when the data writing according to the write command is completed. Alternatively, the following construction may be employed. Internal write enable signal ZWE is delayed by one clock cycle period according to the internal clock signal corresponding to external clock signal EXT_CLK, to activate source line activating signal SLE shown in FIG. 10, after elapsing of one clock cycle, source line activating signal SLE is set to the inactive state.

For the address signals, such a construction may be employed that the address buffer is enabled to produce the internal address signal according to the chip enable signal, and is set to the latching state after producing the internal address signal when each command is applied. It is possible to use the construction which has been employed in a general clock-synchronous semiconductor memory device (SDRAM (Synchronous Dynamic Random Access Memory)) and the like.

[Modification]

Figure 19:
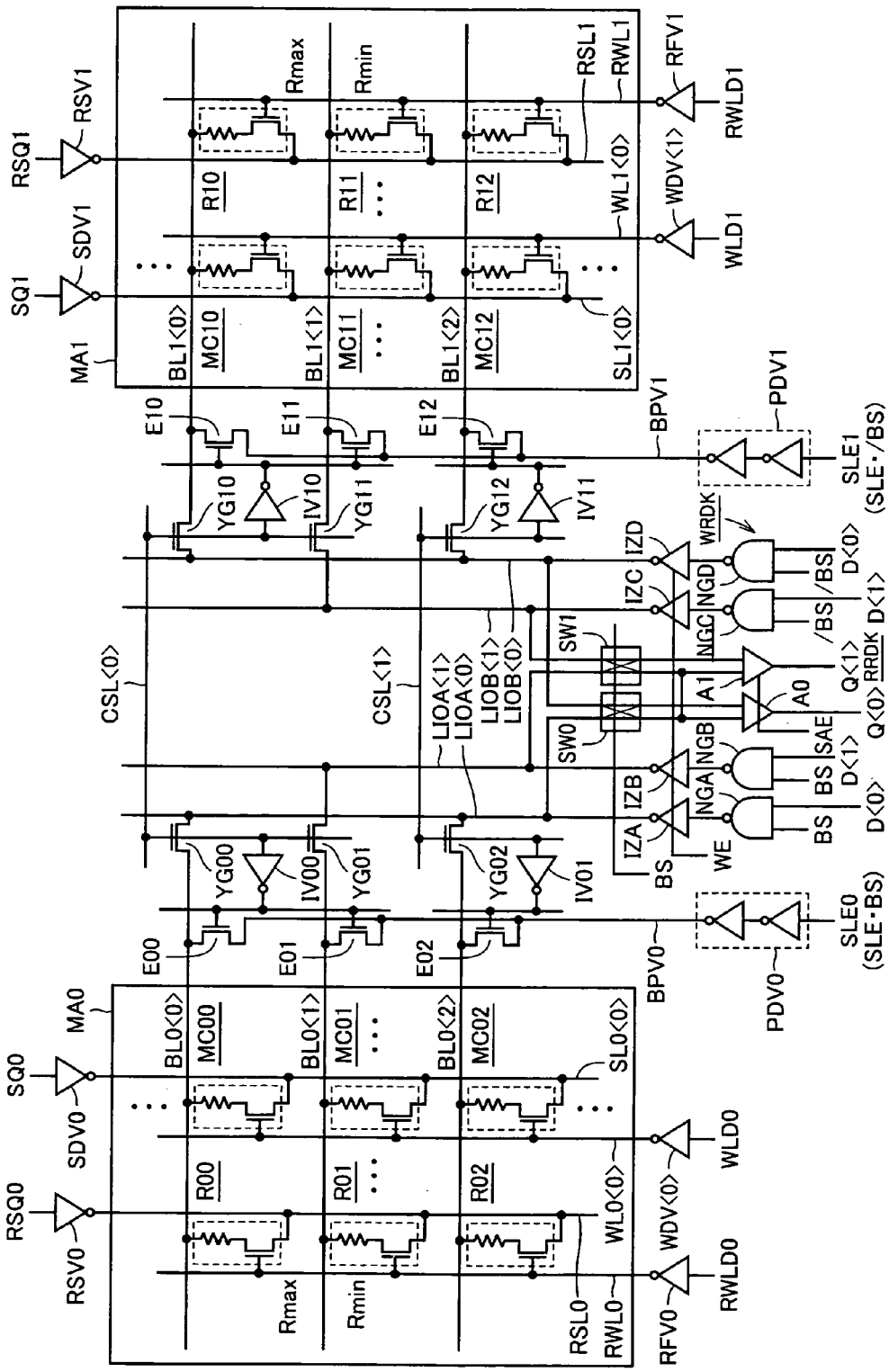
FIG. 19 shows a construction of the nonvolatile semiconductor memory device according to a modification of the first embodiment of the invention.

FIG. 19 schematically shows a construction of a main portion of a nonvolatile semiconductor memory device according to a first embodiment of the invention. The construction shown in FIG. 19 differs in the following points from the construction shown in FIG. 12. The bit line precharge transistor is supplied with the corresponding column select signal via an inverter. Thus, in memory array MA0, bit line precharge transistors E00 and E01 for bit lines BL0<0> and BL0<1> receive, on their gates, column select signal CSL<0> via an inverter IV00, and bit line precharge transistor E02 arranged for bit line BL0<2> receives column select signal CSL<1> via an inverter IV01. Likewise, in memory array MA1, bit line precharge transistors E10 and E11 arranged for bit lines BL1<0> and BL1<1> receive column select signal CSL<0> via an inverter IV10, and bit line precharge transistor E12 provided for bit line BL1<2> receives column select signal CSL<1>.

Bit line precharge transistors E00, E01 and E02 are supplied with a bit line precharge voltage BPV0 via a precharge driver PDV0 receiving an array source line activating signal SLE0. Likewise, bit line precharge transistors E10, E11 and E12 are supplied with a bit line precharge voltage BPV1 depending on an array source line activating signal SLE1 via a precharge driver PDV1. These array source line activating signals SLE0 and SLE1 are produced by performing logical AND between source line activating signal SLE and respective block select signals BS and /BS.

Other constructions of the nonvolatile semiconductor memory device shown in FIG. 19 are the same as those shown in FIG. 12. The same portions are allotted with the same reference numbers, and description thereof will not be repeated.

In the construction shown in FIG. 19, the bit line precharge transistor for the unselected bit line is kept conductive according to the output signal of the inverter. For example, when column select signal CSL<0> is in the selected state, column select signal CSL<1> is in the unselected state, and inverters IV01 and IV11 turn on bit line precharge transistors E02 and E12, so that bit lines BL0<2> and BL1<2> are supplied with bit line precharge voltage BPV from corresponding bit line precharge drivers PDV0 and PDV1, respectively.

Source line activating signal SLE has a logical level complementary to source line drive timing signal SQ (SQ0 and SQ1). Therefore, when the data writing is performed in memory array MA0, array source line activating signal SLE0 changes in the same phase as the voltage on source line SL, and unselected bit line BL0<2> attains the same voltage level as source line SL<0> (in the case where the column select signal is boosted). In unselected memory array MA1, block select signal /BS is at the L level, array source line activating signal SLE1 is at the L level and bit line precharge voltage BPV1 is at the ground voltage level. Therefore, the unselected bit line is fixed at the ground voltage level, and bit lines BL0<1> and BL1<1> in the selected column are kept at the ground voltage level by common data lines LIOB<1> and LIOB<0>.

During the data write operation, each unselected bit line in the selected memory array is set to the same voltage level as the source line so that it is possible to prevent the current from flowing through the unselected memory cell when the source line is set to the H level, and the disturbance of the unselected memory cell in the data writing can be avoided.

Bit line precharge voltages BPV0 and BPV1 are merely required to be at the level of power supply voltage Vdd (or (Vdd−Vth) when a loss due to a threshold voltage Vth of the access transistor or column select gate is caused). When the voltage level of the word line or column select line is not boosted, the voltage level of the unselected bit line is held at the level of power supply voltage Vdd less Vth. It is merely required that the H levels of voltages BPV0 and BPV1 are set to the level of power supply voltage Vdd.

In the data read operation, source line activating signal SLE is at the L-level so that bit line precharge voltages BPV0 and BPV1 keep the ground voltage level, and the unselected bit line keeps the ground voltage level. Thereby, it is possible to prevent the rising up of the potential of the unselected bit line, and such a problem can be suppressed that a current flows through the source line via the unselected memory cell and adversely affects the read current of the selected memory cell. Thus, the accurate data reading can be performed.

In the construction of the modification shown in FIG. 19, the multi-bit data such as four bits or eight bits may be written and read.

According to the first embodiment of the invention, as described above, when the write instruction is applied in the data write operation, the source line voltage is changed in the predetermined sequence while internally keeping the bit line potential at the potential level corresponding to the write data. Even when the source lines are arranged extending in the row direction and are each connected to a plurality of selected memory cells, the multi-bit data can be stably written in parallel, and the fast writing can be achieved.

Second Embodiment

Figure 20:
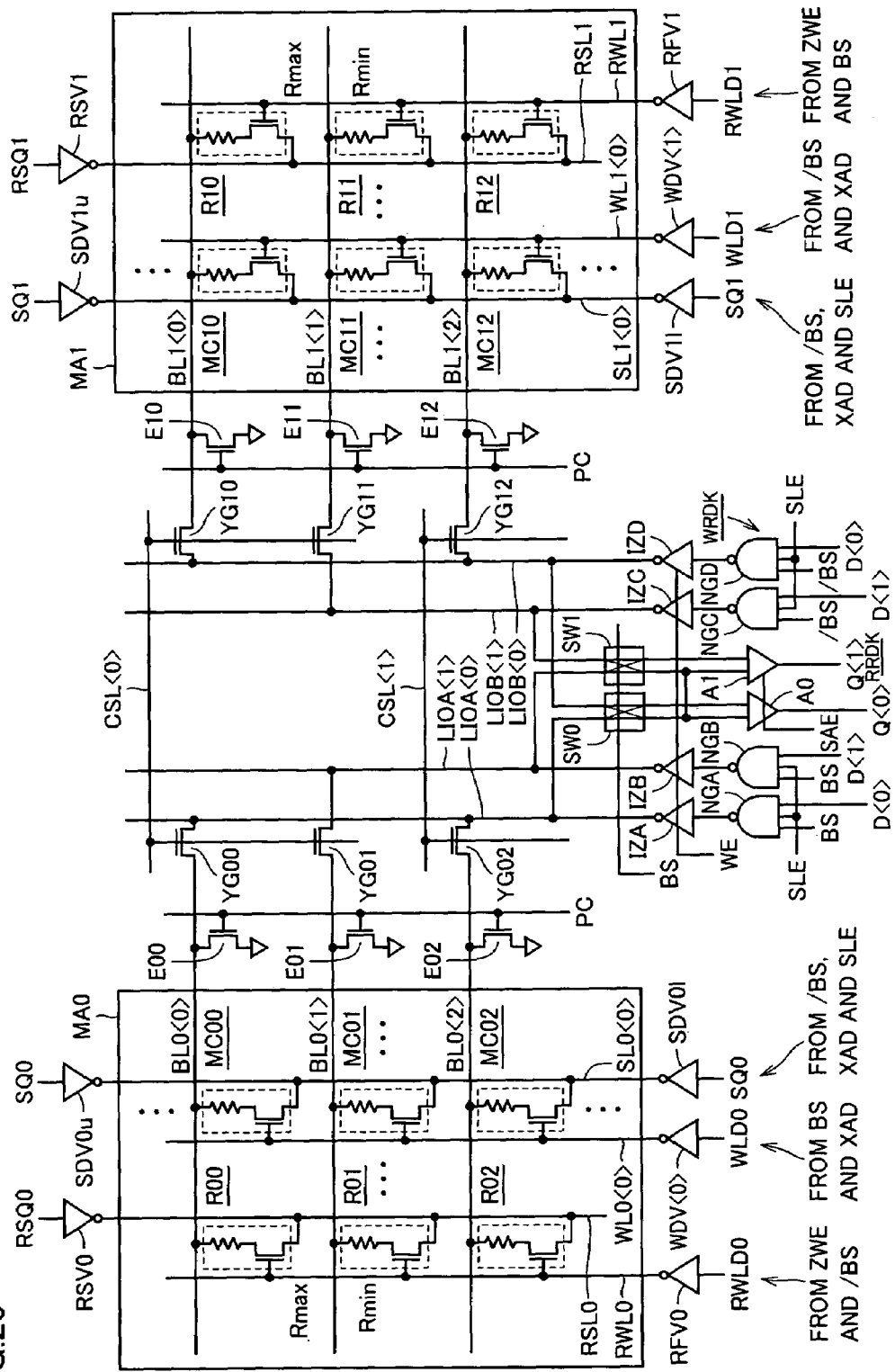
FIG. 20 shows a construction of a nonvolatile semiconductor memory device according to a second embodiment of the invention.

FIG. 20 schematically shows a construction of a main portion of the nonvolatile semiconductor memory device according to a second embodiment of the invention. The nonvolatile semiconductor memory device shown in FIG. 20 differs in the following points from the nonvolatile semiconductor memory device shown in FIG. 12. Specifically, in write drive circuit WRD, NAND gates NGA-NGD are further supplied with source line activating signal SLE. Source line drivers SDV are arranged on the opposite sides of each of source lines SL (SL0<0> and SL1<0>). Specifically, for memory array MA0, there are provided source line drivers SDV01 and SDV0$u$ arranged on the opposite sides of source line SL0<0>, respectively, and for memory array MA1, there are provided source line drivers SDV11 and SDV1$u$ arranged on the opposite sides of source line SL1<1>, respectively. Other constructions of the nonvolatile semiconductor memory device shown in FIG. 20 are the same as those of the nonvolatile semiconductor memory device shown in FIG. 12. The corresponding portions are allotted with the same reference characters, and description thereof will not be repeated.

In the write cycle, source line activating signal SLE rises from the L level to the H level as shown in FIG. 11 (this rising is triggered by the rising of the clock signal in the case of the clock-synchronous memory). Similarly to the case of the first embodiment, reference word line decode signals RWLD0 and RWLD1 are produced based on block select signals /BS and BS in the data read operation. A word line decode signal WLD0 is produced based on block select signal BS and row address signal XAD, and a word line decode signal WLD1 is produced based on block select signal /BS and row address signal XAD.

Source line activation timing signal SQ0 is produced based on block select signal BS, row address signal XAD and source line activating signal SLE. Source line activation timing signal SQ1 is produced based on block select signal /BS, row address signal XAD and source line activating signal SLE.

Figure 21:
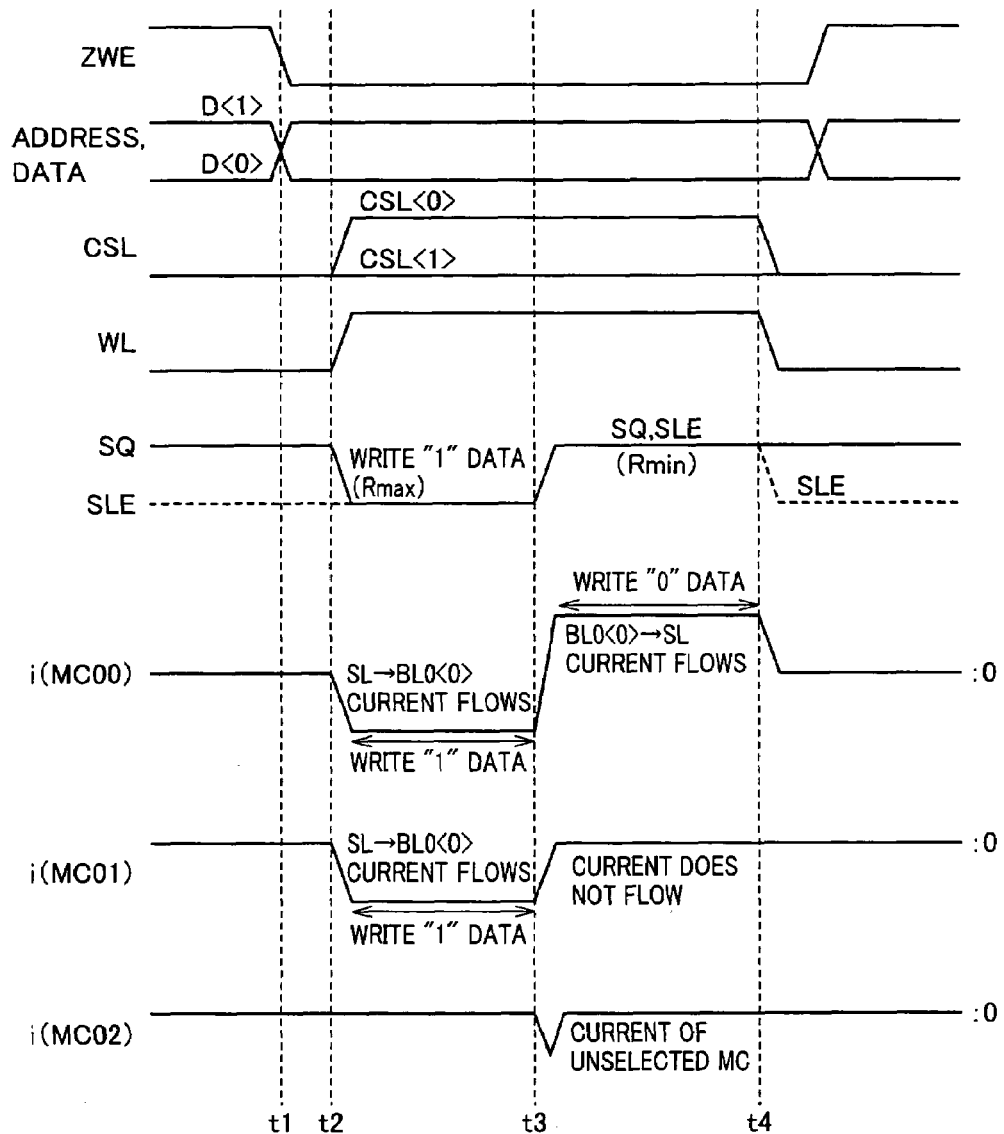
FIG. 21 is a timing chart representing operations for data writing of the nonvolatile semiconductor memory device shown in FIG. 20.

FIG. 21 is a timing diagram illustrating an operation of the nonvolatile semiconductor memory device shown in FIG. 20. Referring to FIG. 21, description will now be given on the operation of the nonvolatile semiconductor memory device shown in FIG. 20. It is now assumed that column select signal CSL<0> is selected, and bit line BL0<0> is selected in memory array MA0.

At time t1, write enable signal ZWE attains the low and active state according to the write command, and the address and data are externally taken in. FIG. 21 represents operation waveforms in the case when the data is written onto bit lines BL0<0> and BL0<1> according to data D<0> of "0" and data D<1> of "1".

At time t2, the operations of selecting the word line and column selection line are performed according to the externally applied address signal, and selected word line WL (WL0<0>) is driven to the selected state, and column select signal CSL<0> is driven to the selected state. Responsively, column select gates YG00 and YG01 are turned on, and bit lines BL0<0> and BL0<1> are connected to common data lines LIOA<0> and LIOA<1>, respectively. Precharge instructing signal PC is already inactive, and the bit lines are in the electrically floating state at the ground voltage level.

Source line activating signal SLE is at the L level, and the output signals of NAND gates NGA-NGD of the write drive circuit are at the H level. Therefore, both common data lines LIOA<0> and LIOA<1> are at the L level, and bit line BL0<0> is fixed at the L level.

At time t2, source line drive timing signal SQ falls to the L level, and source line drivers SDV01 and SDV0$u$ drive source line SL0<0> to the H level. Thereby, currents i(MC00) and i(MC01) flow from source line SL0<0> to bit lines BL0<0> and BL0<1> via memory cells MC00 and MC01, respectively, and the memory cell selected as the write target is set to the resistance state, e.g., of high-resistance value Rmax so that data "1" (L level) is written.

At time t3, source line activating signal SLE is raised to the H level while holding word line WL and column select signal CSL<0> in the selected state, and source line drive timing signal SQ is raised to the H level. Thereby, NAND gates NGA and NGB in the write drive circuit operate as inverter buffers to set common data lines LIOA<0> and LIOA<1> to the voltage levels corresponding to write data D<0> and D<1>, respectively. Further, source line drivers SDV01 and SDV0$u$ set source line SL0<0> to the L level. Therefore, the currents selectively flow from the bit lines to the source lines according to the logical levels of write data D<0> and D<1>. In FIG. 21, write data bit D<0> is data "0" at the H level, and data D<1> is data "1" at the L level. Bit line BL0<0> is set to the voltage level at the H level, and bit line BL0<1> is set to the voltage level at the L level. Therefore, current i(MC00) flows from bit line BL0<0> to source line SL0<0>, and the resistance value for this memory cell MC00 changes in an opposite direction to that in the previous resistance changing state and, for example, changes to the resistance state of low-resistance value Rmin, so that data "0" is written. However, bit line BL0<1> and source line SL0<0> are at the same potential, and current i(MC01) does not flow, so that memory cell MC01 maintains the high-resistance state, and is set to the state (high-resistance state) of storing data "1".

In the data write cycle, therefore, the resistance states of all the memory cells of the write targets are once changed in the same direction, and then the resistance values are adjusted corresponding to the write data bits, so that the data can be written into a plurality of memory cells in the same write cycle even when the source line is shared by the plurality of selected memory cells.

At time t4, the data write cycle is completed, word line WL returns the unselected state and column select signal CSL<0> is driven to the unselected state. Thereby, source line activating signal SLE is held at the inactive state, source line drive timing signal SQ is held at the H level and source line SL0<0> is held at the L level.

For writing the resistance value of the memory cell of the write target in a same direction during a time period between times t2 and t3, the memory cell current flows from source line SL to the plurality of bit lines in parallel, and a large current is required. Accordingly, the direction of changing of the resistance state is set such that the resistance state changes to the high-resistance state of high resistance value Rmax at the time of completion of the initial write operation. In this case, the flow of current is suppressed in the memory cell which has already changed to the high-resistance state as a result of the writing. Therefore, it is possible to supply further current to the cell of slow in writing (the memory cell having a slow transition rate to the high-resistance state), and the resistance state of the memory cell of the write target can be rapidly set to the state having high-resistance value Rmax, so that fast writing is achieved.

Since source line drivers SDViu and SDVi1 (i=0.1) arranged on the opposite sides of source line SL drive source line SL, the source line potential can be changed rapidly, and the parasitic resistance of source line SL can be equivalently reduced to suppress the voltage distribution on the source line, so that the accurate reading can be performed. In the data read operation, therefore, even when the memory cell current flows to the source line via the plurality of memory cells, the rising up of the source line potential can be suppressed, and the accurate reading can be achieved.

Figure 22:
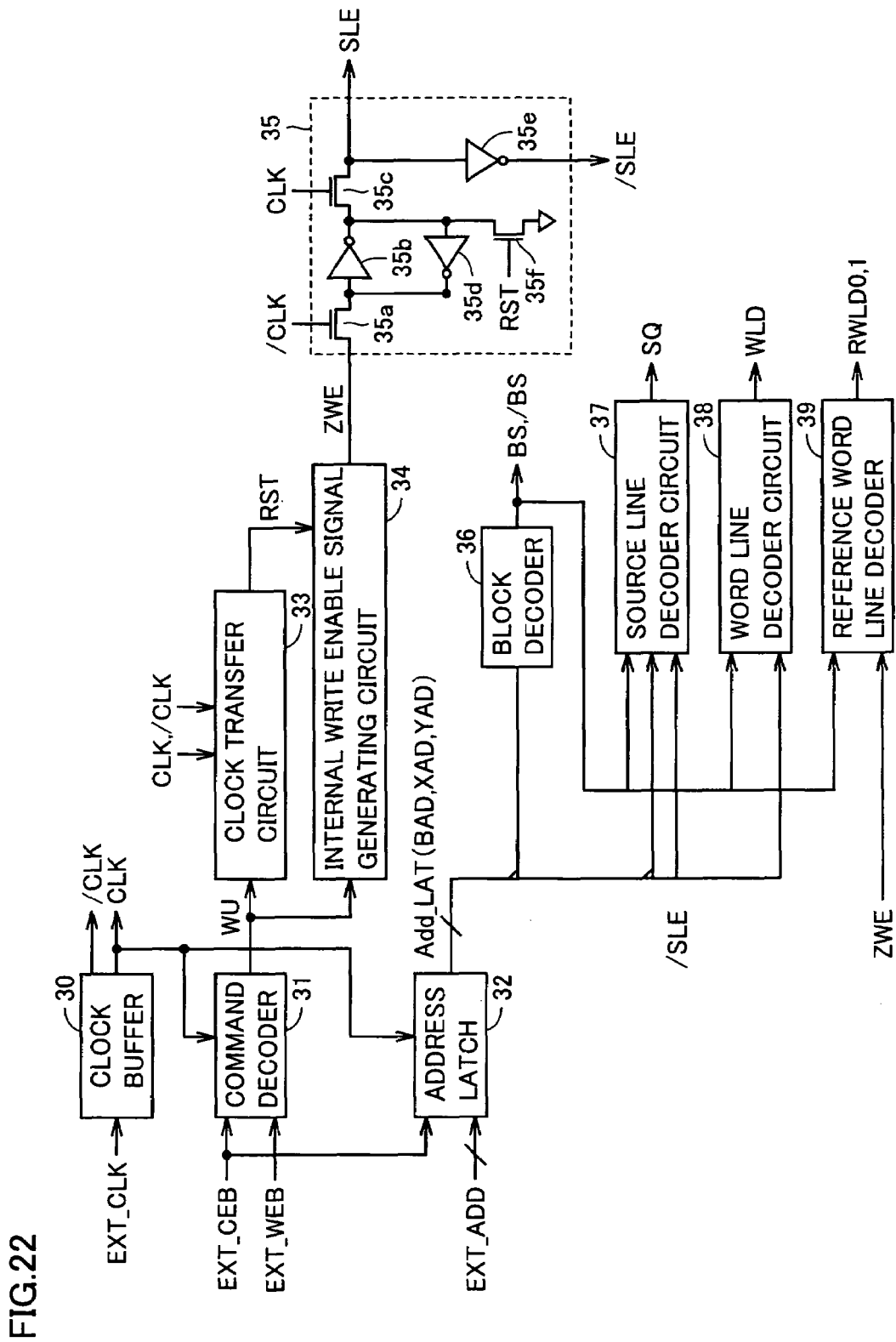
FIG. 22 schematically shows an example of a construction for generating control signals shown in FIG. 20.

FIG. 22 shows an example of a construction of a portion for generating various control signals in the second embodiment of the invention. FIG. 22 shows, by way of example, the construction of the nonvolatile semiconductor memory device that is a synchronous memory operating in synchronization with external clock signal EXT_CLK.

In FIG. 22, peripheral control signal generating circuitry includes a clock buffer 30 that buffers external clock signal EXT_CLK to produce complementary internal clock signals CLK and /CLK, a command decoder 31 that receives externally applied control signals EXT_CEB and EXT_WEB and determines if the write command is supplied, e.g., at the rising edge of internal clock signal CLK, an address latch 32 that takes in the address signal in synchronization with clock signal CLK according to externally applied chip enable signal EXT_CEB and externally applied address signal EXT_ADD, a 2-clock transfer circuit 33 that transfers a write instructing signal WU received from command decoder 31 for a two-clock cycle period in synchronization with complementary clock signals CLK and /CLK, an internal write enable signal generating circuit 34 that is activated in response to activation of write instructing signal WU applied from command decoder 31, and is deactivated in response to activation of a reset signal RST applied from 2-clock transfer circuit 33, and a delay circuit 35 that produces source line activating signal SLE by delaying write enable signal ZWE applied from internal write enable signal generating circuit 34 by one clock cycle.

Delay circuit 35 includes a transfer gate 35a for transferring write enable signal ZWE according to complementary clock signal /CLK, an inverter 35b for inverting the signal that is transferred via transfer gate 35a, a transfer gate 35c that is turned on when clock signal CLK is at the H level, to transmit the output signal of inverter 35b to produce source line activating signal SLE, an inverter 35d forming an inverter latch with inverter 35b, an inverter 35e that inverts source line activating signal SLE to produce a complementary source line activating signal /SLE, and a reset transistor 35f for resetting the output of inverter 35b to the ground voltage level according to reset signal RST applied from 2-clock transfer circuit 33.

Delay circuit 35 takes in write enable signal ZWE when clock signal /CLK is at the H level, and inverts and outputs the write enable signal thus taken when clock signal CLK is at the H level.

The peripheral control signal generating circuitry further includes a block decoder 36 that decodes a block address BAD included in latched address Add_LAT applied from address latch 32 to produce block select signals BS and IBS, a source line decoder circuit 37 that produces source line drive timing signal SQ according to block select signals BS and /BS, row address signal XAD included in latched address Add_LAT and complementary source line activating signal /SLE, a word line decoder circuit 38 that produces word line decode signal WLD according to block select signals BS and /BS as well as row address signal XAD included in latched address Add_LAT, and a reference word line decoder 39 that produces a reference word line decode signals RWL0,1 according to block select signals BS and /BS as well as write enable signal ZWE.

Source line decoder circuit 37 and word line decoder circuit 38 are each an NAND type decoder, and produce signals that attain the L level when selected. Source line decoder circuit 37 is enabled to perform the decode operation when source line activating signal /SLE is at the H level, to produce source line drive timing signal SQ. In the write cycle and read cycle, word line decoder circuit 38 decodes the word line address (XAD) to produce word line decode signal WLD. These source line activation timing, source line drive timing signal SQ and word line decode signal WLD become active only for the memory array designated by block select signals BS and /BS. When write enable signal ZWE is inactive and the memory device is in the data read mode, reference word line decoder 39 drives reference source line decode signals WRLD0,1 for the unselected memory array to the selected state according to block select signals BS and /BS.

Figure 23:
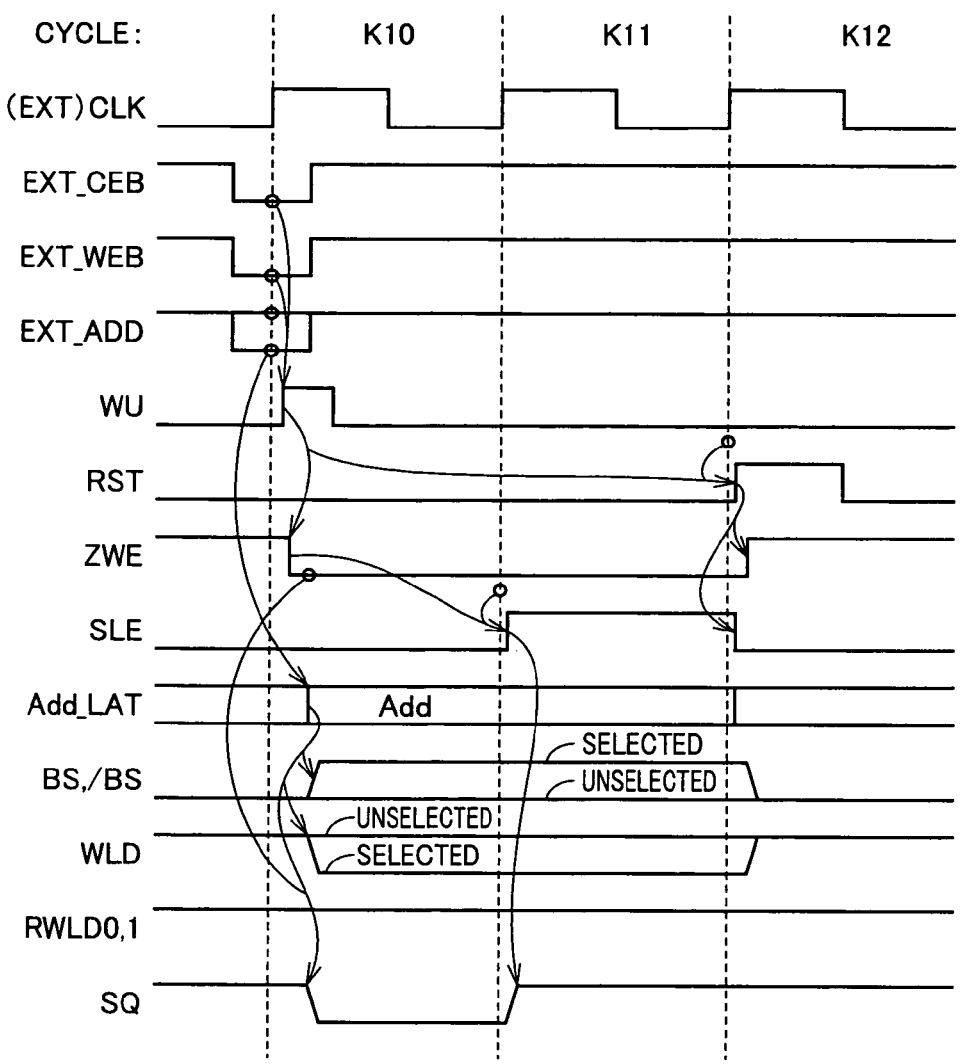
FIG. 23 is a timing chart representing an operation of a control signal generating portion (precharge circuit) shown in FIG. 22.

FIG. 23 is a timing chart representing an operation of the peripheral circuitry shown in FIG. 22. Referring to FIG. 23, the operation of the peripheral circuit in the data write operation will now be described. In a clock cycle K1, a write command instructing the data writing is applied, externally applied chip enable signal EXT_CEB and externally applied write enable signal EXT_WEB are set to the L level and address signal EXT_ADD is externally applied. Command decoder 31 performs the decoding operation according to the write command and clock signal CLK applied from clock buffer 30, and produces write instructing signal WU in the form of one-shot pulse. According to write instructing signal WU, internal write enable signal generating circuit 34 attains the set state, and write enable signal ZWE falls to the L level. Meanwhile, 2-clock transfer circuit 33 internally takes in write instructing signal WU during a period of the H level of clock signal CLK, and performs the transfer operation according to clock signals CLK and /CLK.

At the rising edge of clock signal CLK, address latch 32 latches the address applied according to externally applied chip enable signal EXT_CEB, and internally produces latched address signal Add_LAT.

According to latched address signal Add_LAT, block decoder 36 produces block select signals BS and /BS to designate one of the memory arrays. Concurrently, word line decoder 38 performs the decoding operation and drives word line decode signal WLD corresponding to a selected row to the selected state.

Transfer circuit 35 transfers the output signal of inverter 35b at the rising edge of clock signal CLK. At this time, since clock signal /CLK is at the L level, transfer gate 35a is off, the internal state of the transfer circuit 35 is in the reset state established by reset transistor 35f, and source line activating signal SLE is at the L level. Complementary source line activating signal /SLE applied from inverter 35e is at the H level, and source line decoder circuit 37 performs the decoding operation to drive source line drive timing signal SQ for the selected row to the L level of the selected state.

When clock signal CLK falls to the L level at clock cycle K10, transfer gate 35a is turned on to take in write enable signal ZWE at the L level into transfer circuit 35, and the output signal of inverter 35b attains the H level. In this state, clock signal CLK is at the L level, and transfer gate 35c is off, so that source line activating signal SLE is at the L level during this clock cycle K10.

In a clock cycle K11, when clock signal CLK rises to the H level, transfer gate 35c is made conductive, and transfer circuit 35 drives source line activating signal SLE to the H level according to the output signal of inverter 35b. In 2-clock transfer circuit 33, the transfer operation is internally performed, and reset signal RST is in the inactive state. When source line activating signal SLE attains the H level, complementary source line activating signal /SLE attains the L level so that source line decode circuit 37 becomes inactive, and source line drive timing signal SQ is driven to the H level of the unselected state.

In a clock cycle K12, when clock signal CLK rises to the H level, 2-clock transfer circuit 33 completes the operation of transferring write instructing signal WU, and reset signal RST rises to the H level. Responsively, internal write enable signal generating circuit 34 is reset, and write enable signal ZWE attains the inactive state at the H level. According to reset signal RST, reset transistor 35f in transfer circuit 35 is turned on, and the output signal of inverter 35b is reset to the L level. In this operation, transfer gate 35c is in conductive state in accordance with clock signal CLK, source line activating signal SLE attains the L level, and complementary source line activating signal /SLE is driven to the H level.

Word line decoder circuit 38 and reference word line decoder circuit 39 become inactive, and word line decode signal WLD is driven to the unselected state. For activating and deactivating source line decoder circuit 37 and word line decoder circuit 38, such a construction may be employed that, in the data write and read operations, a logical ORed signal of internal write enable signal ZWE and the internal read enable signal is used for resetting these source and word line decode circuits 37 and 38.

Alternatively, source line decode circuit 37, word line decoder circuit 38 and reference word line decoder circuit 39 may be reset according to the address transition detection signal (ATD) indicating transition of latched address signal Add_LAT of address latch 32.

By using the peripheral control signal generating circuitry shown in FIG. 22, the operating as follows can be achieved. In the data write cycle, the internal common data line is set to the L level regardless of the logical value of the write data bit. Thereafter, the source line is driven to the H level to cause the current to flow from the source line to the bit line for the memory cells of the write target, to set the selected memory cells into the high-resistance state. Subsequently, the source line is driven to the unselected state to cause the current to flow selectively via the memory cells from the bit lines to the source line according to the write data.

In the above description, the memory cell is driven to the high-resistance state in the initial write operation during the write cycle. However, the write cycle may be reversed Specifically, the memory cell of the write target may be kept in the low-resistance state during a first half period in the write cycle, and then the memory cell may be changed from the low-resistance state to the high-resistance state according to the write data in the second half period.

In the data read operation, write enable signal ZWE is inactive at the H level, and source line activating signal SLE is inactive at the L level. Therefore, complementary source line activating signal /SLE is at the H level, source line decode circuit 37 is inactive and source line drive timing signal SQ is fixed at the L level. Word line decoder circuit 38 performs the decode operation according to the applied row address signal (XAD), and reference word line decoder circuit 39 likewise performs the decoding operation. Thus, the reference word line in the unselected memory array is driven to the selected state according to the block select signal.

A column address signal YAD included in latched address Add_LAT from address latch 32 is applied to the column decoder included in the column select circuit (not shown), and the column select signal is produced.

In the construction of the memory array shown in FIG. 20, the unselected bit line is set to the floating state at the ground voltage level. As described in the modification of the first embodiment, however, the unselected bit line may be kept at the same voltage level as the source line in the selected row. This can be readily achieved merely by applying the construction of the first modification to the construction shown in FIG. 20.

According to the second embodiment of the invention, as described above, the writing in the memory cell is performed by setting the memory cell of the write target to the predetermined resistance state and then selectively passing the current through the memory cell depending on the write data. Similarly to the first embodiment, therefore, the data can be written in parallel into the memory cells sharing the source line within one write cycle, and the fast writing is achieved.

Third Embodiment

Figure 24:
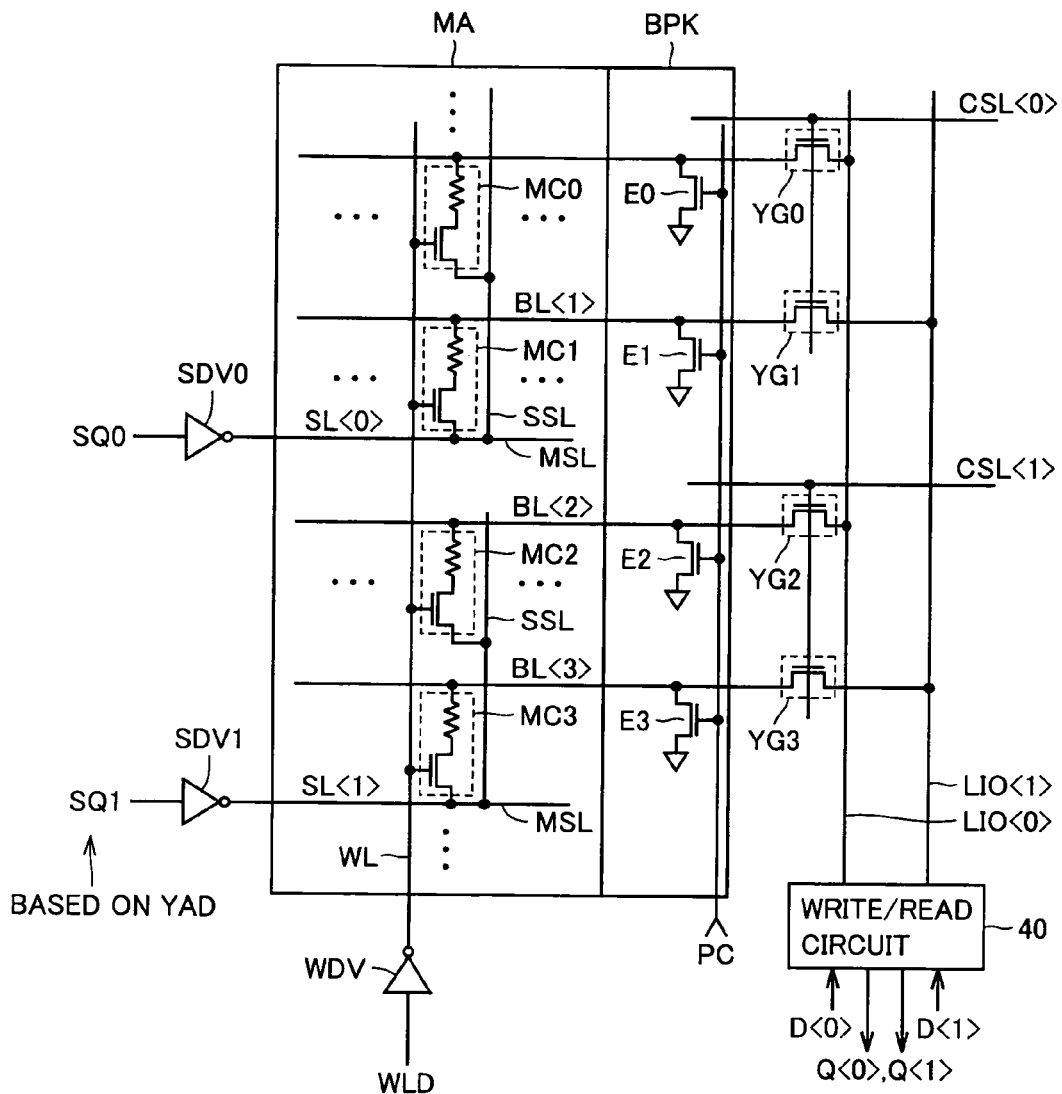
FIG. 24 schematically shows a construction of an array of a nonvolatile semiconductor memory device according to a third embodiment of the invention.

FIG. 24 schematically shows a construction of a main portion of a nonvolatile semiconductor memory device according to a third embodiment of the invention. FIG. 24 shows a construction for writing and reading the data for one memory array MA.

The construction shown in FIG. 24 differs from the construction of the memory array shown in FIG. 4 in the following points. Source line drivers SDV0 and SDV1 are aligned to each other in a word line extending direction. Each source line is arranged corresponding to the bit lines in two columns equal in number to the bit width of write/read unit of the data. In FIG. 24, source lines SL<0> and SL<1> are arranged. Each of source lines SL<0> and SL<1> includes a main line portion MSL arranged parallel to bit line BL in the column direction (bit line extending direction), and feeder line portions SSL each arranged for the columns equal in number to the bit width of read/write data and parallel to word line WL and connected to main line portion MSL.

The feeder line portions SSL are each arranged for the word lines or for the memory cell rows. When source line SL<0> is selected, therefore, the source potentials of the access transistors of memory cells MC0 and MC1 are set according to main line portion MSL and feeder line portion SSL. Likewise, when source line SL<1> is selected, the source potentials of the access transistors of memory cells MC2 and MC3 are set by the main line portion MSL and feeder line portion SSL.

Source line drive timing signals SQ0 and SQ1, applied to source line drivers SDV0 and SDV1 selecting source lines SL<0> and SL<1>, respectively, are produced similarly to column select signal CSL according to the column address signal (YAD) instead of the row address signal in the first and second embodiments. The timing control is performs similarly to the first and second embodiments, and the row and column address signals are applied in parallel in the nonvolatile semiconductor memory device.

Referring further to FIG. 24, common data lines LIO<1> and LIO<0> are coupled to a write/read circuit 40. Write/read circuit 40 includes write drive circuit WRD and sense amplifiers A0 and A1, and drives common data lines LIO<1> and LIO<0> according to write data D<0> and D<1>, as already described in the first and second embodiments. Also, in the read operation, 2-bit read data Q<0> and Q<1> are produced according to the currents flowing on common data lines LIO<0> and LIO<1>.

Other constructions of the nonvolatile semiconductor memory device shown in FIG. 24 are the same as those of the memory device shown in FIG. 4. The corresponding portions are allotted with the same reference characters, and description thereof will not be repeated.

In the construction shown in FIG. 24, main line portion MSL of the source line is arranged for the plurality of bit lines, and the layout area of the memory cells can be smaller than that in the case where the source line is arranged for each bit line.

The source line of the unselected memory cell is isolated from the source line of the selected memory cell, and the disturbance during the writing and reading can be suppressed. For example, when source line SL<0> is selected, the source potentials only for memory cells MC0 and MC1 change, and the source potentials for memory cells MC2 and MC3 are kept in the unselected state. Therefore, the current flowing through memory cells MC0 and MC1 can be prevented from flowing via the source line into memory cells MC2 and MC3.

In a bit line precharge circuit BPK, precharge transistors E0-E3 may be configured to hold the unselected bit lines in the floating state. Alternatively, unselected bit lines may be fixed to the ground voltage level by turning on the corresponding precharge transistors. By using an inverted signal of column select signal CSL to control the gate potential of the precharge transistor, the unselected bit line can be held at the ground voltage level. In the case where the unselected bit line is fixed at the ground voltage level, it is possible to suppress the rise-up of the potential of the unselected bit line through the capacitive coupling between the source and bit lines when the source line is selected, and it is possible to suppress flowing of a leakage current in the unselected memory cell due to such capacitive coupling noises. Thus, the occurrence of the disturbance can be avoided more reliably.

According to the third embodiment of the invention, as described above, the source line is formed of the main line portion extending in the column direction and the source feeder line portions each arranged corresponding to the memory cells of the access unit and extending in the row direction. Therefore, the disturbance during the writing/reading of the unselected memory cell can be suppressed.

For the plurality of bit lines, the source main line portion is arranged parallel to the bit line, and the layout area of the memory cells can be reduced, as compared with the construction in which source lines extending in the column direction are arranged for the memory cell column.

Fourth Embodiment

Figure 25:
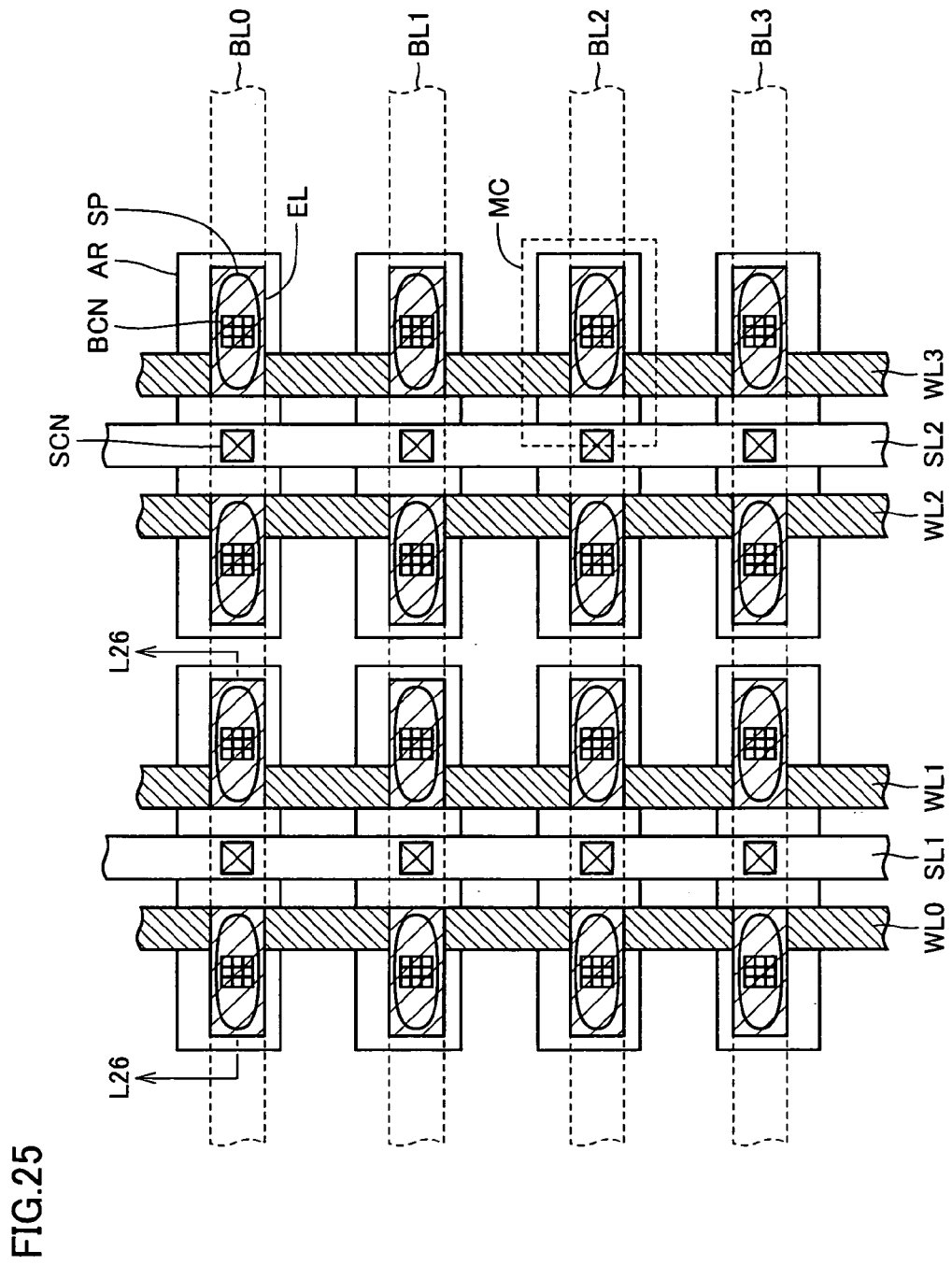
FIG. 25 schematically shows a layout of memory cells according to a fourth embodiment of the invention.

FIG. 25 schematically shows a planar layout of the memory cells in the nonvolatile semiconductor memory device according to the fourth embodiment of the invention. In FIG. 25, active regions AR each for forming two memory cells are aligned in the row direction (word line extension direction) and the column direction (bit line extension direction). Each active region AR has a rectangular form elongated in the column direction, and is isolated by an isolation region (not shown) from others in the row and column directions.

Source lines SL1 and SL2 are arranged, in the row direction, crossing active regions AR. Source line contacts SCN electrically connect these source lines SL1 and SL2 to impurity regions in active regions AR, respectively. Word lines are arranged on both sides of each of source lines SL1 and SL2. Specifically, word lines WL0 and WL1 are arranged on both sides of source line SL1, respectively, and word lines WL2 and WL3 are arranged on both sides of source line SL2, respectively.

In each of active regions AR, spin injection element SP and a bottom electrode EL of the variable resistance element are formed above word line WL (WL0-WL3). This spin injection element SP is electrically coupled to corresponding bit line BL (BL0-BL3) via a bit line contact BCN. Each bit line BL (BL0-BL3) is arranged continuously in the column direction, overlapping active regions AR in the planar layout.

Spin injection element SP is arranged to have a long axis made parallel to bit line BL (BL0-BL3). In spin injection element SP, this long axis is a so-called easy axis, and the magnetization inversion may occur when a magnetic field is applied in the direction of the easy axis. However, the magnetic field induced by the current flowing through bit line BL is in the direction of the short axis of spin injection element SP, and thus is formed in the direction of the hard axis. Therefore, even when the current flowing through bit line BL induces the magnetic field, it is possible to suppress the rotation of the magnetization direction in the memory cell due to the magnetic field thus induced.

Figure 26:
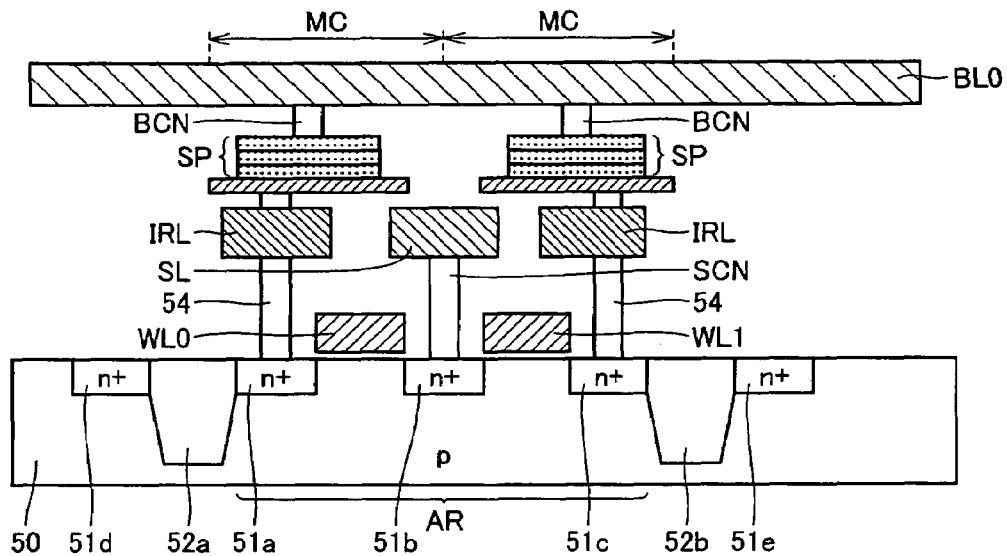
FIG. 26 schematically shows a sectional structure taken along line L26-L26 in FIG. 25.

FIG. 26 schematically shows a sectional structure taken along line L26-L26 in FIG. 25. In FIG. 26, active region AR is formed in a P-type substrate region 50. N-type impurity regions 51a, 51b and 51c are formed at the surface of P-type semiconductor substrate region 50 with distances in between. Active region AR is isolated by element isolation regions 52a and 52b from impurity regions 51d and 51e formed in the adjacent active regions. A gate line constituting word line WL0 is arranged between impurity regions 51a and 51b, and a gate line constituting word line WL1 is arranged above the surface of the substrate region between impurity regions 51b and 51c.

Impurity region 51b is electrically connected to a first metal interconnection line constituting source line SL1 via source line contact SCN. Impurity regions 51a and 51c are coupled to intermediate layers IRL arranged for the corresponding variable resistance elements via plugs 54, respectively. Intermediate layer IRL is coupled to bottom electrode (strap layer) EL of the corresponding variable resistance element. Spin injection element SP is arranged on bottom electrode layer EL. Spin injection element SP includes two ferromagnetic layers with a nonmagnetic layer interposed in between. The top electrode of spin injection element SP is coupled to a second metal interconnection line constituting bit line BL0 via bit line contact BCN.

As can be seen from the sectional structure shown in FIG. 26, two memory cells MC adjacent to each other in the column direction share source line SL (SL1 or SL2). Thus, source line contacts SCN can be reduced in number, and the layout area of the memory cells can be reduced. Active region AR has the rectangular form elongated in the column direction, and has a simple form. Thus, memory cells MC can be arranged at higher density according to the open bit line structure.

For the purpose of reducing the parasitic capacitances of the bit lines, in the shared source line structure, the memory cells (bit line contacts) connected to a bit line are smaller in number than the memory cells (spin injection elements) coupled to a word line.

Figure 27:
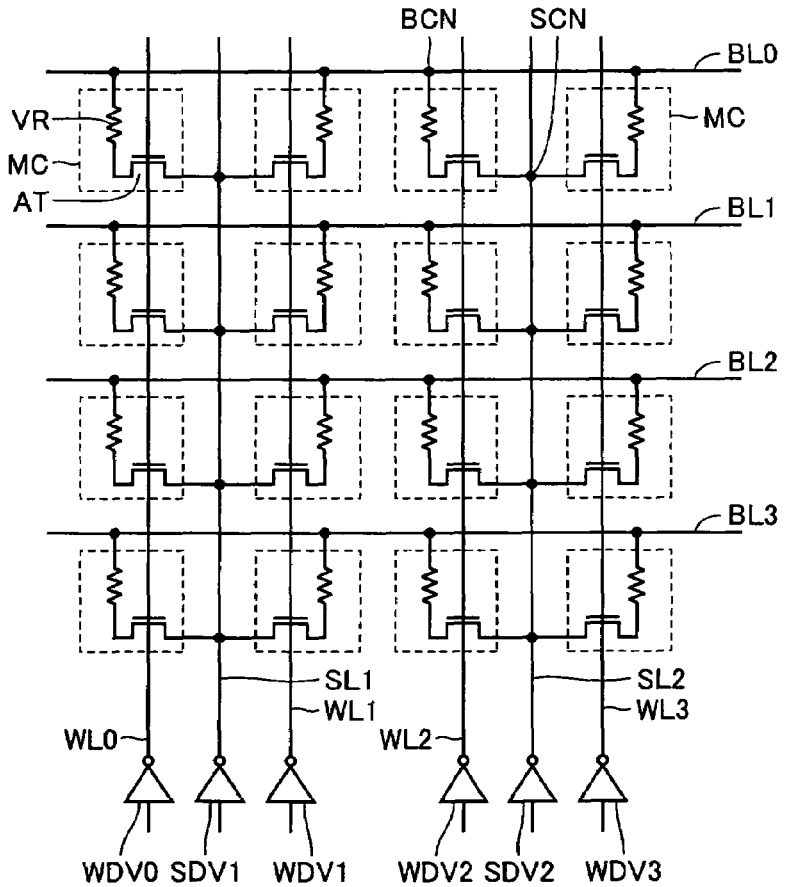
FIG. 27 shows an electrically equivalent circuit of a memory cell arrangement shown in FIGS. 25 and 26.

FIG. 27 shows an electrically equivalent circuit corresponding to the planar layout of the memory array shown in FIG. 25. In FIG. 27, bit lines BL0-BL3 are arranged extending in the column direction, and word lines WL0-WL3 are arranged in the direction crossing bit lines BL0-BL3. Source line SL1 is arranged between word lines WL0 and WL1, and source line SL2 is arranged between word lines WL2 and WL3. Memory cell MC includes variable resistance element VR connected to a corresponding bit line via bit line contact BCN, and access transistor AT for coupling variable resistance element VR to the corresponding source line in response to the signal on the corresponding word line. The memory cells on both sides of source line SL (SL1 or SL2) are coupled to the source line SL (SL1 or SL2) via common source line contact SCN.

Word line drivers WDV0-WDV3 drive word lines WL0-WL3, respectively, and source line drivers SDV1 and SDV2 drive source lines SL1 and SL2, respectively. Source line drivers SDV1 and SDV2 may be arranged opposing to word line drivers WDV0-WDV3, or the source line drivers may be arranged on opposite ends of each source line, respectively.

As shown in FIG. 27, one source line SL is arranged for the memory cells on two columns. Thus, the source line drivers can be reduced in number, and the circuit layout can be simple.

Element isolation region 52a or 52b is arranged between the memory cells adjacent to each other in the column direction in the active region, and the active regions are electrically isolated with each other. However, in the processing of forming word lines WL0 and WL1, gate lines in the same layer as the word line may be formed in element isolating regions 52a and 52b, the impurity injection may be effected in a self-aligned manner with respect to these word and gate lines, to form the active regions, and the gate lines for isolating the active regions may always be fixed at the ground voltage level. In this structure, a so-called field plate line can be implemented to provide the element isolation, and it is not necessary to form the isolation region in the column direction of active regions AR. Thus, the memory cell can be arranged at higher density in the column direction.

(First Modification)

Figure 28:
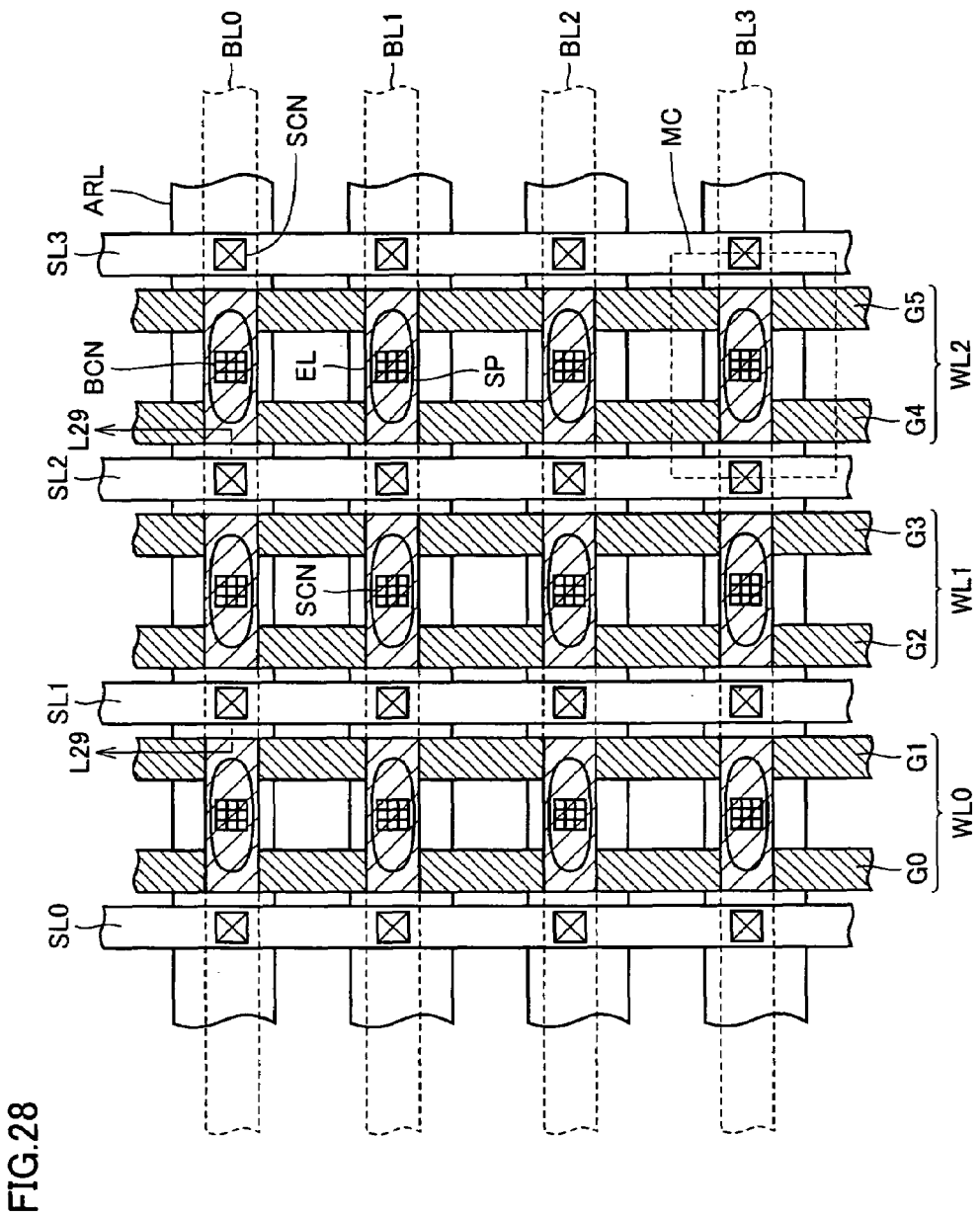
FIG. 28 schematically shows a planar layout of memory cells of a first modification of the fourth embodiment of the invention.

FIG. 28 schematically shows a planar layout of a memory cell arrangement of a first modification of the fourth embodiment of the invention. In FIG. 28, active regions ARL for forming the memory cell transistors are arranged parallel to bit lines BL0-BL3. Active region ARL extends continuously in the column direction, to be shared by memory cells MC arranged in one column.

Since active region ARL is formed continuously extending in the column direction into a band-like form, a region for isolating the active regions between the memory cells is not required. This facilitates patterning, and can suppress variations in shape at the end or edge portion of the active region of the memory cell in photolithography and etching steps, so that the product yield in the manufacturing process can be improved.

Source lines SL0-SL3 extending continuously are arranged at predetermined intervals and perpendicularly to bit line BL (BL0-BL3). Source line SL (SL0-SL3) is electrically connected to impurity regions of a corresponding active region via source contact SCN located at portions crossing active region ARL.

Two gate lines continuously extending in the row direction are arranged between the adjacent source lines. In gate lines G0-G5, the gate lines arranged between adjacent source lines constitutes a common word line. Specifically, in FIG. 28, gate lines G0 and G1 constitute word line WL0, and gate lines G2 and G3 constitute word line WI. Gate lines G4 and G5 constitute word line WL2. Rectangular bottom electrode EL (strapping layer LS) of the variable resistance element is formed parallel to bit lines BL (BL0-BL3). Spin injection element SP is formed on bottom electrode layer EL, and is electrically connected to the corresponding bit line via bit line contact BCN.

In the layout shown in FIG. 28, the long axis direction of the spin injection element matches with the bit line extension direction. This arrangement suppresses rotation of the magnetization direction of the memory cell due to the magnetic field induced by the bit line current.

The gate lines on opposite sides in the row direction of the variable resistance element are driven concurrently as a common word line. Thereby, the current can be passed from one bit line via the memory cell to the source lines arranged on the opposite sides of the memory cell in the row direction. This construction is made equivalent to the memory cell configuration in which access transistors are connected in parallel for the variable resistance element, and the channel width (W) of the access transistor can be doubled. Thus, a large current can flow in the data writing, and the write operation can be stable. Also, the read operation can be fast.

Since the current flowing toward source lines SL via the memory cell is distributed to the left and right portions, the current flowing through one source line can be reduced so that the flow of a leakage current to the unselected memory cell can be suppressed in the write operation, and the disturbance in the write and read operations can be suppressed.

Since the current flowing through source line SL can be reduced, the intensity of the magnetic field induced by the source line current can be reduced so that it is possible to suppress the influence exerted on the memory cells by the magnetic field induced by the source line current, and the disturbance due to the magnetic field induced by the source line current can be suppressed.

Figure 29:
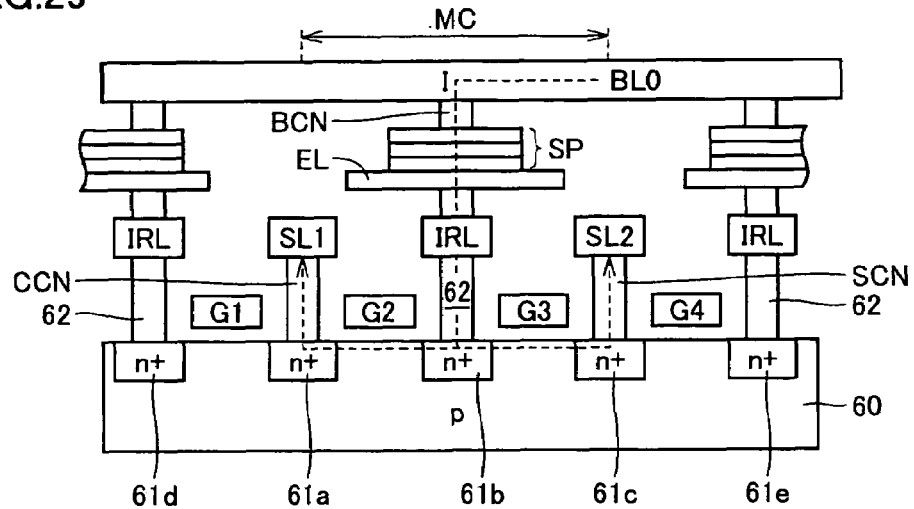
FIG. 29 schematically shows a sectional structure taken along line L29-L29 in FIG. 28.

FIG. 29 schematically shows a sectional structure taken along line L29-L29 in FIG. 28. In FIG. 29, N-type impurity regions 61a, 61b and 61c are formed at the surface of P-type semiconductor substrate region 60 with distance in between, and impurity regions 61d and 61e are formed in regions outside impurity regions 61a and 61c, respectively. Impurity regions 61a and 61c are connected via source line contacts SCN to the first metal interconnection lines constituting source lines SL1 and SL2, respectively. Impurity regions 61b, 61d and 61e are coupled to intermediate layers IRL of the first metal interconnection layer via plugs 62, respectively. The variable resistance elements are formed on intermediate layers IRL. The variable resistance element includes bottom electrode layer EL and spin injection element SP formed thereon. Spin injection element SP is electrically connected to a second metal interconnection line constituting bit line BL0 via bit line contact BCN.

Impurity regions 61a-61d are included in the same active region (ARL). The gate line is formed on each of substrate region between adjacent impurity regions. In FIG. 29, gate line G1 is arranged on the substrate region surface between impurity regions 61a and 61a, and gate line G2 is arranged on the substrate region surface between impurity regions 61a and 61b. Gate line G3 is arranged on the substrate region surface between impurity regions 61b and 61c, and gate line G4 is arranged on the substrate region surface between impurity regions 61c and 61e. Gate line G1 constitutes word line WL0, and gate lines G2 and G3 constitute word line WL1. Gate line G4 constitutes word line WL2.

As shown in FIG. 29, source line SL1 is shared by the memory cells connected to word lines WL0 and WL1. Source line LS2 is shared by the memory cells connected to word lines WL1 and WL2.

When the current flows from bit line BL0 to impurity region 61b via the bit line contact, spin injection element SP and bottom electrode layer EL, gate lines G2 and G3 are driven to the selected state in parallel. As represented by broken line in FIG. 29, therefore, channels are formed between impurity region 61b and impurity regions 61a and 61c, and the current flowing from bit line BL0 is shunted to source lines SL1 and SL2.

Figure 30:
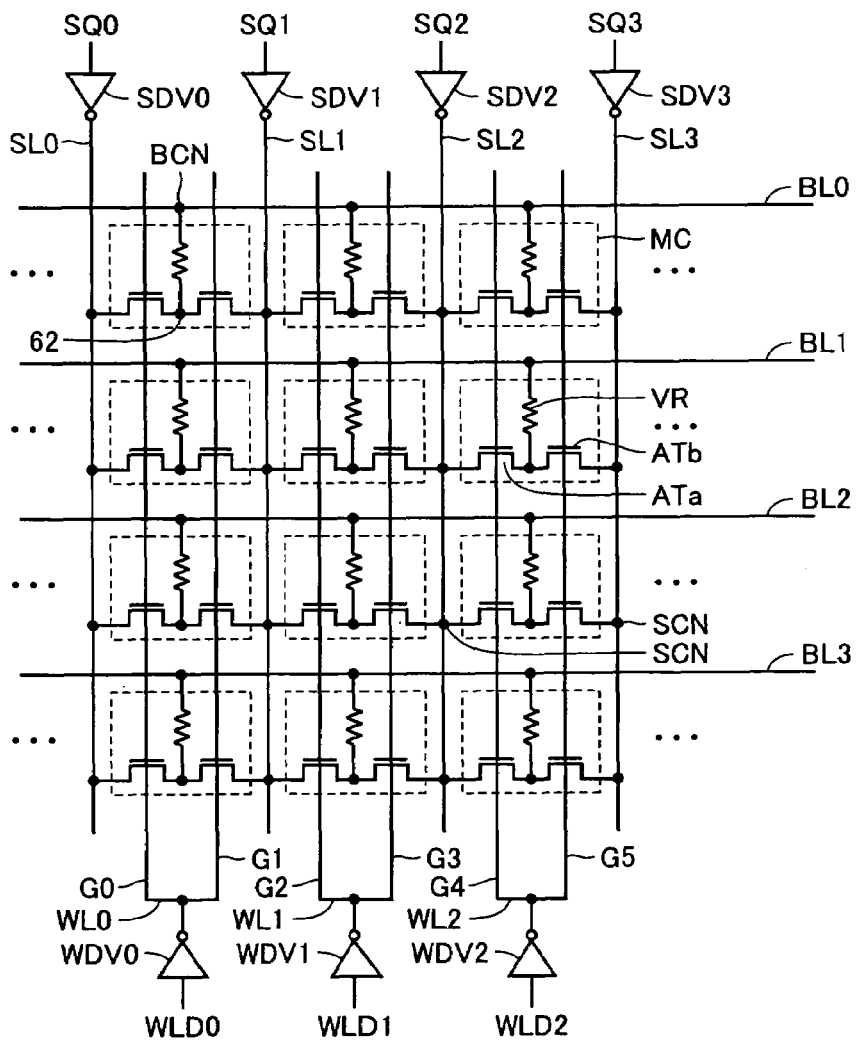
FIG. 30 shows an electrically equivalent circuit of a structure of memory cells shown in FIGS. 28 and 29.

FIG. 30 shows an electrically equivalent circuit of the arrangement of the memory cells shown in FIGS. 28 and 29. In FIG. 30, bit lines BL0-BL3 are arranged extending continuously in the column direction. Gate lines G0-G5 are arranged extending continuously in the row direction. Source lines SL0, SL1, SL2 and SL3 are arranged for each two gate lines. Gate lines G0 and G1 are driven concurrently by word line driver WDV0, and gate lines G2 and G3 are driven concurrently by word line driver WDV1. Gate lines G4 and G5 are driven concurrently by word line driver WDV2. Source lines SL0, SL1, SL2 and SL3 are driven by source line drivers SDV0, SDV1, SDV2 and SDV3, respectively. Word line drivers WDV0-WDV2 are configured to receive word line decode signals WLD0-WLD2, respectively.

Source lines SL0-SL3 are driven by source line drivers SDV0-SDV3, which in turn receive source line drive timing signals SQ0-SQ3, respectively. Each of source line drive timing signals SQ0-SQ3 is driven to the selected state when one of the word lines arranged on both sides of the corresponding source line is driven to the selected state in the data write operation.

Memory cell MC includes variable resistance element VR connected to the corresponding bit line via bit line contact BCN, and access transistors ATa and ATb that are connected to source lines SL arranged on the opposite sides of the memory cell via source line contacts SCN, respectively. Therefore, access transistors ATa and ATb are arranged in parallel for one variable resistance element VR, and the source lines on the opposite sides can be driven to the selected state. Thus, the channel width of the access transistor is equivalently doubled to drive a large current.

Figure 31:
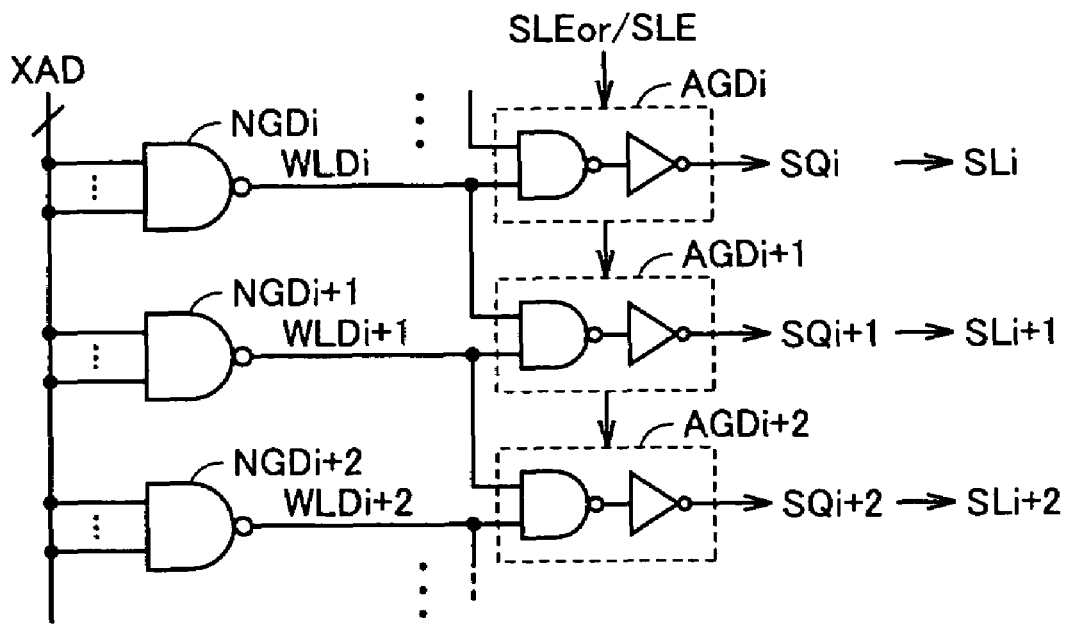
FIG. 31 shows an example of a construction of a portion for generating a source line drive timing signal shown in FIG. 30.

FIG. 31 shows an example of the construction of the source line drive circuit for the array layout of the first modification. FIG. 31 representatively shows a construction of a portion for producing source line drive timing signals SQi, SQi+1 and SQi+2, where i is a non-negative integer.

In FIG. 31, the source line drive circuit includes an NAND decode circuit NGDi that is provided for source line SLi and decodes multi-bit row address signal XAD, an NAND decode circuit NGDi+1 that is provided corresponding to source line SLi+1 and decodes row address signal XAD, and an NAND decode circuit NGDi+2 that is provided corresponding to source line SLi+2 and decodes row address signal XAD. NAND decode circuits NGDi-NGDi+2 are supplied with different combinations of bits of row address signal XAD, to produce signals corresponding to word line decode signals WLDi, WLDi+1 and WLDi+2, respectively.

The source line drive circuit further includes an AND decode circuit AGDi that receives the output signals of NAND decode circuit NGDi and a decode circuit (NGDi−1: not shown) in the preceding stage to produce source line drive timing signal SQi, an AND decode circuit AGDi+1 that receives the output signals of NAND decode circuits NGDi and NGDi+1 to produce source line drive timing signal SQi+1, and AND decode circuit AGDi+2 that receives outputs signals of NAND decode circuit NGDi+1 and NGDi+2 to produce source line drive timing signal SQi+2. These AND decode circuits AGDi, AGDi+1 and AGDi+2 are configured to selectively receive source line activating signal SLE or /SLE according to the source line potential change sequence in the write operation.

Figure 32:
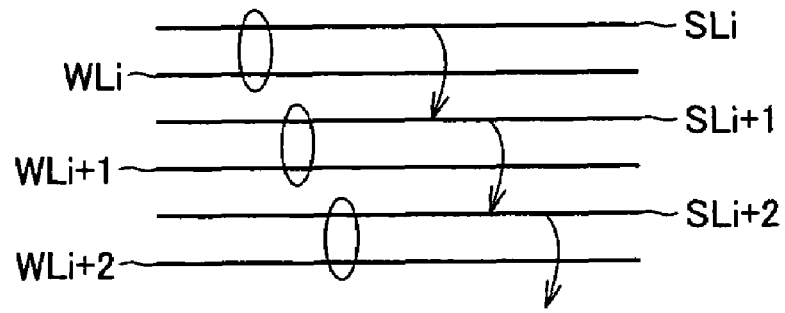
FIG. 32 shows an operation manner of the source line drive timing signal generating portion shown in FIG. 31.

FIG. 32 schematically shows a correspondence between the selected word lines and selected source lines. Referring to FIG. 32, an operation of the source line drive circuit shown in FIG. 31 will now be described. It is now assumed that source line SLi is selected. In this operation, decode signal WLDi produced from NAND decode circuit NGDi attains the L level. Thereby, source line drive timing signal SQi produced from AND decode circuit AGDi attains the selected state at the L level (here, the operational effect of source line activating signals SLE and /SLE is not considered).

The output signals of NAND decode circuits NGDi+1 and NGDi+2 are at the H level. According to word line decode signal WLDi at the L level, source line drive timing signal SQi+1 produced from AND decode circuit AGDi+1 attains the L level to select source line SLi+1. Both inputs of AND decode circuit AGDi+2 are at the H level, and source line SLi+2 is held at the H level of the unselected state.

In FIG. 32, therefore, when word line WLi is selected, source line SLi is selected concurrently, and adjacent source line SLi+1 is also selected when source line SLi is selected. Likewise, when word line WLi+1 is selected, source line SLi+1 is selected, and adjacent source line SLi+2 is selected in response to the selection of source line SLi+1. Likewise, when word line WLi+2 is selected, source line SLi+2 is selected, and a source line (SLi+3: not shown) on a higher side and adjacent to selected source line SLi+2 is selected in response to the selection of source line SLi+2.

With the source line drive circuit as shown in FIG. 31, the paired source lines on both sides of the selected word line can be driven to the selected state in the data write operation.

The gate lines constituting a common word line are driven by the common word line driver. However, these gate lines may be individually and separately driven by the gate drivers. The gate line drivers for the gate lines constituting a common word line are configured to receive common decode signal WLD.

According to the construction of the first modification of the fourth embodiment of the invention, as described above, the source lines are arranged on both sides of the gate lines constituting the word line, and the variable resistance element is arranged between the gate lines constituting a common word line. Therefore, the access transistors are connected in parallel in one memory cell so that the current driving power of the transistor can be increased, and a large write current can flow in the data write operation to achieve stably the write operation. The active regions for forming transistors of the memory cells aligned in the column direction are formed into a band-like shape extending in the column direction. This structure facilitates patterning of the transistors. Also, it is not necessary to arrange a memory cell isolation region between the cells. Thus, the memory cells can be arranged at higher density, and the patterning can be easy so that the product yield in the manufacturing process can be improved.

(Second Modification)

Figure 33:
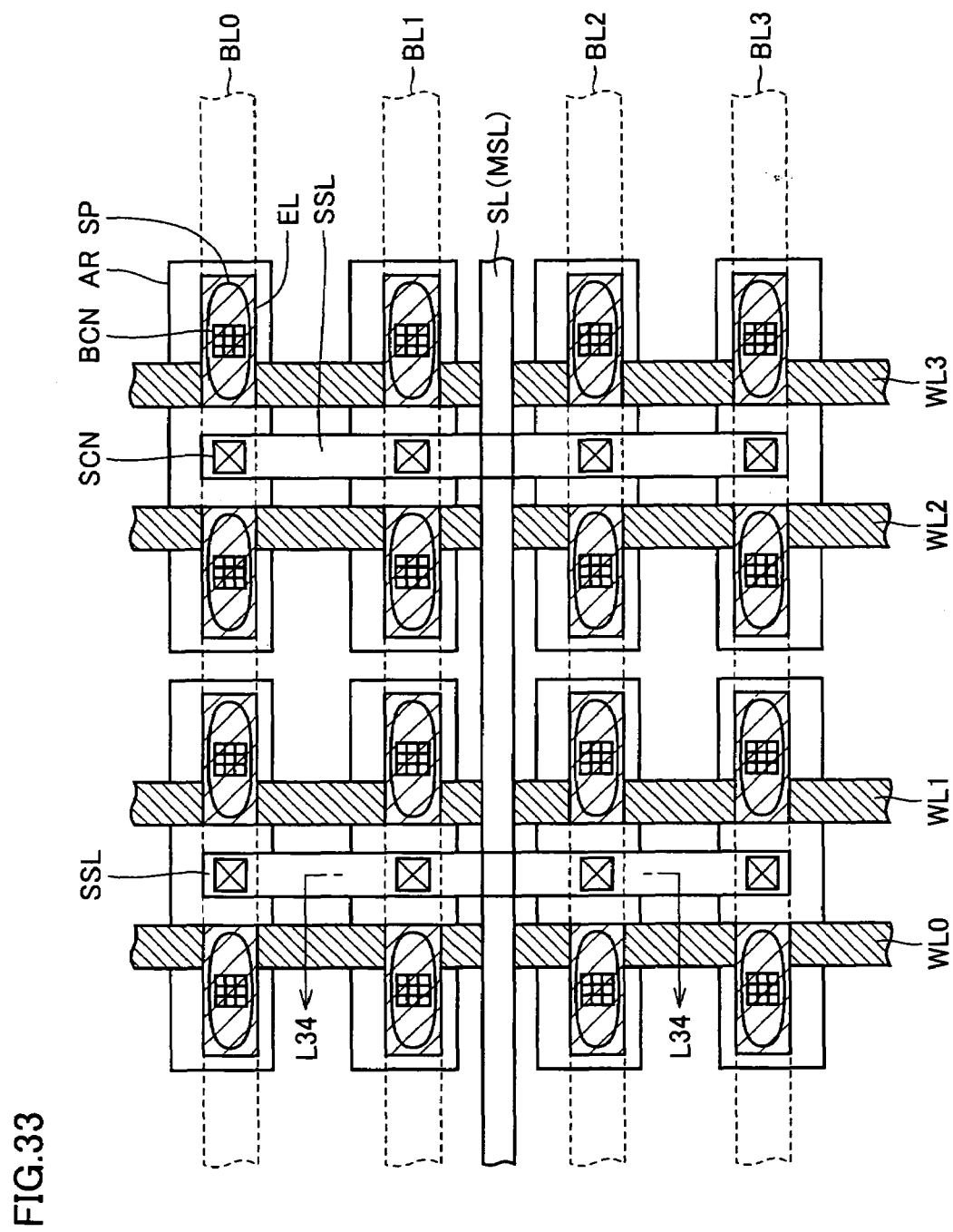
FIG. 33 schematically shows a layout of the memory cells according to a second modification of the fourth embodiment of the invention.

FIG. 33 schematically shows a layout of the memory cell array according to a second modification of the fourth embodiment of the invention. The memory cell layout shown in FIG. 33 differs from that shown in FIG. 25 in the following points. Source line SL includes main line portion MSL continuously extending in the column direction and feeder line portions SSL each arranged for a row of the memory cells in a plurality of columns. The feeder line portion SSL is coupled to the source impurity region of each of the memory cells in corresponding plural columns via source line contacts SCN. Feeder line portions SSL are separated for each multiple-bit unit in the row direction.

The layout of the memory cells shown in FIG. 33 is the same as that shown in FIG. 25 except for the arrangement of the source lines described above. The corresponding portions are allotted with the same reference characters, and description thereof is not repeated.

Figure 34:
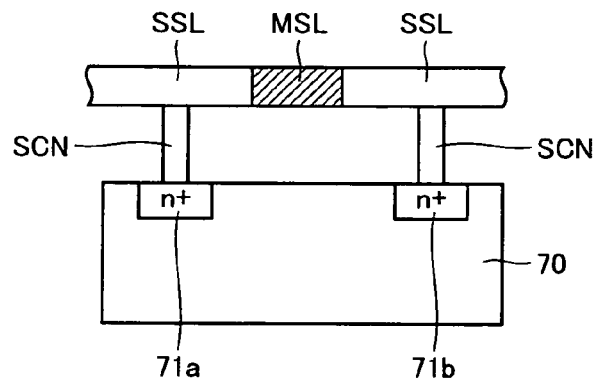
FIG. 34 schematically shows a sectional structure taken along line L34-L34 in FIG. 33.

FIG. 34 schematically shows a sectional structure taken along line L34-L34 in FIG. 33. In FIG. 34, N-type impurity regions 71a and 71b are arranged at a surface of a semiconductor substrate region 70 with distances in between. These impurity regions 71a and 71b are formed in active regions AR arranged for different columns, respectively. Impurity regions 71a and 71b are coupled to feeder line portions SSL via source line contacts SCN, respectively. Feeder line portion SSL is coupled to main source line portion MSL. Main source line portion MSL and source feeder line portion SSL are formed of the interconnection lines in the same interconnection layer, and are coupled together in FIG. 34. However, main source line portion MSL and feeder line portion SSL may be formed of the interconnection lines in different interconnection layers, respectively.

Figure 35:
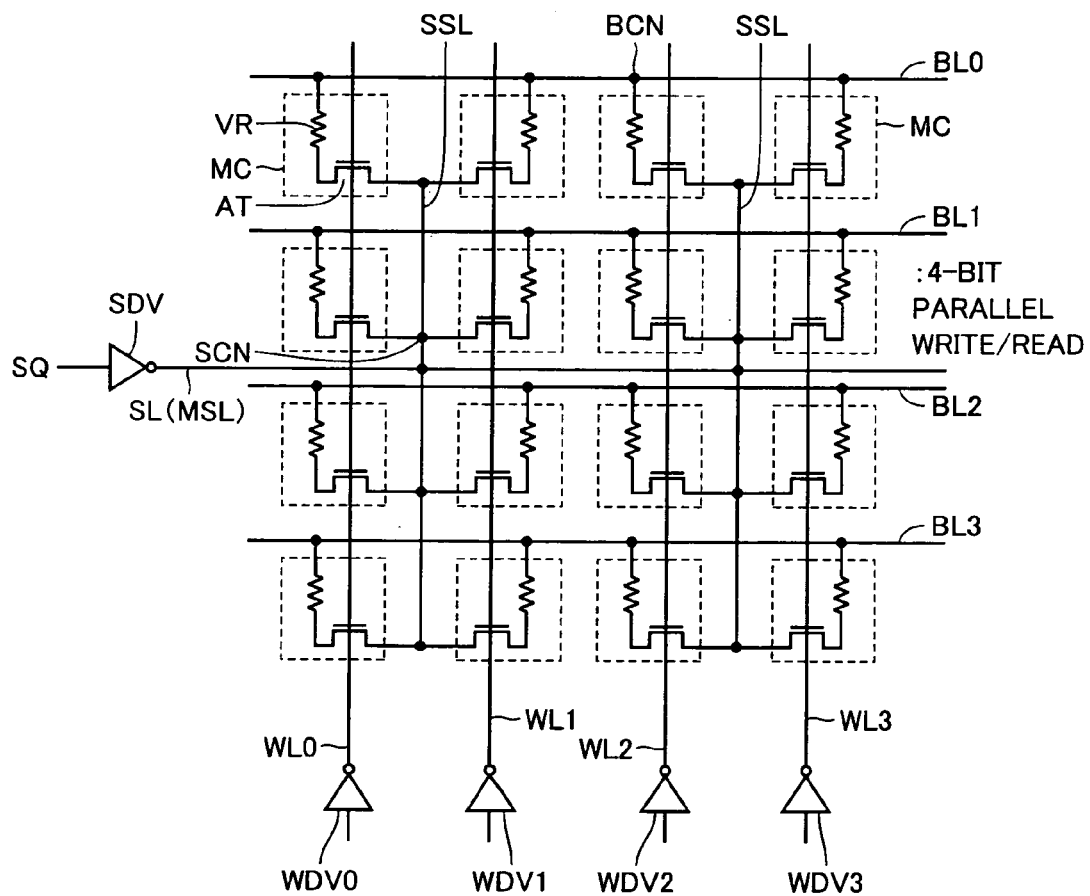
FIG. 35 shows an electrically equivalent circuit of a memory cell structure shown in FIGS. 33 and 34.

FIG. 35 shows an electrically equivalent circuit of the layout of memory cells shown in FIG. 33. In FIG. 35, source lines SL (main line portions MSL) are arranged parallel to bit lines BL (BL0-BL3). Source feeder line portion SSL is arranged in a region between the word lines in each memory cell row, and is coupled to the source regions of the access transistors of the corresponding memory cells via source contacts SCN. Source line driver SDV drives source line SL according to source line drive timing signal SQ.

As shown in FIG. 35, when source line driver SDV drives one source line SL to the selected state, the potentials of the source regions of the access transistors of the memory cells in four columns change in each memory cell row. However, access transistors AT of the memory cells are turned on only in the selected row. Therefore, the current can flow between bit line BL (BL0-BL3) and source line SL in the memory cell located on both the selected row and the selected column.

The memory cells in the adjacent rows share feeder line portion SSL of the source line, and only one source line SL is arranged extending in the column direction for a plurality of columns. This construction can provide substantially the same effect as the construction of the third embodiment in which the main source line is arranged for two bits of the memory cells in each row.

In the construction shown in FIG. 35, word line drivers WDV0-WDV3 drive word lines WL0-WL3 to the selected state according to the word line address (row address). Source line driver SDV drives source line SL (main line portion MSL and feeder line portion SSL) on the selected column to the selected state according to the column address signal. Thus, the data can be written in the memory cell located on both the selected row and the selected column.

The sectional structure in the column direction of active region AR is the same as the sectional structure shown in FIG. 26 (although source line SL is replaced with feeder line portion SSL).

(Third Modification)

Figure 36:
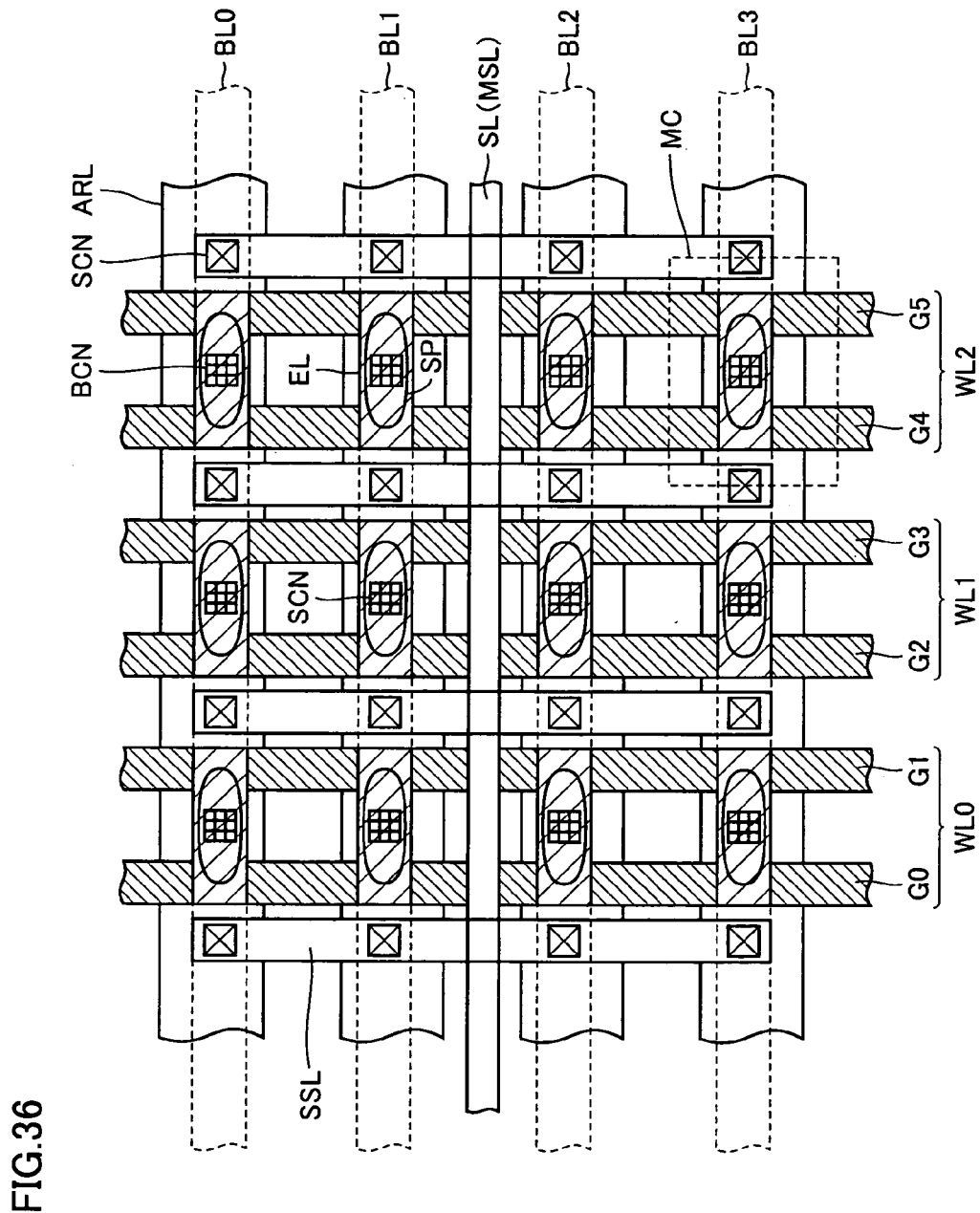
FIG. 36 schematically shows a planar layout of memory cells according to a third modification of the fourth embodiment of the invention.

FIG. 36 schematically shows a layout of the memory cells according to a third modification of the fourth embodiment of the invention. The layout of the memory cells shown in FIG. 36 is different from that shown in FIG. 28 in the following points. Source line SL (main line portion MSL) is arranged extending in the column direction for the memory cells in four columns. In each memory cell row, feeder line portion SSL is arranged adjacent to word line and extending in the row direction. This feeder line portion SSL is electrically connected to the impurity regions of corresponding active regions ARL via source line contacts SCN.

Other structures of the memory cells shown in FIG. 36 are the same as those of the memory cells shown in FIG. 28. The corresponding portions are allotted with the same reference characters, and description thereof is not repeated.

In the construction shown in FIG. 36, only one source line SL (main line portion MSL) is arranged extending linearly in the column direction commonly to the plurality of columns. Thus, increase in layout area of the memory cell array can be suppressed.

Similarly to the case of the second modification already described, feeder line portion SSL is arranged parallel to gate line G (G0-G5) constituting a common word line, and the current can flow between the bit line and the source line in the memory cell on the selected column in the selected row.

Feeder line portion SSL is merely arranged for and connected to the memory cells to be accessed in parallel. Therefore, it is possible to prevent the flow of the source current to the memory cells on the unselected columns in the selected row, and occurrence of the disturbance can be suppressed in the read and write operations.

As for the sectional structure of the layout of the memory cells shown in FIG. 36, the sectional structure of the memory cells adjacent to each other in the column direction is the same as that shown in FIG. 29, and the sectional structure taken along the feeder line portion is the same as that shown in FIG. 30.

Figure 37:
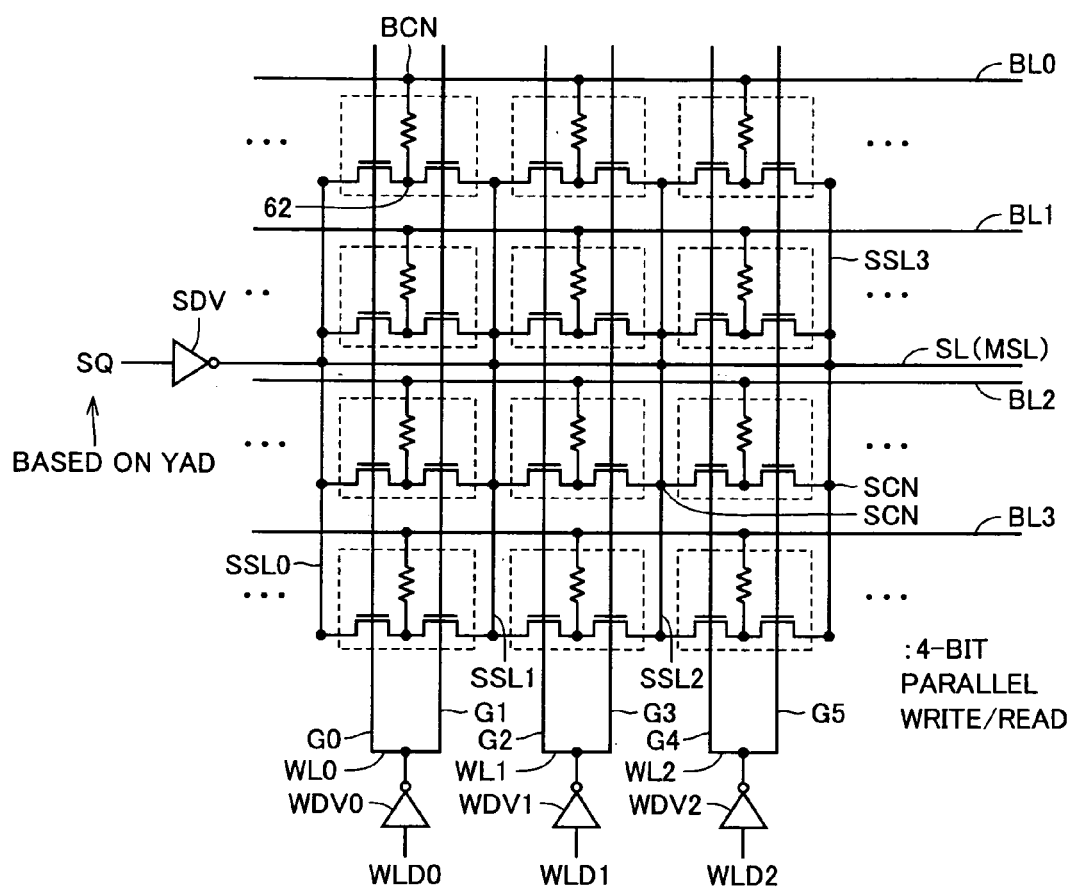
FIG. 37 shows an electrically equivalent circuit of the memory cell layout shown in FIG. 36.

FIG. 37 shows an electrically equivalent circuit of the layout of the memory cells shown in FIG. 36. The electrically equivalent circuit shown in FIG. 37 differs from that in the memory cell array shown in FIG. 30. Source line SL (main line portion MSL) transmitting the output signal of source line driver SDV is arranged between bit lines BL1 and BL2. Source feeder line portion SSL is arranged in the row direction in the region adjacent to each word line, and is coupled to the source region of each access transistor via source contact SCN. Other constructions of the memory cell array shown in FIG. 37 are the same as those of the memory cell array shown in FIG. 30. The corresponding portions are allotted with the same reference characters, and description thereof is not repeated.

In the construction shown in FIG. 37, when word line WL0 is selected, source line SL is selected. In this case, source feeder line portion SSL in each memory cell row is driven to the selected state. In an unselected row, however, the word line is not selected, and the access transistor is kept off. Therefore, even when all source feeder line portions SSL0-SSL3 are driven to the selected state, the memory cell current flows between the memory cells connected to gate lines G0 and G1 constituting word line WL0 and source feeder line portions SSL0 and SSL1. Even when the current is shunted to feeder line portions SSL2 and SSL3 from feeder line portions SSL0 and SSL1, the access transistor in the corresponding memory cell is in an off state, and no adverse effect is exerted on the unselected memory cell.

In the construction shown in FIG. 37, source line drive timing signal SQ applied to source line driver SDV can be produced based on column address signal YAD. Thus, source line drive timing signal SQ can be produced according to the column select signal simultaneously selecting four bits of memory cells and the source line activating signal (SLE or /SLE). Therefore, the construction of the decoder portion producing source line drive timing signal SQ can be simple as compared with the arrangement of the memory cells shown in FIG. 30 (it is not required to drive two source lines according to the selected row).

The second and third modifications have been described in connection with the constructions of performing the data access (read/write) four bits at a time. Similarly to the second embodiment, however, the data access may be performed two bits at a time, eight or sixteen bits at a time. Source feeder line portion SSL is extended in the row direction according to the number of bits of the memory cells to be accessed concurrently.

In the first to third modifications, the manner of the bit line precharge and the potential change sequence of the source line are determined according to the first or second embodiment. The construction of the third embodiment may be applied to the layout of the memory cells in the fourth embodiment.

According to the fourth embodiment of the invention, as described above, the access transistors in the memory cell is arranged in parallel for the variable resistance element. This can increase the amount of the current flowing through the access transistor in the memory cell. Thus, a required current can be supplied in the write operation, and the fast writing can be stably performed even with a low power supply voltage.

When the invention can be applied to a spin injection MRAM having a memory cell free layer of which magnetization direction is determined by the spin injection, fast and stable data writing can be achieved. The nonvolatile semiconductor memory device to which the invention is applied may be an discrete nonvolatile semiconductor memory device single. When the invention is applied to a memory of a system-on-chip having the nonvolatile semiconductor memory device integrated with other devices such as processor on a common semiconductor chip, it is possible to achieve the memory that stably stores data with low power consumption, and to improve the system performance.

The description has been given on the memory configured to have the magnetization direction set by the spin injection. However, the invention can be applied to a resistive RAM (RRAM) in which a resistance value of a variable resistance element is determined by changing a polarity of a voltage pulse applied between bit and source lines.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a plurality of memory cells, arranged in rows and columns, each having a storing portion having a resistance value set according to storage data;
   a plurality of bit lines, arranged corresponding to the respective memory cell columns, each connected to the memory cells in a corresponding column;
   a plurality of source lines, arranged corresponding to the memory cell rows, each connected to the memory cells in a corresponding row;
   write circuitry for transmitting a voltage corresponding to write data to a bit line on a selected column in data writing; and
   source line drive circuitry for driving a source line on a selected row to first and second voltage levels in a predetermined sequence in said data writing, according to a current flowing between the bit line in said selected column and the source line in said selected row via a corresponding memory cell, the storing portion of the corresponding memory cell having the resistance value set, wherein
   said write circuitry writes multiple bits of data in parallel;
   said nonvolatile semiconductor memory device further comprises:
   a column select circuit for selecting in parallel a plurality of columns equal in number to a bit width of the data to be written; and
   said source line drive circuitry drives the source line common to the memory cells on the plurality of selected columns in said predetermined sequence.

2. The nonvolatile semiconductor memory device according to claim 1, wherein
   said source line drive circuitry drives the source line in the selected row from opposite ends.

3. The nonvolatile semiconductor memory device according to claim 1, wherein
   the source line is arranged to be shared by the memory cells in adjacent columns.

4. The nonvolatile semiconductor memory device according to claim 1, wherein
   each of the memory cells further includes an access transistor for coupling, when made conductive, a corresponding storing portion to a corresponding source line; and
   said nonvolatile semiconductor memory device further comprises:
   a plurality of word lines, arranged corresponding to the memory cell rows, each connected to the access transistors of the memory cells in a corresponding row, and
   a word line select drive circuit for driving a word line in the selected row to the selected state; and
   said word line select drive circuit is arranged in a region opposing in a row direction to the source line drive circuitry.

5. The nonvolatile semiconductor memory device according to claim 1, wherein
   the memory cells are arranged such that the storing portions arranged in a row direction are greater in number than the storing portions arranged in a column direction.

6. The nonvolatile semiconductor memory device according to claim 1, wherein
   each memory cell further includes an access transistor for coupling, when made conductive, a corresponding storing portion to a corresponding source line; and said nonvolatile semiconductor memory device further comprises:

a plurality of word lines, arranged corresponding to the memory cell rows, each being connected to the access transistors of the memory cells in a corresponding row, and a word line drive circuit for driving a word line in the selected row to a selected state at the voltage level higher than a high-level voltage that can be supplied by said source line select drive circuitry and said write circuitry.

7. The nonvolatile semiconductor memory device according to claim 1, wherein
said source line select drive circuitry maintains an unselected source line at a voltage level corresponding to a logical level of a low voltage.

8. The nonvolatile semiconductor memory device according to claim 1, further comprising:
a write data line for transferring the write data from said write circuitry;
a plurality of column select gates, arranged corresponding to the respective bit lines, for coupling corresponding bit lines to the write data line, when made conductive; and
a column select signal producing circuit for producing a column select signal turning on the column select gate corresponding to a selected column according to an address signal, said column select signal, when selected, being set to a voltage level higher than levels of voltages supplied to the source lines and the bit lines.

9. The nonvolatile semiconductor memory device according to claim 1, further comprising:
a bit line voltage setting circuit for setting an unselected bit line to a voltage level corresponding to a voltage level of the selected source line on the selected row in a data write mode.

10. A nonvolatile semiconductor memory device comprising:
a plurality of memory cells, arranged in rows and columns, each having a storing portion having a resistance value set according to storage data;
a plurality of bit lines, arranged corresponding to the respective memory cell columns, each connected to the memory cells in a corresponding column;
a plurality of source lines, arranged corresponding to the memory cell rows, each connected to the memory cells in a corresponding row;
write circuitry for transmitting a voltage corresponding to write data to a bit line on a selected column in data writing; and
source line drive circuitry for driving a source line on a selected row to a first and second voltage levels in a predetermined sequence in said data writing, according to a current flowing between the bit line in said selected column and the source line in said selected row via a corresponding memory cell, the storing portion of the corresponding memory cell having the resistance value set, wherein
each of the memory cells further includes first and second access transistors each for connecting a corresponding storing portion to a corresponding source line; and
said nonvolatile semiconductor memory device further comprises:
a plurality of first gate lines, arranged corresponding to the memory cell rows, each connected to the first access transistors of the memory cells in a corresponding row, a plurality of second gate lines, arranged corresponding to the memory cell rows, each connected to the second access transistors of the memory cells in a corresponding row, and a word line select drive circuit for driving both the first and second gate lines in said selected row to a selected state, each word line being constituted by the first gate line and the second gate line arranged on a corresponding row.

11. The nonvolatile semiconductor memory device according to claim 10, wherein
a set of the first gate line and the second gate line and the source line are arranged alternately in a column direction, and
said source line drive circuitry drives concurrently the source lines adjacent, respectively, to the first and second gate lines arranged on the selected row.

12. A nonvolatile semiconductor memory device comprising:
a plurality of memory cells, arranged in rows and columns, each having a storing portion having a resistance value set according to storage data;
a plurality of bit lines, arranged corresponding to the memory cell columns, each connected to the memory cells in a corresponding column;
a plurality of source lines, arranged corresponding to the memory cell rows, each connected to the memory cells in a corresponding row;
a column select circuit for concurrently selecting the columns equal in number to a bit width of multi-bit write data in data writing;
a write circuit for transmitting a first voltage to each of the bit lines on the selected columns regardless of a value of the write data bit, and then transmitting concurrently voltages corresponding to the write data bits to the bit lines in the selected columns, respectively in said data writing; and
a source line drive circuit for driving the source line in a selected row to a second voltage level and the first voltage level in a predetermined sequence in the data write operation, according to a current flowing between the bit line in the selected column and the source line in the selected row via a corresponding memory cell, the resistance value of said storing portion of the corresponding, selected memory cell being set, said source line drive circuit transmitting said second voltage concurrently with transmission of said first voltage by said write circuit, to set said storing portion of the selected memory cell to a resistance state corresponding to a predetermined logical level.

13. The nonvolatile semiconductor memory device according to claim 12, further comprising:
a bit line voltage setting circuit for setting an unselected bit line on an unselected column to a voltage level corresponding to a voltage level of the selected source line when said source line drive circuit transmits said second voltage.

14. A nonvolatile semiconductor memory device comprising:
a plurality of memory cells, arranged in rows and columns, each having a storing portion having a resistance value set according to storage data;
a plurality of bit lines, arranged corresponding to the memory cell columns, each connected to the memory cells on a corresponding column;
a plurality of source lines each arranged being shared by the memory cells in a plurality of columns;

a source line drive circuit for changing a voltage level of the source line on a selected column in a predetermined sequence in data writing; and a data write circuit having at least a time period for driving the bit line on the selected column according to the write data in the data writing, wherein the write data comprises multiple bits, and the plurality of columns sharing the source line are equal in number to a bit width of said multi-bit data.

15. The nonvolatile semiconductor memory device according to claim 14, wherein each source line includes:

a main line portion arranged extending in a column direction and corresponding to a predetermined plurality of columns, and a plurality of feeder line portions, arranged corresponding to the memory cell rows, each connected to the memory cells located on a corresponding row and said predetermined plurality of columns, as well as to said main line portion.

16. The nonvolatile semiconductor memory device according to claim 15, wherein each feeder line portion is arranged being shared by the memory cells in adjacent rows.

17. The nonvolatile semiconductor memory device according to claim 15, wherein each memory cell further includes first and second access transistors arranged in parallel with respect to said storing portion, each word line includes a first gate line connected to the first access transistor of the memory cell on a corresponding row, and a second gate line connected to a second access transistor of the memory cell in the corresponding row, and the feeder line portion is arranged alternately to a set of the first gate line and the second gate line.

* * * * *